United States Patent
Goto et al.

(10) Patent No.: US 8,420,409 B2
(45) Date of Patent: Apr. 16, 2013

(54) METHOD FOR MANUFACTURING SEMICONDUCTOR DEVICE

(75) Inventors: Yuugo Goto, Isehara (JP); Teruyuki Fujii, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/288,207

(22) Filed: Nov. 3, 2011

(65) Prior Publication Data
US 2012/0108014 A1     May 3, 2012

Related U.S. Application Data

(62) Division of application No. 12/473,320, filed on May 28, 2009, now Pat. No. 8,053,253.

(30) Foreign Application Priority Data

Jun. 6, 2008    (JP) .................... 2008-149603

(51) Int. Cl.
    *H01L 21/00*    (2006.01)
(52) U.S. Cl.
    USPC ................................. 438/5; 438/25
(58) Field of Classification Search ............... 438/5, 25
    See application file for complete search history.

(56) References Cited

U.S. PATENT DOCUMENTS

| | | | |
|---|---|---|---|
| 5,075,166 A | 12/1991 | Sikorski et al. | |
| 5,597,631 A | 1/1997 | Furumoto et al. | |
| 5,757,456 A | 5/1998 | Yamazaki et al. | |
| 5,770,313 A | 6/1998 | Furumoto et al. | |
| 5,821,138 A | 10/1998 | Yamazaki et al. | |
| 6,015,724 A | 1/2000 | Yamazaki | |
| 6,118,502 A | 9/2000 | Yamazaki et al. | |
| 6,224,965 B1 | 5/2001 | Haas et al. | |
| 6,376,333 B1 | 4/2002 | Yamazaki et al. | |
| 6,403,221 B1 | 6/2002 | Nakamura et al. | |

(Continued)

FOREIGN PATENT DOCUMENTS

| | | |
|---|---|---|
| EP | 0 939 441 | 9/1999 |
| EP | 1092739 | 4/2001 |

(Continued)

OTHER PUBLICATIONS

Quirk et al., Semiconductor Manufacturing Technology, 2001, Prentice-Hall, Inc., p. 323.

*Primary Examiner* — Jenny L Wagner
(74) *Attorney, Agent, or Firm* — Eric J. Robinson; Robinson Intellectual Property Law Office, P.C.

(57) ABSTRACT

An object is to provide a highly reliable semiconductor device that has tolerance to external stress and electrostatic discharge. Another object is to prevent defective shapes and defective characteristics due to the external stress or an electrostatic discharge in the manufacturing process, and to manufacture a semiconductor device with high yield. Still another object is to manufacture a semiconductor device at low cost and with high productivity. With the use of a conductive shield, electrostatic breakdown (malfunctions of the circuit or damages of a semiconductor element) due to electrostatic discharge of the semiconductor integrated circuit is prevented. The conductive shield is formed so that at least the conductive shields on the top and bottom surfaces are electrically connected by a plating method. In addition, a semiconductor device can be formed at low cost with high productivity because a plating method is used for the formation of the conductive shield.

23 Claims, 26 Drawing Sheets

U.S. PATENT DOCUMENTS

| | | | |
|---|---|---|---|
| 6,491,228 B1 | 12/2002 | Ueda et al. | |
| 6,762,508 B1 | 7/2004 | Kiso et al. | |
| 6,800,223 B2 | 10/2004 | Kojo et al. | |
| 6,933,533 B2 | 8/2005 | Yamazaki et al. | |
| 6,953,951 B2 | 10/2005 | Yamazaki et al. | |
| 6,998,282 B1 | 2/2006 | Yamazaki et al. | |
| 7,049,178 B2 | 5/2006 | Kim et al. | |
| 7,050,138 B1 | 5/2006 | Yamazaki et al. | |
| 7,061,083 B1 | 6/2006 | Usami et al. | |
| 7,342,490 B2 | 3/2008 | Herrmann et al. | |
| 7,361,519 B2 | 4/2008 | Yamazaki et al. | |
| 7,374,977 B2 | 5/2008 | Yamazaki et al. | |
| 7,375,782 B2 | 5/2008 | Yamazaki et al. | |
| 7,446,843 B2 | 11/2008 | Yamazaki et al. | |
| 7,459,352 B2 | 12/2008 | Yamazaki et al. | |
| 7,485,489 B2 | 2/2009 | Björbell | |
| 7,487,373 B2 | 2/2009 | Koyama | |
| 7,488,903 B2 | 2/2009 | Kawagishi | |
| 7,591,863 B2 | 9/2009 | Watanabe et al. | |
| 7,629,618 B2 | 12/2009 | Yamazaki et al. | |
| 7,655,566 B2 | 2/2010 | Fujii | |
| 7,667,310 B2 | 2/2010 | Dozen et al. | |
| 7,685,706 B2 | 3/2010 | Maruyama et al. | |
| 7,709,883 B2 | 5/2010 | Takano et al. | |
| 7,727,859 B2 | 6/2010 | Watanabe et al. | |
| 7,732,330 B2 | 6/2010 | Fujii | |
| 7,750,852 B2 | 7/2010 | Hanaoka et al. | |
| 7,863,188 B2 | 1/2011 | Tsurume et al. | |
| 7,888,163 B2 | 2/2011 | Chida et al. | |
| 7,906,847 B2 | 3/2011 | Ohtani et al. | |
| 7,928,510 B2 | 4/2011 | Watanabe | |
| 7,960,719 B2 | 6/2011 | Kato | |
| 7,968,427 B2 | 6/2011 | Sugiyama et al. | |
| 2003/0032210 A1 | 2/2003 | Takayama et al. | |
| 2003/0071953 A1 | 4/2003 | Yamazaki et al. | |
| 2004/0016939 A1 | 1/2004 | Akiba et al. | |
| 2004/0229404 A1 | 11/2004 | Kiso et al. | |
| 2005/0070038 A1 | 3/2005 | Yamazaki et al. | |
| 2005/0085034 A1 | 4/2005 | Akiba et al. | |
| 2005/0233122 A1 | 10/2005 | Nishimura et al. | |
| 2007/0030205 A1 | 2/2007 | Farrell et al. | |
| 2007/0030681 A1 | 2/2007 | Farrell et al. | |
| 2007/0044303 A1 | 3/2007 | Yamano | |
| 2007/0181875 A1 | 8/2007 | Yamazaki et al. | |
| 2008/0044940 A1 | 2/2008 | Watanabe et al. | |
| 2008/0054976 A1 | 3/2008 | Endo et al. | |
| 2008/0093464 A1 | 4/2008 | Dairiki et al. | |
| 2008/0186185 A1 | 8/2008 | Herrmann et al. | |
| 2008/0280033 A1 | 11/2008 | Yamazaki et al. | |
| 2008/0309581 A1 | 12/2008 | Fujii et al. | |
| 2009/0029506 A1 | 1/2009 | Fujii et al. | |
| 2009/0242645 A1 | 10/2009 | Komatsu et al. | |
| 2009/0278252 A1 | 11/2009 | Oikawa et al. | |
| 2009/0289340 A1 | 11/2009 | Yamazaki et al. | |
| 2009/0289341 A1 | 11/2009 | Yamazaki et al. | |
| 2011/0222336 A1 | 9/2011 | Kato | |

FOREIGN PATENT DOCUMENTS

| | | |
|---|---|---|
| EP | 1589797 | 10/2005 |
| EP | 1 758 438 | 2/2007 |
| EP | 1 970 951 | 9/2008 |
| EP | 2015232 A | 1/2009 |
| JP | 62-008283 A | 1/1987 |
| JP | 05-190582 | 7/1993 |
| JP | 06-350250 | 12/1994 |
| JP | 08-250745 | 9/1996 |
| JP | 08-288522 | 11/1996 |
| JP | 09-118086 A | 5/1997 |
| JP | 09-156265 | 6/1997 |
| JP | 10-092980 | 4/1998 |
| JP | 10-211784 | 8/1998 |
| JP | 10-302027 | 11/1998 |
| JP | 2000-231619 | 8/2000 |
| JP | 2001-277726 | 10/2001 |
| JP | 2003-141486 | 5/2003 |
| JP | 2003-160876 A | 6/2003 |
| JP | 2003-174153 | 6/2003 |
| JP | 2004-118255 | 4/2004 |
| JP | 2004-281838 A | 10/2004 |
| JP | 2004-362341 | 12/2004 |
| JP | 2006-086544 A | 3/2006 |
| JP | 2006-139802 | 6/2006 |
| JP | 2006-186346 A | 7/2006 |
| JP | 2007-157891 A | 6/2007 |
| JP | 2007-241999 | 9/2007 |
| JP | 2007-272806 A | 10/2007 |
| JP | 2008-192978 A | 8/2008 |
| WO | WO 96/09158 | 3/1996 |
| WO | WO 01/01740 | 1/2001 |
| WO | WO 2004/001848 | 12/2003 |
| WO | WO 2006/038438 | 4/2006 |
| WO | WO-2006/059554 | 6/2006 |
| WO | WO-2007/060784 | 5/2007 |

270  271  252

260

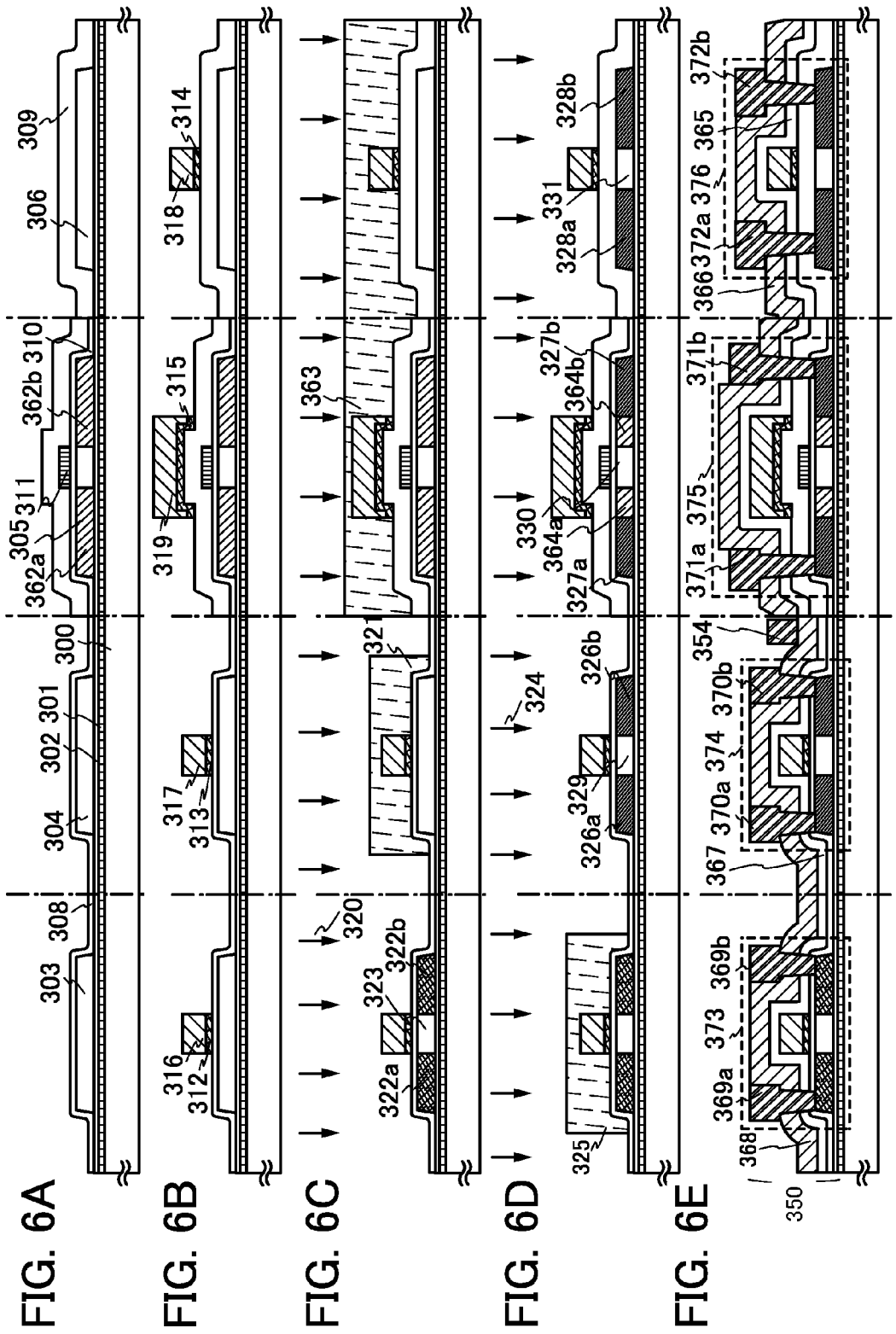

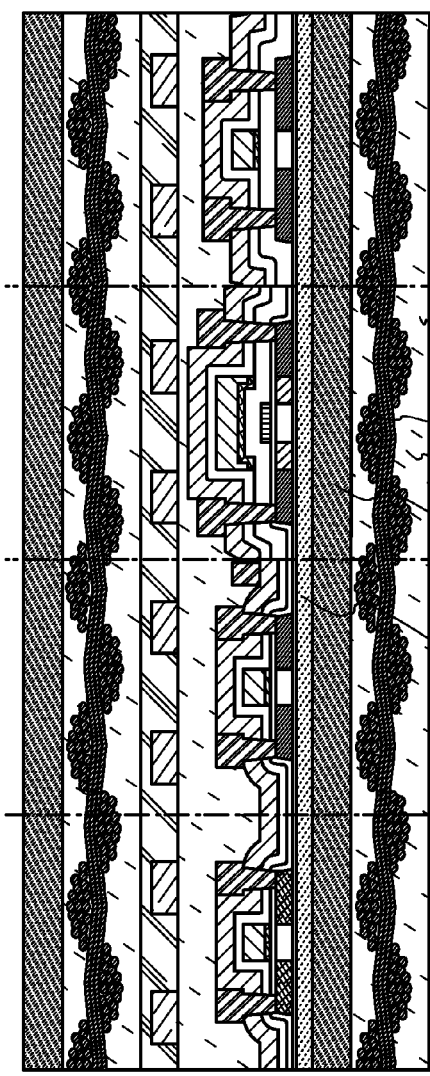
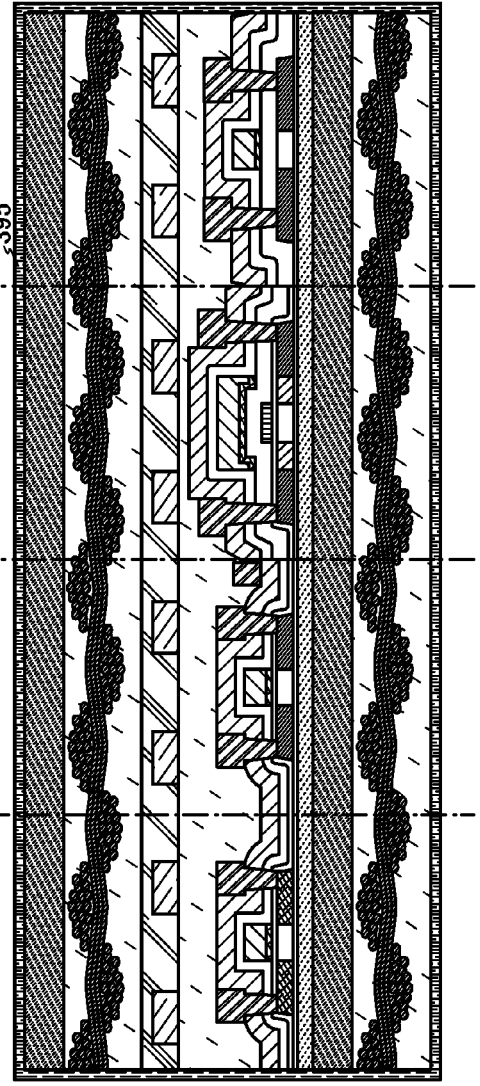
FIG. 8A
FIG. 8B

190

191

197

193

194

195

196

FIG. 23A1
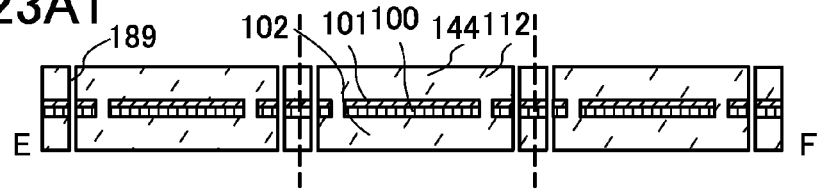
FIG. 23A2
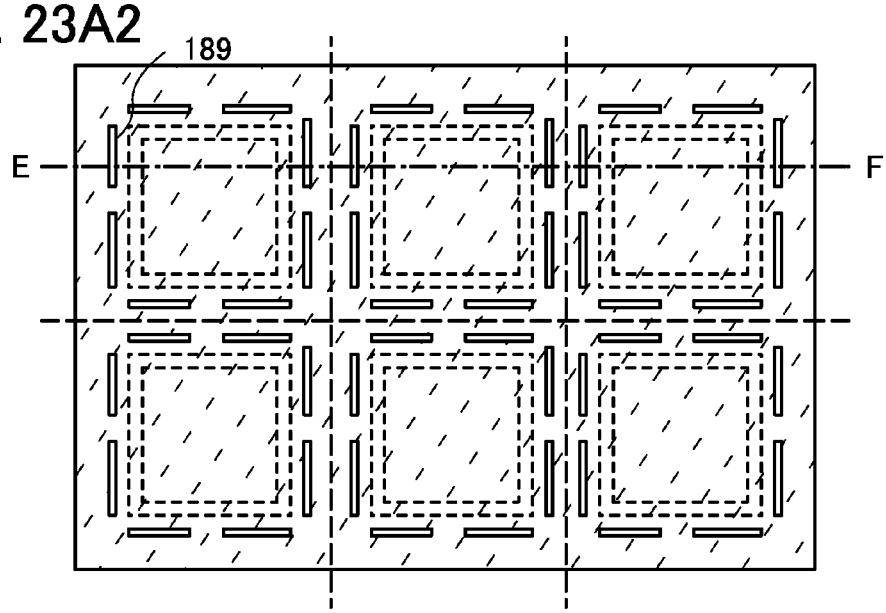
FIG. 23B1
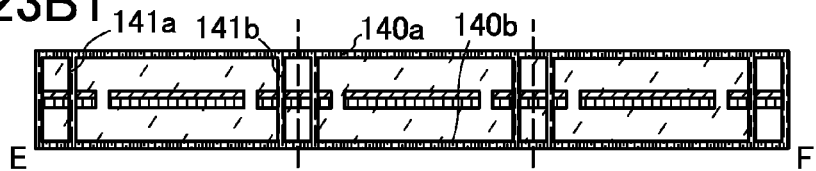
FIG. 23B2
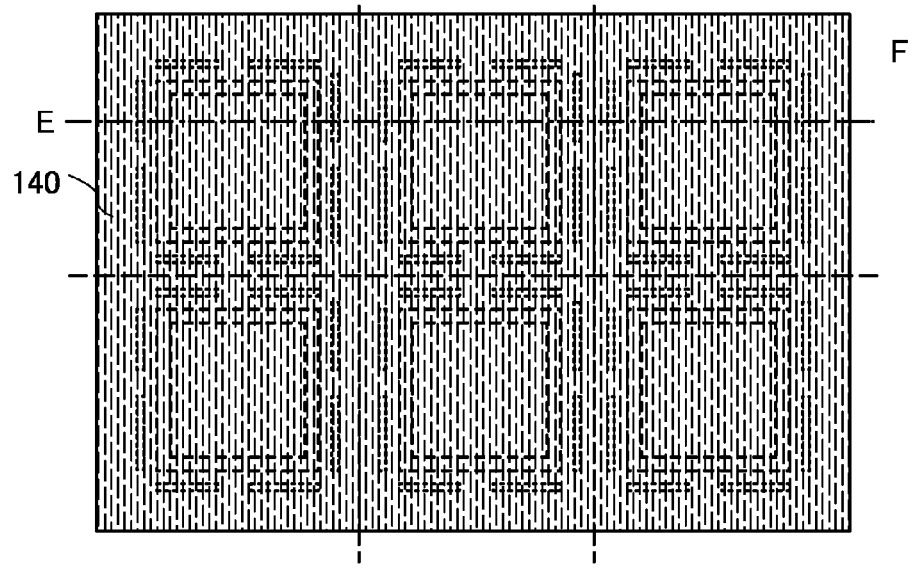

FIG. 24A1
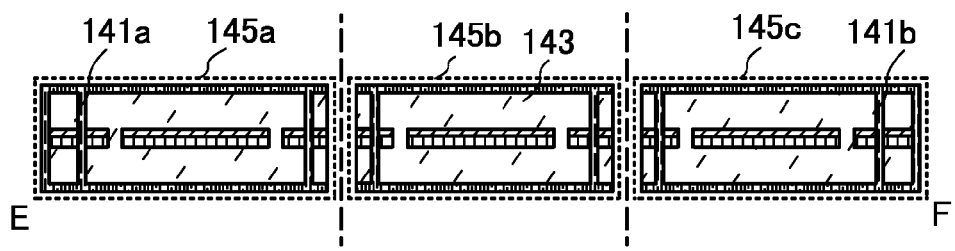
FIG. 24A2
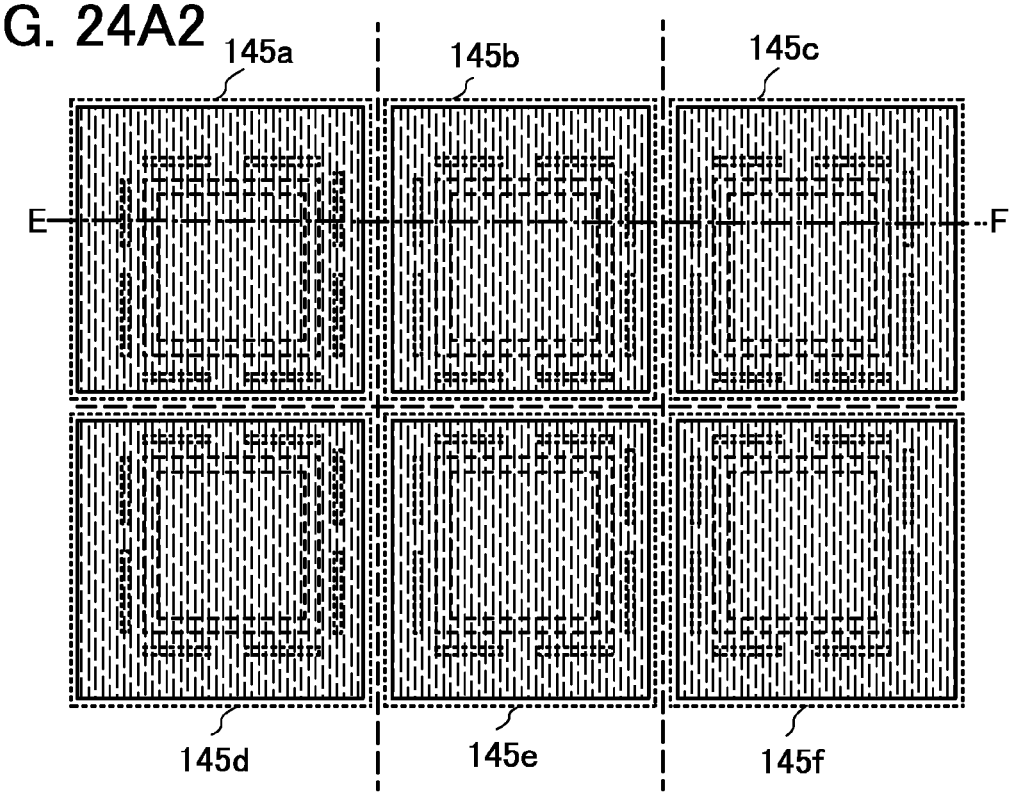

METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

2. Description of the Related Art

In a semiconductor device (also referred to as a wireless signal processing unit, a semiconductor integrated circuit chip, or an IC chip) that sends and receives data by wireless communication through an antenna, breakdown (electrostatic breakdown) of the semiconductor device due to electrostatic discharge from the outside is a serious problem that leads to decrease in reliability and productivity from a manufacturing process time of the semiconductor device to inspection and the use as a product, and a measure against the problem is reported (e.g., see Reference 1).

In Reference 1, an example is described in which a conductive polymer layer is used for a substrate or an adhesive in the aforementioned semiconductor device to prevent electrostatic breakdown.

REFERENCE

Reference 1: Japanese Published Patent Application No. 2007-241999

As the market of the aforementioned semiconductor devices expands, various shapes and various required characteristics are needed. Therefore, a semiconductor device which has high tolerance to electrostatic breakdown and required characteristics is needed.

In the aforementioned semiconductor device in which reduction in size and thickness is achieved, it is also important to increase the strength against external stress.

SUMMARY OF THE INVENTION

Therefore, an object is to provide a highly reliable semiconductor device that is reduced in thickness and size and has tolerance to external stress and electrostatic discharge. Another object is to prevent defective shapes and defective characteristics due to the external stress or an electrostatic discharge in the manufacturing process, and to manufacture a semiconductor device with high yield. Still another object is to manufacture a semiconductor device at low cost and with high productivity.

A semiconductor device according one embodiment of the present invention includes an antenna and a pair of insulators between which a semiconductor integrated circuit that is electrically connected to the antenna is sandwiched, and at least two conductive shields are provided by a plating method on outer sides of the insulators (on the sides where the semiconductor integrated circuit is not provided). In an embodiment of the present invention, the at least two conductive shields are formed so that at least the conductive shield on the top surface is electrically connected to the conductive shield on the bottom surface.

The conductive shield may be formed by a plating method to cover the entire periphery (a top surface, a bottom surface, and side surfaces) of the semiconductor device (to wrap the semiconductor device), or a conductive region that electrically connects the pair of conductive shields provided on the outer sides of the insulators may be formed. The conductive region may be part of the side surface of the semiconductor device or may be an electrode layer that penetrates inside the semiconductor device. Note that the side surface of the semiconductor device refers to a cut surface (divided surface) that is generated when a plurality of semiconductor integrated circuit chips provided on the same insulator is cut (divided) into individual chips. The entire cut surface or part of the cut surface may be covered with the conductive shield.

A semiconductor device according to one embodiment of the present invention is a wireless signal processing unit which has functions of sending and receiving signals to/from an external device by wireless communication. Therefore, the conductive shield transmits an electromagnetic wave that the antenna included in the semiconductor device should send and receive, and prevents external static electricity from being applied to the semiconductor integrated circuit in the semiconductor device.

The conductive shield diffuses static electricity applied by electrostatic discharge to dissipate it or prevents local electric charges (localization of electric charges) (prevents local potential difference) so that electrostatic breakdown of the semiconductor integrated circuit can be prevented. The conductive shield is formed so as to cover (overlap) both surfaces of the semiconductor integrated circuit with the insulator interposed therebetween.

Note that the conductive shield is not electrically connected to the antenna and the semiconductor integrated circuit.

Such a conductive shield is formed using a material to a thickness to transmit the electromagnetic wave that should be sent and received by the sandwiched antenna and semiconductor integrated circuit and to prevent static electricity. Thus, a semiconductor device which has tolerance to electrostatic breakdown and has high reliability and which can send and receive data by wireless communication through the antenna can be provided.

The semiconductor integrated circuit is sandwiched between a pair of insulators. The pair of insulators also functions as an impact resistance layer against force (also referred to as external stress) externally given to the semiconductor device or as an impact diffusion layer that diffuses the force. Provision of the insulators can reduce force that is locally applied; therefore, damage, deterioration of characteristics, or the like of the semiconductor device due to the external stress can be prevented.

In the semiconductor device, the semiconductor integrated circuit is sandwiched between the pair of insulators. The semiconductor integrated circuit is formed over a substrate, bonded to the insulator, and then separated from the substrate. In this specification, a surface of the semiconductor integrated circuit that is formed by separation of the semiconductor integrated circuit from the substrate is referred to as a separation surface.

The conductive shield may have conductivity, and a conductive layer formed using a conductive material can be used. In an embodiment of the present invention, the conductive layer which is used for the conductive shield is formed using a film including metal by a plating method.

A wet plating method by which a film including metal is formed by reducing metal ions that exist in an aqueous solution by electrons is used as a method for forming the conductive shield. When the wet plating method is classified in terms of a reduction method, there are a reduction method by electricity (electrolytic (electric) plating method), a reduction method by a reducing agent (electroless plating method), a reduction method by using a difference of an ionization tendency (displacement plating method), and the like. In an embodiment of the present invention, the aforementioned wet plating method can be used, and a combination of the aforementioned wet plating methods may be used.

A film can be formed isotropically with respect to an object by a wet plating method; therefore, a region where the film can be formed is large, and a conductive shield that covers a periphery (a top surface, a bottom surface, and side surfaces) of a semiconductor device can be formed in one plating process. The conductive shield formed in one plating process can be a continuous film.

By a plating method, a region that can be treated at a time can be large, productivity can be improved, and cost for a process can be reduced to achieve low cost. Therefore, when a conductive shield is formed by using a plating method, a semiconductor device of an embodiment of the present invention can be formed with high productivity at low cost. Lower cost of a process allows a semiconductor device to be provided at lower cost.

As a conductive shield, a film of metal, a metal alloy, or the like, or a stacked layer of these can be used. The thickness of the conductive shield may be more than 0 nm and less than or equal to about 1 μm.

In addition, a protective layer may be stacked over the conductive shield. Even when the conductive shield is provided on the surface of the semiconductor device, the protective layer serves as an outermost surface; therefore, deterioration of the conductive shield can be prevented.

For the insulator, a structure body in which a fibrous body is impregnated with an organic resin can be used.

Alternatively, a material which has a low modulus of elasticity and high breaking strength may be used as the insulator.

The insulator is preferably formed using a high-strength material. As typical examples of the high-strength material, a polyvinyl alcohol resin, a polyester resin, a polyamide resin, a polyethylene resin, an aramid resin, a polyparaphenylenebenzobisoxazole resin, a glass resin, and the like can be given. When an insulator formed using a high-strength material having elasticity is provided, load such as local pressure is diffused and absorbed through the entire layer; therefore, the semiconductor device can be prevented from being damaged.

More specifically, as the insulator, an aramid resin, a polyethylene naphthalate (PEN) resin, a polyethersulfone (PES) resin, a polyphenylene sulfide (PPS) resin, a polyimide (PI) resin, or the like can be used.

In this specification, the word "transfer" (also referred to as transpose) means that a semiconductor integrated circuit formed over one substrate is separated from the substrate and moved to another substrate. In other words, it means that a place where the semiconductor integrated circuit is provided is changed to another substrate.

A method for manufacturing a semiconductor device, according to an embodiment of the present invention, includes a step of forming a semiconductor integrated circuit and an antenna electrically connected to the semiconductor integrated circuit; a step of sandwiching the semiconductor integrated circuit and the antenna between a first insulator and a second insulator which are provided to face each other; and a step of forming, by a plating method, at least two conductive shields that are electrically connected to each other on surfaces of the first insulator and the second insulator, on which the semiconductor integrated circuit is not formed.

A method for manufacturing a semiconductor device, according to an embodiment of the present invention, includes a step of forming a semiconductor integrated circuit and an antenna electrically connected to the semiconductor integrated circuit; a step of sandwiching the semiconductor integrated circuit and the antenna between a first insulator and a second insulator which are provided to face each other; and a step of immersing a stack of the semiconductor integrated circuit, the antenna, the first insulator, and the second insulator in a plating solution including a conductive material to form a conductive shield covering a surface of the stack.

A method for manufacturing a semiconductor device, according to an embodiment of the present invention, includes a step of forming a semiconductor integrated circuit and an antenna electrically connected to the semiconductor integrated circuit; a step of sandwiching the semiconductor integrated circuit and the antenna between a first insulator and a second insulator which are provided to face each other; a step of immersing a stack of the semiconductor integrated circuit, the antenna, the first insulator, and the second insulator in a solution including a catalyst material, and making the catalyst material adsorbed on a surface of the stack; and a step of immersing the stack to which the catalyst material is adsorbed in a plating solution including a conductive material to form a conductive shield covering the surface of the stack to which the catalyst material is adsorbed.

The insulator may be bonded to the semiconductor integrated circuit by a bonding layer, in which case, the bonding layer is provided between the semiconductor integrated circuit and the insulator. In addition, the insulator and the semiconductor integrated circuit may be directly bonded to each other by heat treatment and pressure treatment.

Note that according to an embodiment of the present invention, a semiconductor device refers to a device which can function by utilizing the semiconductor characteristics. By using an embodiment of the present invention, a semiconductor device having a circuit including a semiconductor element (such as a transistor, a memory element, or a diode), and a semiconductor device such as a chip including a processor circuit can be manufactured.

With the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield. In addition, a semiconductor device can be formed with high productivity at low cost because a plating method is used for the formation of the conductive shield.

BRIEF DESCRIPTION OF THE DRAWINGS

FIGS. 6A to 6E are diagrams illustrating a method for manufacturing a semiconductor device.

FIGS. 8A and 8B are diagrams illustrating the method for manufacturing the semiconductor device.

FIGS. 23A1, 23A2, 23B1, and 23B2 are diagrams illustrating a method for manufacturing a semiconductor device.

FIGS. 24A1 and 24A2 are diagrams illustrating the method for manufacturing the semiconductor device.

DETAILED DESCRIPTION OF THE INVENTION

Figure 1A:
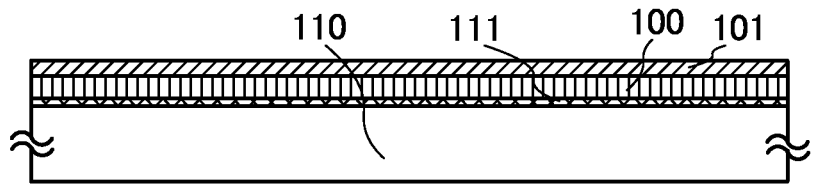
FIGS. 1A to 1E are diagrams illustrating a method for manufacturing a semiconductor device.
Figure 1B:
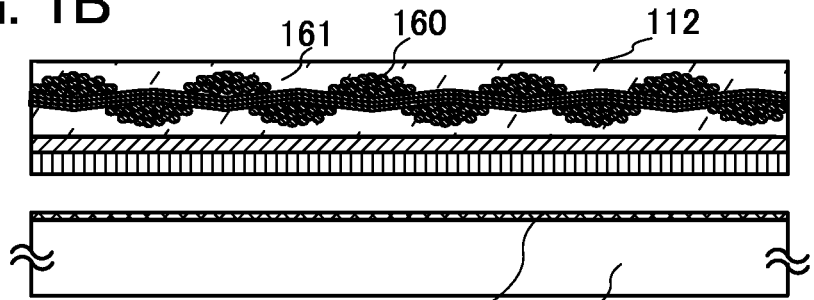

Embodiments of the present invention will be described with reference to the accompanying drawings. However, the present invention is not limited to the following description, and it will be easily understood by those skilled in the art that various changes and modifications can be made to the modes and their details without departing from the spirit and scope of the present invention. Therefore, the present invention should not be construed as being limited to the description in the following embodiments. Note that a common reference numeral refers to the same part or a part having a similar function throughout the drawings in the structure of the present invention described below, and the description thereof is omitted.

Embodiment 1

In this embodiment, a highly reliable semiconductor device and a method for manufacturing a semiconductor device with high yield will be described in detail with reference to FIGS. 1A to 1E, FIGS. 2A to 2C, and FIGS. 3A to 3C.

In a semiconductor device according to this embodiment, a semiconductor integrated circuit is separated from a substrate over which the semiconductor integrated circuit has been formed and is sandwiched between flexible insulators. Note that in this specification, the substrate over which the semiconductor integrated circuit has been formed is also referred to as a formation substrate. Thus, the semiconductor integrated circuit is formed over the formation substrate with a separation layer interposed therebetween.

Figure 3A:
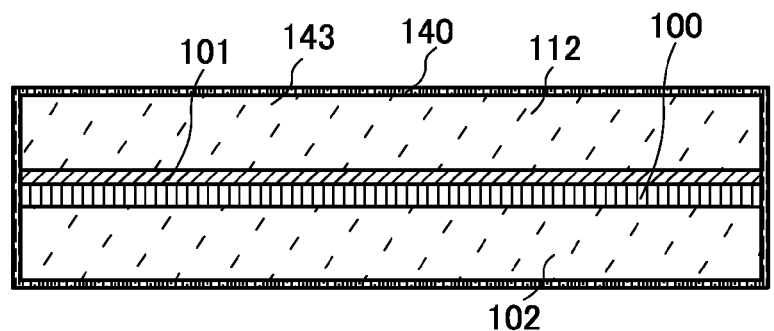
FIGS. 3A to 3C are diagrams illustrating semiconductor devices.
Figure 3B:
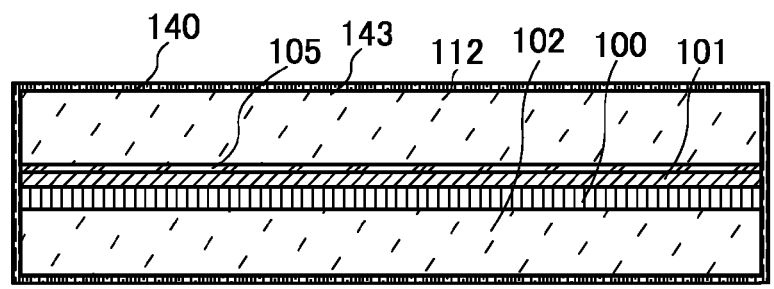
Figure 3C:
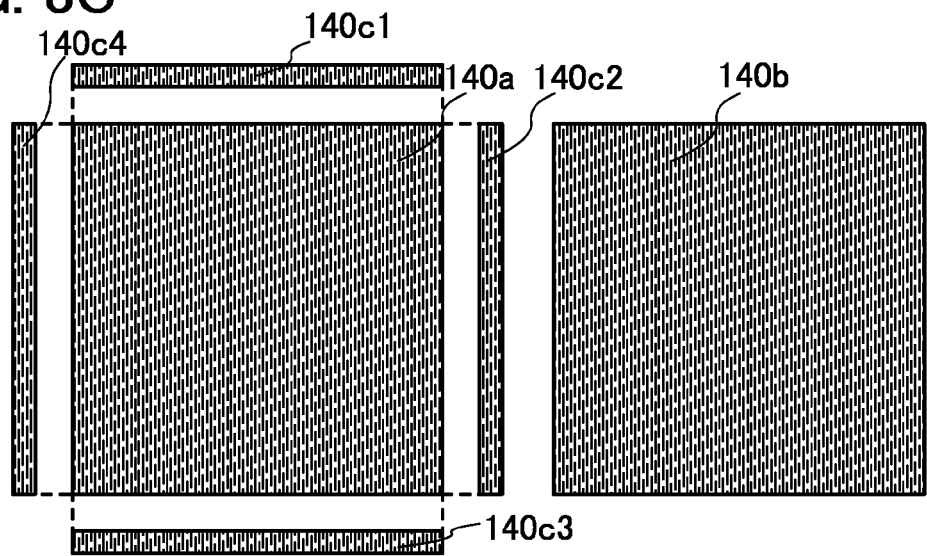

Semiconductor devices of this embodiment are illustrated in FIGS. 3A, 3B, and 3C. In FIG. 3A, an antenna 101 and a semiconductor integrated circuit 100 that is electrically connected to the antenna 101 are sandwiched between a first insulator 112 and a second insulator 102. A conductive shield 140 is provided on outer sides of the first insulator 112 and the second insulator 102 (on sides where the semiconductor integrated circuit 100 is not provided) and side surfaces of a stack of the antenna 101, the semiconductor integrated circuit 100, the first insulator 112 and the second insulator 102. In addition, the antenna 101 may be provided below the semiconductor integrated circuit 100 or an outer side of the conductive shield 140 (not to be overlapped with the semiconductor integrated circuit 100). The conductive shield 140 formed on the outer sides of the first insulator 112 and the second insulator 102 is a continuous film to be formed in one process, or the conductive shield 140 formed on the outer side of the first insulator 112 and the conductive shield 140 formed on the outer side of the second insulator 102 are at least electrically connected to each other.

In particular, the conductive shield 140 formed on the outer side of the first insulator 112 is electrically connected to the conductive shield 140 formed on the outer side of the second insulator 102, so that static electricity can be effectively diffused and localization of charge can be prevented effectively, compared to the case where conductive shields which are not electrically connected to each other are formed on the outer sides of the first insulator 112 and the second insulator 102 or the case where a conductive shield is provided on one of the first insulator 112 and the second insulator 102. As a result, breakdown of the semiconductor integrated circuit 100 due to static electricity can be prevented more effectively.

The conductive shield 140 may be formed by a plating method to cover the entire periphery (a top surface, a bottom surface, and side surfaces) of the semiconductor device (to wrap the semiconductor device), or a conductive region that electrically connects the conductive shields 140 provided on the outer sides of the first insulator 112 and the second insulator 102 may be formed. The conductive region may be part of the side surface of the semiconductor device, or may be an electrode layer that penetrates inside the semiconductor device. Note that the side surface of the semiconductor device refers to a cut surface (divided surface) that is generated when a plurality of semiconductor integrated circuit chips provided on the same insulator is cut (divided) into individual chips. The entire cut surface or part of the cut surface may be covered with the conductive shield 140.

A plan view of the semiconductor device illustrated in FIGS. 3A and 3B is illustrated in FIG. 3C. In FIG. 3C, a stack 143 including the first insulator 112, the antenna 101, the semiconductor integrated circuit 100, and the second insulator 102 is covered with a conductive shield 140a (on the first insulator 112 side (also referred to as a front surface side or a top surface side)), a conductive shield 140b (on the second insulator 102 side (also referred to as a back surface side or a bottom surface side)), and conductive shields 140c1, 140c2, 140c3, and 140c4 (on the side surface sides).

Figure 22A:
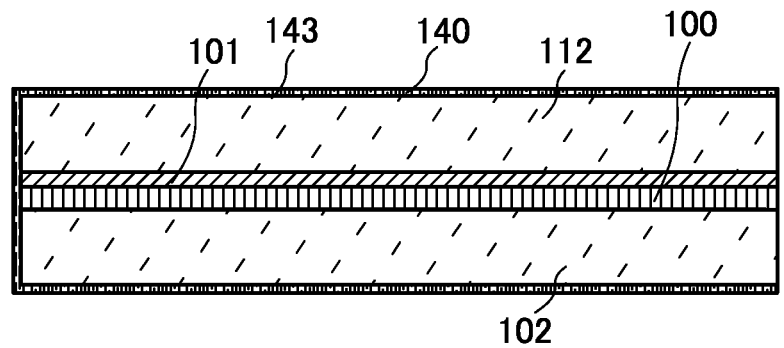
FIGS. 22A to 22C are diagrams each illustrating a semiconductor device.
Figure 22B:
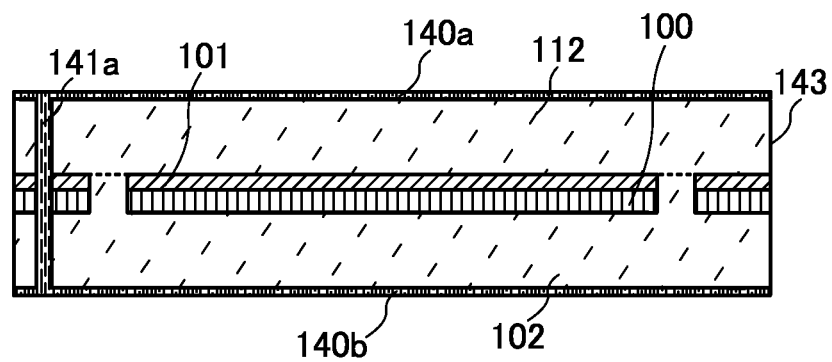
Figure 22C:
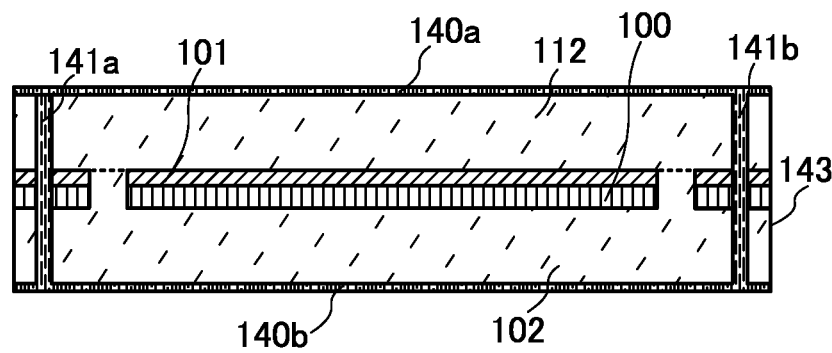

FIG. 22A illustrates a structure in which at least one side surface is covered with the conductive shield 140. FIG. 22B illustrates an example in which the conductive shields 140a and 140b formed on the surfaces are electrically connected to each other by an electrode layer 141a that penetrates inside the semiconductor device, while FIG. 22C illustrates an example in which the conductive shields 140a and 140b formed on the surfaces are electrically connected to each other by the electrode layer 141a and an electrode layer 141b. The electrode layers 141a and 141b can be formed by forming through-holes before the conductive shields are formed by a plating method and by filling the through-holes with a plating solution. Note that FIGS. 22B and 22C illustrate examples in which the individual antenna 101 and the individual semiconductor integrated circuit 100 are divided before the antenna 101 and the semiconductor integrated circuit 100 are bonded to the second insulator 102, and the second insulator 102 is bonded to so as to fill an opening. Therefore, in the cross-sectional view of FIGS. 22B and 22C, the antenna 101 and the semiconductor integrated circuit 100 are divided by the insulator.

The conductive shield 140 is provided on the entire surface of a region that overlaps the semiconductor integrated circuit 100 so as to cover the semiconductor integrated circuit 100, and the semiconductor integrated circuit 100 is sandwiched.

The conductive shield 140 is not electrically connected to the semiconductor integrated circuit 100 and the antenna 101.

A semiconductor device of this embodiment is a wireless signal processing unit having a function of sending and receiving signals to/from an external device by wireless communication. Accordingly, the conductive shield 140 transmits an electromagnetic wave that the antenna 101 included in the semiconductor device should send and receive, and external static electricity is prevented from being applied to the semiconductor integrated circuit 100 in the semiconductor device. The conductive shield 140 diffuses static electricity applied by electrostatic discharge to dissipate it or prevents local electric charges (localization of electric charges) (prevents local potential difference) so that electrostatic breakdown of the semiconductor integrated circuit 100 can be prevented.

The conductive shields that are electrically connected to each other are provided on both a front surface and a back surface of the semiconductor integrated circuit 100; therefore, a wide region of the semiconductor integrated circuit 100 is protected from external static electricity, and a higher effect of prevention of electrostatic breakdown can be obtained.

One surface of the semiconductor integrated circuit 100, on which the antenna 101 is not provided, has weak tolerance to electrostatic discharge (ESD); therefore, the conductive shield 140 on the second insulator 102 side may have a larger thickness than the conductive shield 140 on the first insulator 112 side.

The semiconductor device described in this embodiment performs operation (has a radio transmission function) by generating induced electromotive force due to an external electromagnetic wave. Therefore, the conductive shield needs to prevent breakdown of the semiconductor integrated circuit due to static electricity and to be formed using a conductive material that transmits the electromagnetic wave.

In general, it is known that the electromagnetic wave is attenuated in a substance, and this attenuation is remarkable in the conductive material, particularly. Therefore, the conductive shield has a sufficiently small thickness so that the electromagnetic wave can be transmitted through the conductive shield in this embodiment.

The thickness of the conductive shield may be set considering a frequency of an electromagnetic wave used for communication, or resistance and magnetic permeability of the conductive material used for the conductive shield.

For example, when a conductive material having resistivity $\rho$ of $5.5 \times 10^{-7}$ ($\Omega \cdot m$) is used as the conductive shield and a frequency of an electromagnetic wave is 13.56 MHz, the conductive shield has a thickness of at most less than or equal to about 500 nm. Thus, breakdown of the semiconductor device resulting from electrostatic discharge is suppressed, and communication with the outside can be performed favorably.

When a conductive material having higher resistivity is used, the conductive shield may be formed to have a thickness of less than or equal to about 700 nm.

It is preferable that the lower limit of the thickness of the conductive shield be determined based on resistivity. For example, when a conductive material to be used for the conductive shield has a high resistivity, it is preferable that the conductive shield be formed to have a large thickness in order to diffuse static electricity effectively. When a thin conductive shield is formed using a conductive material having a high resistivity, sheet resistance increases, and static electricity cannot be diffused effectively in the case where electrostatic discharge is generated; therefore, large current might flow to the semiconductor integrated circuit and the semiconductor integrated circuit might be broken down.

Therefore, in order to effectively prevent breakdown of the semiconductor device due to static electricity, it is preferable that thickness be set so that the sheet resistance of the conductive shield is less than or equal to $1.0 \times 10^7$ $\Omega$/square, more preferably, less than or equal to $1.0 \times 10^4$ $\Omega$/square, further preferably, less than or equal to $1.0 \times 10^2$ $\Omega$/square.

Note that if the sheet resistance of the conductive shield is within the above range, it is preferable that the thickness of the conductive shield be as small as possible in terms of transmitting the electromagnetic wave.

Note that when a material having a low resistivity is used as the conductive material, the sheet resistance can be reduced sufficiently and the electromagnetic wave can be easily transmitted even in the case where the thickness of the conductive shield is extremely small; however, the thickness may be greater than or equal to about 1 nm (more preferably, greater than or equal to 3 nm) in consideration of a manufacture process or the like.

On the other hand, it is preferable that the thickness be at least greater than or equal to 5 nm when a material having a relatively high resistivity is used.

Such a conductive shield is formed, whereby breakdown of the semiconductor device due to an electrostatic discharge can be effectively suppressed, and the semiconductor device by which communication with the outside can be performed favorably can be obtained.

Next, materials or the like which can be applied to the structure illustrated in FIGS. 1A to 1E will be described in detail.

The conductive shield may have conductivity, and a conductive layer formed using a conductive material can be used. In an embodiment of the present invention, the conductive layer which is used for the conductive shield is formed using a film including metal by a plating method.

In an embodiment of the present invention, a wet plating method by which a film including metal is formed by reducing metal ions that exist in an aqueous solution by electrons is used. When the wet plating method is classified in terms of a reduction method, there are a reduction method by electricity (electrolytic (electric) plating method), a reduction method by a reducing agent (electroless plating method), a reduction method by a difference of an ionization tendency (displacement plating method), and the like. In an embodiment of the present invention, the aforementioned wet plating method can be used, and a combination of the aforementioned wet plating methods may be used.

A film can be formed isotropically with respect to an object by a wet plating method; therefore, a region where the film can be formed is large, and a conductive shield that covers a periphery (a top surface, a bottom surface, and side surfaces) of a semiconductor device can be formed in one plating process. The conductive shield formed in one plating process can be a continuous film.

By a plating method, a region that can be treated at a time can be large, productivity can be improved, and cost for a process can be reduced to achieve low cost. Therefore, when a conductive shield is formed by using a plating method, a semiconductor device of an embodiment of the present invention can be formed with high productivity at low cost. Lower cost of a process allows a semiconductor device to be provided at lower cost.

Such a conductive shield 140 is formed using a material to a thickness to transmit the electromagnetic wave that should be sent and received by the sandwiched antenna and semiconductor integrated circuit and to prevent static electricity. Thus, a semiconductor device which has tolerance to electrostatic breakdown and has high reliability and which can send and receive data by wireless communication through the antenna can be provided.

As the conductive shield 140, a single layer or a stacked layer of a film including metal which can be formed by a wet plating method can be used.

The conductive shield 140 may be formed using an element selected from nickel, copper, tin, silver, gold, platinum, palladium, zinc, cadmium, chromium, iron, cobalt, and tungsten; or an alloy material containing the element as its main component, for example.

As an alloy material, a nickel alloy (a nickel phosphorus (NiP) alloy, a nickel boron (NiB) alloy, a nickel cobalt (NiCo) alloy, a nickel cobalt phosphorus (NiCoP) alloy, a nickel iron phosphorus (NiFeP) alloy, a nickel tungsten phosphorus (NiWP) alloy, and the like), a zinc alloy (a zinc iron alloy, a zinc nickel alloy, and a tin zinc alloy), a tin alloy (a tin silver alloy, a tin cobalt alloy), a copper zinc alloy (brass), and the like can be given.

A film including metal formed by a plating method, a film of metal, metal nitride, metal oxide, or the like formed by another manufacturing method (various dry methods such as a sputtering method, a plasma CVD method, or an evaporation method; a coating method; a printing method; a droplet discharge method (an ink jet method); or the like), or a stacked layer of those films may be used. The metal nitride or the metal oxide can also be formed by nitriding or oxidizing the surface of the metal film.

For the metal nitride, tantalum nitride, titanium nitride, or the like can be used.

As the metal oxide, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide (ZnO), ZnO containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like may also be used.

Note that depending on a wet plating method and a conductive material to be used, formation of a conductive film (a seed layer), adsorption of a catalytic material, or the like in a region (a body to be plated) where a plating film is formed is performed as appropriate.

In addition, a protective layer may be stacked over the conductive shield 140. As the protective layer, a nitride material (e.g., tantalum nitride, titanium nitride, or the like) or an oxide material (e.g., titanium oxide or the like) can be used. Even when the conductive shield 140 is provided on the surface of the semiconductor device, the protective layer serves as an outermost surface; therefore, deterioration of the conductive shield 140 can be prevented. The protective layer may have a thickness of greater than or equal to about 10 nm and less than or equal to about 200 nm.

Figure 2A:
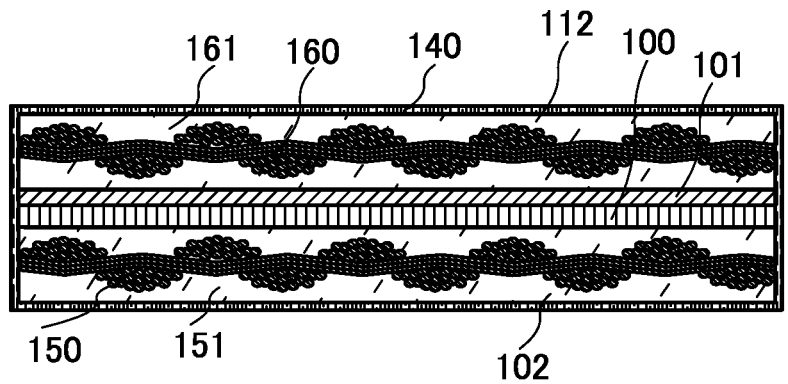
FIGS. 2A to 2C are diagrams illustrating semiconductor devices.
Figure 2B:
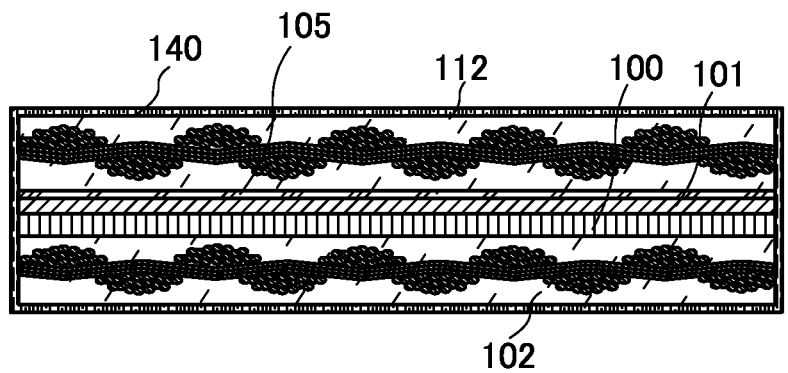
Figure 2C:
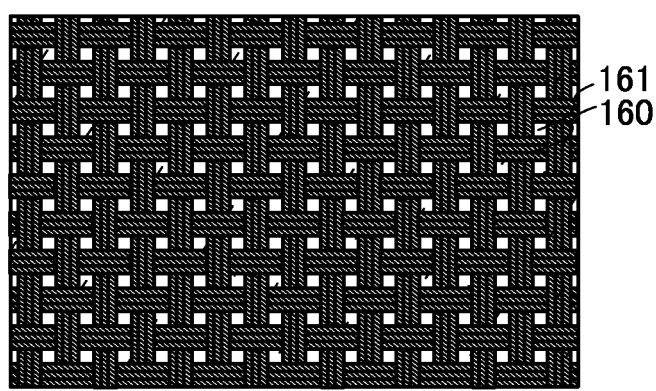

For the insulator, a structure body in which a fibrous body is impregnated with an organic resin can be used. In FIGS. 2A to 2C, examples are illustrated in which a structure body in which a fibrous body is impregnated with an organic resin is used for each of the first insulator 112 and the second insulator 102. FIGS. 2A and 2B correspond to FIGS. 3A and 3B, respectively.

The structure body in which a fibrous body is impregnated with an organic resin is used for each of the first insulator 112 and the second insulator 102. A structure body in which a fibrous body 160 is impregnated with an organic resin 161 is used for the first insulator 112, and a structure body in which a fibrous body 150 is impregnated with an organic resin 151 is used for the second insulator 102.

FIG. 2C is a plan view of the fibrous body 160 which is a woven fabric formed using yarn bundles of fibers for the warp yarn and the weft yarn.

As illustrated in FIG. 2C, the fibrous body 160 is woven using warp yarns spaced at regular intervals and weft yarns spaced at regular intervals. Such a fibrous body that is woven using the warp yarns and the weft yarns has regions without the warp yarns and the weft yarns. In the fibrous body 160, the fibrous body is more easily impregnated with the organic resin 161, whereby adhesiveness between the fibrous body 160 and the semiconductor integrated circuit can be increased.

In addition, in the fibrous body 160, density of the warp yarns and the weft yarns may be high and a proportion of the regions without the warp yarns and the weft yarns may be low.

The structure body in which the fibrous body 160 is impregnated with the organic resin 161 is also referred to as a prepreg. A prepreg is formed specifically as follows: after a fibrous body is impregnated with a varnish in which a matrix resin is diluted with an organic solvent, drying is performed so that the organic solvent is volatilized and the matrix resin is semi-cured. The thickness of the structure body is preferably greater than or equal to 10 μm and less than or equal to 100 μm, more preferably, greater than or equal to 10 μm and less than or equal to 30 μm. With the use of the structure body with such a thickness, a semiconductor device which is thin and can be bent can be manufactured. For example, a prepreg having a modulus of elasticity of greater than or equal to 13 GPa and less than or equal to 15 GPa and a modulus of rupture of 140 MPa can be used for the insulator.

Note that the structure body in which a fibrous body is impregnated with an organic resin may have a stacked structure. In that case, the structure body may be a stack of a plurality of structure bodies in each of which a single-layer fibrous body is impregnated with an organic resin or may be a structure body in which a plurality of fibrous bodies stacked is impregnated with an organic resin. Further, in stacking a plurality of structure bodies in each of which a single-layer fibrous body is impregnated with an organic resin, another layer may be sandwiched between the structure bodies.

A thermosetting resin such as an epoxy resin, an unsaturated polyester resin, a polyimide resin, a bismaleimide-triazine resin, or a cyanate resin can be used as the organic resin 161. Alternatively, a thermoplastic resin such as a polyphenylene oxide resin, a polyetherimide resin, or a fluorine resin can be used as the organic resin 161. Still alternatively, a plurality of resins selected from the above thermosetting resins and thermoplastic resins may be used as the organic resin 161. By using the above organic resin, the fibrous body can be bonded to the semiconductor integrated circuit by heat treatment. The higher the glass transition temperature of the organic resin 161 is, the less easily the organic resin 161 is damaged by local pressure, which is preferable.

Highly thermally-conductive filler may be dispersed in the organic resin 161 or the yarn bundles of fibers. As the highly thermally-conductive filler, aluminum nitride, boron nitride, silicon nitride, alumina, and the like can be given. As the highly thermally-conductive filler, a metal particle such as silver or copper can also be given. When the conductive filler is included in the organic resin or the yarn bundles of fibers, heat generated in the semiconductor integrated circuit can be easily released to the outside. Accordingly, thermal storage in the semiconductor device can be suppressed and thus the semiconductor device can be prevented from being damaged.

The fibrous body 160 is a woven or nonwoven fabric using high-strength fibers of an organic compound or an inorganic compound, and a plurality of fibrous bodies is provided so as to partly overlap with each other. The high-strength fiber is specifically a fiber with a high modulus of elasticity in tension or a fiber with a high Young's modulus. As typical examples of the high-strength fiber, a polyvinyl alcohol fiber, a polyester fiber, a polyamide fiber, a polyethylene fiber, an aramid fiber, a polyparaphenylenebenzobisoxazole fiber, a glass fiber, a carbon fiber, and the like can be given. As a glass fiber, a glass fiber using E glass, S glass, D glass, Q glass, or the like can be given. Note that the fibrous body 160 may be formed from one kind of the above high-strength fibers or a plurality of the above high-strength fibers.

The fibrous body 160 may be a woven fabric which is woven using bundles of fibers (single yarns) (hereinafter, the bundles of fibers are referred to as yarn bundles) for warp yarns and weft yarns, or a nonwoven fabric obtained by stacking yarn bundles of plural kinds of fibers randomly or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers which has been subjected to fiber opening with a high-pressure water stream, high-frequency vibration using liquid as a medium, continuous ultrasonic vibration, pressing with a roller, or the like may be used. A yarn bundle of fibers which is subjected to fabric opening has a large width, has a smaller number of single yarns in the thickness direction, and has an elliptical shape or a flat shape in cross section. Further, by using a loosely twisted yarn for the yarn bundle of fibers, the yarn bundle is easily flattened and has an elliptical shape or a flat shape in cross section. Using a yarn bundle having an elliptical shape or a flat shape in cross section in this manner can reduce the thickness of the fibrous body 160. Accordingly, the thickness of the fibrous body 160 can be reduced, and thus a thin semiconductor device can be manufactured.

Note that in drawings of this embodiment, the fibrous body 160 is illustrated as a woven fabric which is plain-woven using a yarn bundle having an elliptical shape in cross section.

Further, in order to enhance permeability of an organic resin into the inside of the yarn bundle of fibers, the fiber may be subjected to surface treatment. For example, as the surface treatment, corona discharge treatment, plasma discharge treatment, and the like for activating a surface of the fiber can be given. Further, surface treatment using a silane coupling agent or a titanate coupling agent can be given.

In addition, a material having low modulus of elasticity and high breaking strength may be used as the first insulator 112 and the second insulator 102. For example, as the first insulator 112 and the second insulator 102, a rubber elastic film having a modulus of elasticity of greater than or equal to 5 GPa and less than or equal to 12 GPa and a modulus of rupture of greater than or equal to 300 MPa can be used.

The first insulator 112 and the second insulator 102 are each preferably formed using a high-strength material. As typical examples of the high-strength material, a polyvinyl alcohol resin, a polyester resin, a polyamide resin, a polyethylene resin, an aramid resin, a polyparaphenylenebenzobisoxazole resin, a glass resin, and the like can be given. When the first insulator 112 and the second insulator 102 each formed using a high-strength material having elasticity are provided, load such as local pressure is diffused and absorbed through the entire layer; therefore, the semiconductor device can be prevented from being damaged.

More specifically, as the first insulator 112 and the second insulator 102, an aramid resin, a polyethylene naphthalate (PEN) resin, a polyethersulfone (PES) resin, a polyphenylene sulfide (PPS) resin, a polyimide (PI) resin, or the like can be used.

The semiconductor integrated circuit 100 or the antenna 101 may be bonded to the first insulator 112 or the second insulator 102 by using a bonding layer. The bonding layer may be able to bond the insulators and the semiconductor integrated circuit, and a thermosetting resin, an ultraviolet curable resin, an acrylic resin, a urethane resin, an epoxy resin, a silicone resin, or the like can be used. The bonding layer may have a thickness of greater than or equal to about 3 μm and less than or equal to about 15 μm. When the semiconductor integrated circuit 100 is bonded to the first insulator 112 and the second insulator 102 by heat treatment and pressure treatment, the bonding layer is not necessarily used.

In addition, a protective layer may be formed over the semiconductor integrated circuit. Examples are illustrated in FIG. 3B and FIG. 2B in each of which an inorganic insulating layer 105 is formed as a protective layer over the semiconductor integrated circuit 100. Further, FIG. 3B and FIG. 2B each illustrate an example in which the antenna 101 is formed over the semiconductor integrated circuit 100 and the inorganic insulating layer 105 is formed over the antenna 101. The inorganic insulating layer 105 covers the antenna 101, thereby preventing oxidation or the like of a conductive layer functioning as an antenna.

The inorganic insulating layer 105 is formed to have a single-layer structure or a stacked structure using an inorganic compound by a sputtering method, a plasma CVD method, a coating method, a printing method, or the like. As typical examples of the inorganic compound, oxide of silicon and nitride of silicon can be given. As typical examples of the oxide of silicon and the nitride of silicon, silicon oxide, silicon oxynitride, silicon nitride, silicon nitride oxide, and the like can be given. Note that a silicon oxynitride film in this specification means a film that contains more oxygen than nitrogen and includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that contains more nitrogen than oxygen and includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

Moreover, the inorganic insulating layer 105 may have a stacked structure. For example, inorganic compounds may be stacked to form the inorganic insulating layer 105. Typically, two or more of silicon oxide, silicon nitride oxide, and silicon oxynitride may be stacked to form the inorganic insulating layer 105.

A method for manufacturing a semiconductor device of an embodiment of the present invention will be described with reference to FIGS. 1A to 1E. The antenna 101 and the semiconductor integrated circuit 100 are formed over a substrate 110 having an insulating surface which is a formation substrate with a separation layer 111 interposed between the semiconductor integrated circuit 100 and the substrate 110 (see FIG. 1A).

As the substrate 110, which is a formation substrate, a glass substrate, a quartz substrate, a sapphire substrate, a ceramic substrate, a metal substrate having an insulating layer on a surface thereof, or the like can be used. Alternatively, a plastic substrate which can withstand the process temperature of this embodiment may be used. In the manufacturing process of a semiconductor device, a formation substrate can be selected as appropriate in accordance with the process.

The separation layer 111 is formed to have a single-layer structure or a stacked structure including a layer formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); or an alloy or compound material containing any of the elements as its main component by a sputtering method, a plasma CVD method, a coating method, a printing method, or the like. A layer containing silicon may have an amorphous structure, a microcrystalline structure, or a polycrystalline structure. Note that a coating method includes a spin-coating method, a droplet discharge method, and a dispensing method in its category here.

When the separation layer 111 has a single-layer structure, a tungsten layer, a molybdenum layer, or a layer containing a mixture of tungsten and molybdenum is preferably formed. Alternatively, a layer containing oxide or oxynitride of tungsten, a layer containing oxide or oxynitride of molybdenum, or a layer containing oxide or oxynitride of a mixture of tungsten and molybdenum is formed. Note that the mixture of tungsten and molybdenum corresponds, for example, to an alloy of tungsten and molybdenum.

When the separation layer 111 has a stacked structure, it is preferable to form, as a first layer, a tungsten layer, a molybdenum layer, or a layer containing a mixture of tungsten and molybdenum, and form, as a second layer, oxide, nitride, oxynitride, or nitride oxide of tungsten, molybdenum, or a mixture of tungsten and molybdenum.

When the separation layer 111 has a stacked structure of a layer containing tungsten and a layer containing tungsten oxide, the layer containing tungsten may be formed first and an insulating layer formed of oxide may be formed on the layer containing tungsten so that a layer containing tungsten oxide can be formed at the interface between the tungsten layer and the insulating layer. Further, the surface of the layer containing tungsten may be subjected to thermal oxidation treatment, oxygen plasma treatment, or treatment using a strong oxidizing solution such as ozone water to form a layer containing oxide of tungsten. In addition, plasma treatment or heat treatment may be performed in an atmosphere of oxygen, nitrogen, or dinitrogen monoxide, or a mixed gas of the gas and another gas. The same applies to the case of forming a layer containing nitride, oxynitride, or nitride oxide of tungsten. After a layer containing tungsten is formed, a silicon nitride layer, a silicon oxynitride layer, or a silicon nitride oxide layer may be formed thereover.

Although the separation layer 111 is formed to be in contact with the substrate 110 according to the above process, an embodiment of the present invention is not limited to this process. An insulating layer to be a base may be formed in contact with the substrate 110, and the separation layer 111 may be provided in contact with the insulating layer.

The semiconductor integrated circuit 100 and the first insulator 112 are bonded to each other, and the semiconductor integrated circuit 100 is separated from the substrate 110 using the separation layer 111. Accordingly, the semiconductor integrated circuit 100 is provided on the first insulator 112 side (see FIG. 1B).

In this embodiment, the structure body in which the fibrous body 160 is impregnated with the organic resin 161 is used for the first insulator 112. The structure body is heated and subjected to pressure bonding, so that the organic resin of the structure body is plasticized or cured. Note that when the organic resin is an organic plastic resin, the organic resin which is plasticized is then cured by cooling the organic resin to room temperature. By heating and pressure bonding, the organic resin is uniformly spread so as to be in close contact with the semiconductor integrated circuit, and is cured. The step in which the structure body is subjected to pressure bonding is performed under an atmospheric pressure or a reduced pressure.

Any of the following methods can be appropriately used as a step for transferring the semiconductor integrated circuit to another substrate: a method in which a separation layer is formed between a substrate and a semiconductor integrated circuit, a metal oxide film is formed between the separation layer and the semiconductor integrated circuit, the metal oxide film is weakened by crystallization, and the semiconductor integrated circuit is separated; a method in which an amorphous silicon film containing hydrogen is provided between a substrate having high heat resistance and a semiconductor integrated circuit, and the amorphous silicon film is irradiated with a laser beam or etched to remove the amorphous silicon film, thereby separating the semiconductor integrated circuit; a method in which a separation layer is formed between a substrate and a semiconductor integrated circuit, a metal oxide film is provided between the separation layer and the semiconductor integrated circuit, the metal oxide film is weakened by crystallization, part of the separation layer is etched away using a solution or a halogen fluoride gas such as $NF_3$, $BrF_3$, or $ClF_3$, and separation is performed at the weakened metal oxide film; a method in which a substrate over which a semiconductor integrated circuit is formed is mechanically removed or is etched away using a solution or a halogen fluoride gas such as $NF_3$, $BrF_3$, or $ClF_3$; or the like. Alternatively, it is also possible to use a method in which a film containing nitrogen, oxygen, hydrogen, or the like (e.g., an amorphous silicon film containing hydrogen, an alloy film containing hydrogen, or an alloy film containing oxygen) is used as a separation layer, and the separation layer is irradiated with a laser beam so that nitrogen, oxygen, or hydrogen contained in the separation layer is discharged as a gas, whereby separation of the semiconductor integrated circuit from the substrate is facilitated may be used.

By combining any of the above separation methods, the transferring step can be more easily performed. That is, the separation can also be performed with physical force (by a machine or the like) after performing laser irradiation; etching to the separation layer with a gas, a solution, or the like; or mechanical removal with a sharp knife, scalpel, or the like; so as to make a condition where the separation layer and the semiconductor integrated circuit can be easily separated from each other.

Alternatively, a liquid may be made to permeate an interface between the separation layer and the semiconductor integrated circuit, and then the semiconductor integrated circuit is separated from the formation substrate.

Similarly to the first insulator 112, the second insulator 102 is formed using the structure body in which the fibrous body 150 is impregnated with the organic resin 151.

Figure 1C:
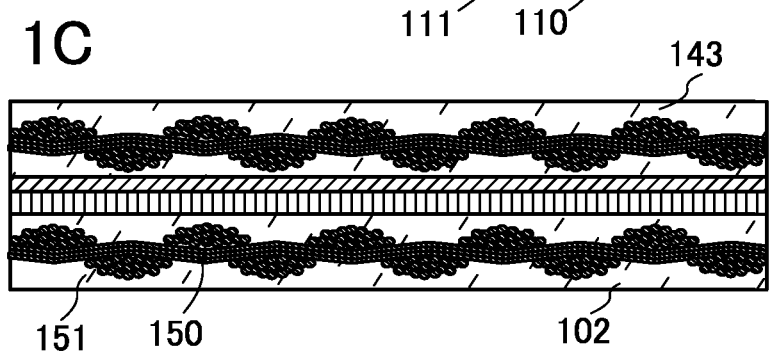

The structure body is heated and subjected to pressure bonding, and the second insulator 102 is bonded to a separation surface where the semiconductor integrated circuit 100 is exposed, whereby the antenna 101 and the semiconductor integrated circuit 100 are sandwiched between the first insulator 112 and the second insulator 102 (see FIG. 1C).

Although not illustrated, a plurality of semiconductor integrated circuits is sandwiched between the first insulator 112 and the second insulator 102, and then the semiconductor integrated circuits 100 are individually divided, whereby the stacks 143 which are semiconductor integrated circuit chips are formed. There is no particular limitation on a separation means as long as physical separation is possible, and separation is performed by laser beam irradiation in this embodiment.

By separation, the antenna 101 and the semiconductor integrated circuit 100 are sealed by the first insulator 112 and the second insulator 102, and divided surfaces (side surfaces generated by separation) are formed on the chips.

Figure 1D:
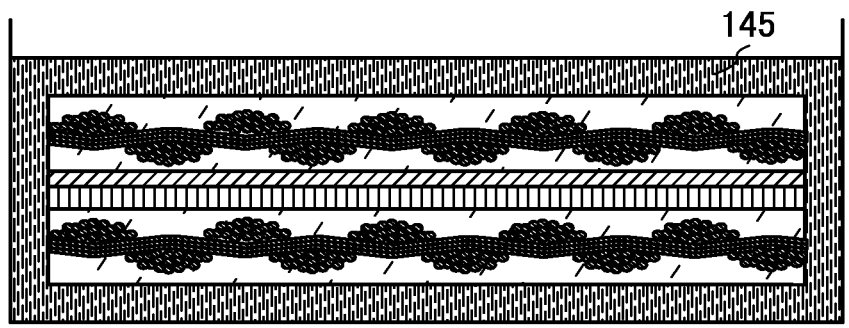
Figure 1E:
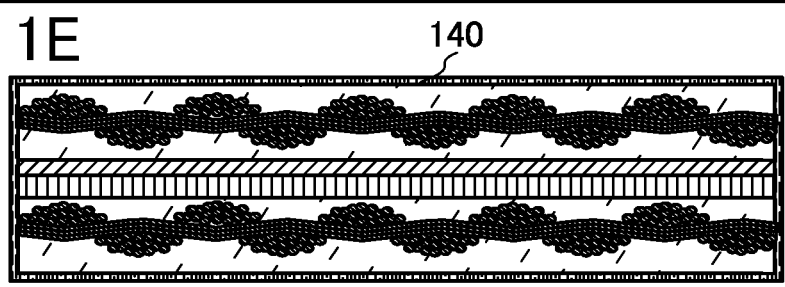

The stack 143 is immersed in a plating solution 145 including a plating metal material, and a film including metal is grown on the stack 143 (see FIG. 1D). The immersion time is controlled so as to obtain a desired film thickness and the conductive shield 140 is formed (see FIG. 1E).

Accordingly, the antenna 101 and the semiconductor integrated circuit 100 are sealed by the first insulator 112 and the second insulator 102 and protected against electrostatic discharge using the conductive shield 140 that is provided on outer sides of the first insulator 112 and the second insulator 102 which correspond to the surface and back surface of the semiconductor device and on side surfaces of the stack.

The plating solution 145 may be in contact with a region to be plated of the stack 143; therefore, an immersion method is not limited. Therefore, the stack 143 may be placed obliquely (or perpendicularly) and the plating solution 145 may be applied to the stack 143 in such a way that the plating solution 145 flows on the surface of the stack 143. When the plating is performed so that the solution is applied to the stack 143 placed obliquely (or perpendicularly), there is an advantage of downsizing an apparatus which is used for the process of a large substrate.

With the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield. In addition, a semiconductor device can be formed with high productivity at low cost because a plating method is used for the formation of the conductive shield.

Embodiment 2

In this embodiment, another example of a semiconductor device for providing high reliability and a method for manufacturing the semiconductor device with the use of an embodiment of the present invention will be described with reference to FIGS. 14A and 14B, FIGS. 15A and 15B, FIGS. 16A to 16D, and FIGS. 17A to 17D. In the structure of this embodiment described below, a common reference numeral refers to the same part or a part having a similar function throughout drawings, in Embodiment 1 and this embodiment, and the description thereof is omitted.

Figure 14A:
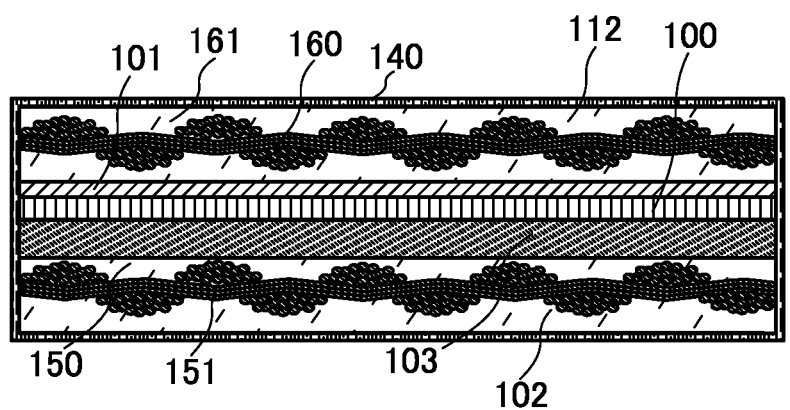
FIGS. 14A and 14B are diagrams each illustrating a semiconductor device.

An example in which an insulator has a stacked structure is described in this embodiment. In FIG. 14A, the antenna 101 and the semiconductor integrated circuit 100 that is connected to the antenna 101 are sandwiched between the first insulator 112 and the second insulator 102. A third insulator 103 is provided between the semiconductor integrated circuit 100 and the second insulator 102, and the conductive shield 140 is provided on the outer sides of the first insulator 112 and the second insulator 102 (on the sides where the semiconductor integrated circuit 100 is not provided) and side surfaces of a semiconductor device. The conductive shield 140 may be formed on all the side surfaces to surround (wrap) the periphery of the semiconductor device or may be formed to cover part of the side surfaces of the semiconductor device. The conductive shield formed on the outer side of the first insulator 112 is electrically connected to the conductive shield formed on the outer side of the second insulator 102 in an embodiment of the present invention. In this embodiment, the conductive shield 140 is formed in the same plating process on the outer sides of the first insulator 112 and the second insulator 102, and is a continuous film.

Figure 14B:
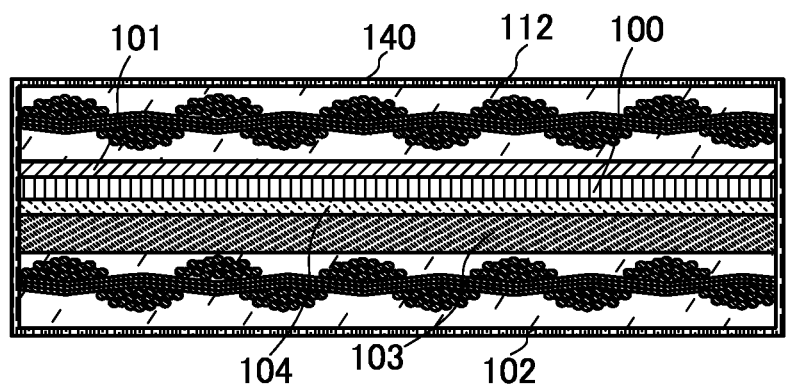

FIG. 14B is an example in which the semiconductor integrated circuit 100 and the third insulator 103 are bonded to each other using a bonding layer 104. An acrylic resin is used for the bonding layer 104 in FIG. 14B.

It is preferable that the third insulator 103 provided between the semiconductor integrated circuit 100 and the second insulator 102 have lower modulus of elasticity and higher breaking strength than the first insulator 112 and the second insulator 102 so that the third insulator 103 can function as an impact diffusion layer.

The third insulator 103 is provided to be in contact with and near the semiconductor integrated circuit, which has an effect of diffusing and reducing force that is applied to the semiconductor integrated circuit from the outside.

For the first insulator 112 and the second insulator 102 in FIGS. 14A and 14B, a structure body in which a fibrous body is impregnated with an organic resin can be used. It is preferable that the first insulator 112 and the second insulator 102 in FIGS. 14A and 14B have a modulus of elasticity of greater than or equal to 13 GPa and a modulus of rupture of less than 300 MPa.

It is preferable that a material having low modulus of elasticity and high breaking strength be used for the third insulator 103. For example, a rubber elastic film having a modulus of elasticity of greater than or equal to 5 GPa and less than or equal to 12 GPa and a modulus of rupture of greater than or equal to 300 MPa can be used for the third insulator 103.

The third insulator 103 is preferably formed using a high-strength material. As typical examples of the high-strength material, a polyvinyl alcohol resin, a polyester resin, a polyamide resin, a polyethylene resin, an aramid resin, a polyparaphenylenebenzobisoxazole resin, a glass resin, and the like can be given. When the third insulator 103 formed using a high-strength material having elasticity is provided, load such as local pressure is diffused and absorbed through the entire layer; therefore, the semiconductor device can be prevented from being damaged.

More specifically, as the third insulator 103, an aramid resin, a polyethylene naphthalate (PEN) resin, a polyethersulfone (PES) resin, a polyphenylene sulfide (PPS) resin, a polyimide (PI) resin, or the like can be used. In this embodiment, an aramid resin film (modulus of elasticity of 10 GPa, and breaking strength of 480 MPa) is used as the third insulator 103.

Figure 15A:
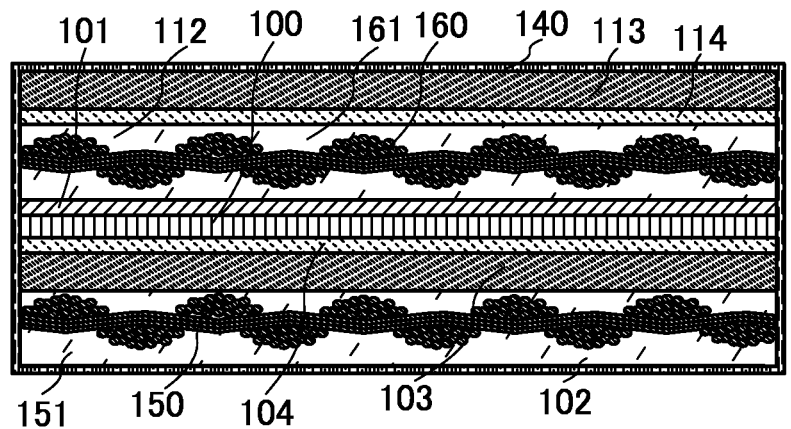
FIGS. 15A and 15B are diagrams each illustrating a semiconductor device.
Figure 15B:
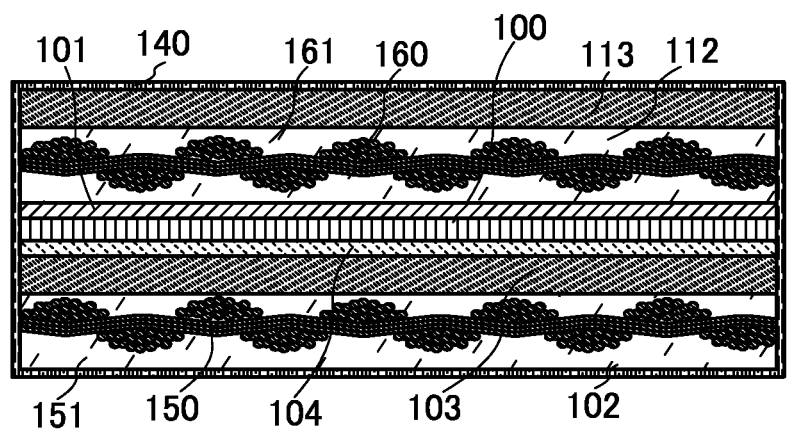

In addition, a fourth insulator 113 that is similar to the third insulator 103 may be provided on an outer side of the first insulator 112 (on the side where the antenna 101 is not provided), as illustrated in FIGS. 15A and 15B.

FIG. 15A is an example in which the fourth insulator 113 that is similar to the third insulator 103 is fixed on an outer side of the first insulator 112 by using a bonding layer 114. In this embodiment, an aramid film is used for the fourth insulator 113, and an acrylic resin is used for the bonding layer 114. When the first insulator 112 and the fourth insulator 113 are bonded to each other by heat treatment and pressure treatment, the bonding layer 114 is not necessarily used. In this case, the antenna 101, the first insulator 112, and the fourth insulator 113 are directly bonded, as in FIG. 15B. A process of bonding the antenna 101 to the first insulator 112, and a process of bonding the first insulator 112 to the fourth insulator 113 may be performed at the same time or may be performed separately.

A method for manufacturing a semiconductor device of an embodiment of the present invention will be described with reference to FIGS. 16A to 16D. The antenna 101 and the semiconductor integrated circuit 100 are formed over the substrate 110 having an insulating surface which is a formation substrate with the separation layer 111 interposed between the semiconductor integrated circuit 100 and the substrate 110 (see FIG. 16A).

The antenna 101 and the semiconductor integrated circuit 100 are bonded to the first insulator 112, and the semiconductor integrated circuit 100 is separated from the substrate 110 by using the separation layer 111. Accordingly, the semiconductor integrated circuit 100 is provided on the first insulator 112 side (see FIG. 16B).

Also in FIGS. 16A to 16D, the structure body in which the fibrous body 160 is impregnated with the organic resin 161 is used for the first insulator 112. The structure body is heated and subjected to pressure bonding, so that the organic resin of the structure body is plasticized or cured.

Similarly to the first insulator 112, the structure body in which the fibrous body 150 is impregnated with the organic resin 151 is used for the second insulator 102. The structure body is heated and subjected to pressure bonding, so that the third insulator 103 and the second insulator 102 are bonded to each other. The bonding layer 104 is provided on one surface of the third insulator 103, on which the second insulator 102 is not provided.

Figure 16A:
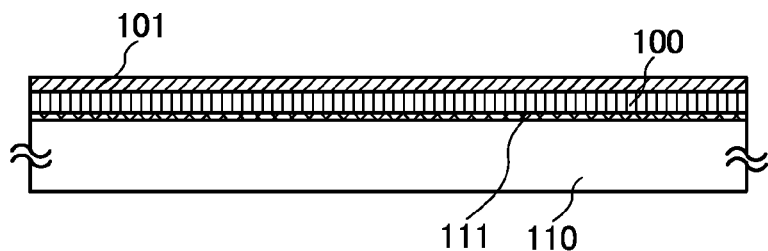
FIGS. 16A to 16D are diagrams illustrating a method for manufacturing a semiconductor device.
Figure 16B:
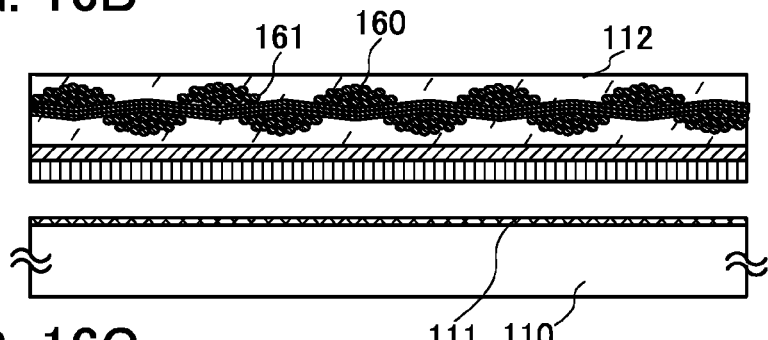
Figure 16C:
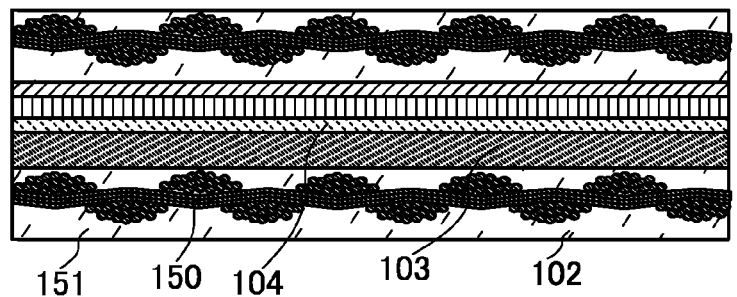

The bonding layer 104 is bonded to the separation surface where the semiconductor integrated circuit 100 is exposed (see FIG. 16C).

Figure 16D:
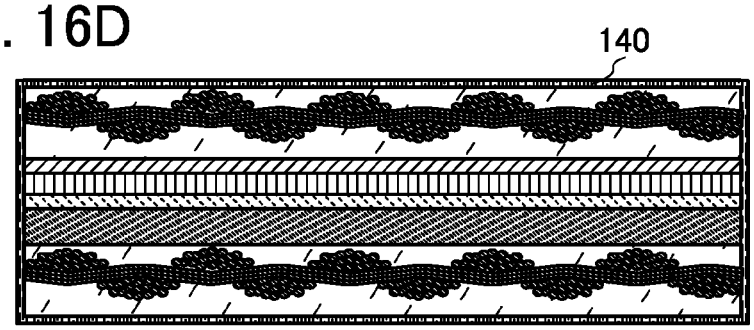

Next, the conductive shield 140 is formed by a wet plating method on the surfaces of the first insulator 112 and the second insulator 102 and side surfaces of a chip that is cut (see FIG. 16D). In this embodiment, a nickel phosphorus (NiP) alloy film is formed by an electroless plating method for the conductive shield 140.

Figure 17A:
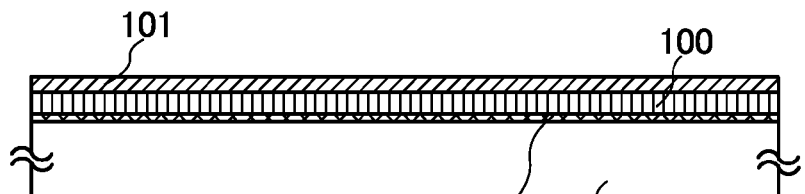
FIGS. 17A to 17D are diagrams illustrating a method for manufacturing a semiconductor device.
Figure 17B:
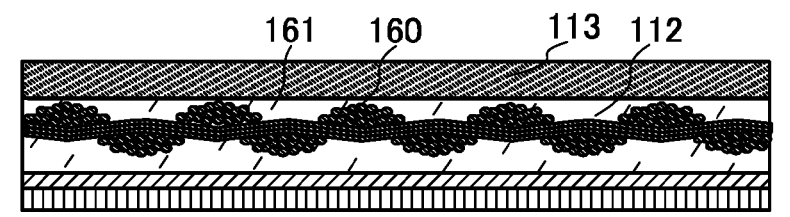
Figure 17C:
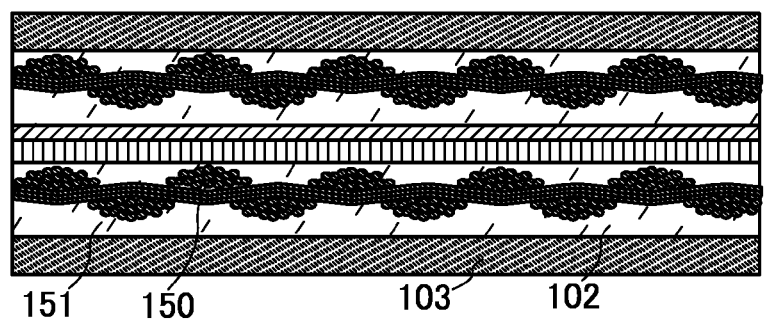
Figure 17D:
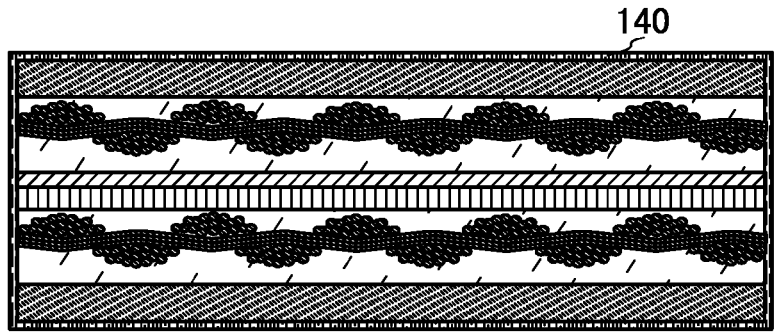

Further, as in FIG. 17D, a structure may be used in which the first insulator 112 and the second insulator 102 each with the use of a prepreg are bonded to the semiconductor integrated circuit 100 and the antenna 101, the fourth insulator 113 and the third insulator 103 are provided on the outer sides of the first insulator 112 and the second insulator 102 (on sides where the semiconductor integrated circuit 100 or the antenna 101 is not provided), and surfaces of the fourth insulator 113 and the third insulator 103 and side surfaces of a stack are covered with the conductive shield 140.

As a manufacturing process of a structure illustrated in FIG. 17D, the antenna 101 and the semiconductor integrated circuit 100 are formed over the substrate 110 having an insulating surface which is a formation substrate with the separation layer 111 interposed between the semiconductor integrated circuit 100 and the substrate 110 (see FIG. 17A).

Next, the fourth insulator 113, the first insulator 112, the antenna 101, and the semiconductor integrated circuit 100 are heated and subjected to pressure bonding, and the antenna 101 and the semiconductor integrated circuit 100 are separated from the substrate 110 using the separation layer 111 (see FIG. 17B).

The third insulator 103 and the second insulator 102 are heated and subjected to pressure bonding to the semiconductor integrated circuit 100, whereby the third insulator 103 and the second insulator 102 are bonded to the semiconductor integrated circuit 100 (see FIG. 17C).

The conductive shield 140 is formed by a wet plating method so as to cover the stack in which the fourth insulator 113, the first insulator 112, the antenna 101, the semiconductor integrated circuit 100, the second insulator 102, and the third insulator 103 are stacked (see FIG. 17D).

The third insulator 103 and the fourth insulator 113 have an effect of enhancing strength of the semiconductor device against external stress. In particular, in the case where an insulator like the third insulator 103 is provided between the semiconductor integrated circuit 100 and the second insulator 102, even when pressure treatment is performed in a manufacturing process, the third insulator 103 diffuses force; therefore, an adverse effect such as damage or deterioration of characteristics is not given to the semiconductor integrated circuit 100. Accordingly, a semiconductor device can be formed with high yield.

The conductive shield 140 transmits an electromagnetic wave that the antenna 101 included in the semiconductor device should send and receive, and external static electricity is prevented from being applied to the semiconductor integrated circuit 100 in the semiconductor device. The conductive shield 140 diffuses static electricity applied by electrostatic discharge to dissipate it or prevents local electric charges (localization of electric charges) (prevents local potential difference) so that electrostatic breakdown of the semiconductor integrated circuit 100 can be prevented.

In addition, the first insulator 112 and the second insulator 102 are provided against force applied to the semiconductor device from the outside, and the fourth insulator 113 and the third insulator 103 which diffuse the force are provided, whereby locally applied force can be reduced; therefore, damage or deterioration of characteristics of the semiconductor device can be prevented.

In the structure of FIG. 15A of this embodiment, the insulator is formed using four layers of the first insulator 112 and the second insulator 102 which mainly function as impact resistance layers and which are structure bodies in each of which a fibrous body is impregnated with an organic resin and the third insulator 103 and the fourth insulator 113 which mainly function as impact diffusion layers and which has a low module of elasticity and high breaking strength. However, at least two layers of insulators with which the antenna 101 and the semiconductor integrated circuit 100 are sandwiched may be provided. Accordingly, a structure in which three layers or two layers of the above four layers are used may be used. At least the semiconductor integrated circuit 100 and the antenna 101 may be covered with the conductive shield 140 that is electrically connected to each other, with insulators interposed between the semiconductor integrated circuit 100 and the conductive shield 140 and between the antenna 101 and the conductive shield 140, and then an insulator may be stacked on the conductive shield 140. When the surface of the conductive shield is not exposed, there is an effect of preventing deterioration of the conductive shield such as oxidation, abrasion, or crazing.

With the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield. In addition, a semiconductor device can be formed with high productivity at low cost because a plating method is used for the formation of the conductive shield.

Embodiment 3

In this embodiment, another example of a semiconductor device for providing high reliability and a method for manufacturing the semiconductor device with the use of an embodiment of the present invention will be described with reference to FIGS. 22A to 22C, FIGS. 23A1, 23A2, 23B1, and 23B2, and FIGS. 24A1 and 24A2. In the structure of this embodiment described below, a common reference numeral refers to the same part or a part having a similar function throughout drawings, in Embodiment 1 and Embodiment 2, and the description thereof is omitted.

In this embodiment, an example of a method for manufacturing a semiconductor device having an electrode layer that penetrates the inside of the semiconductor device as illustrated in FIGS. 22B and 22C in Embodiment 1 is described with reference to FIGS. 23A1, 23A2, 23B1, and 23B2, and FIGS. 24A1 and 24A2. FIGS. 23A2 and 23B2, and FIG. 24A2 are plan views, and FIGS. 23A1 and 23B1, and FIG. 24A1 are cross-sectional views taken along line E-F of FIGS. 23A2 and 23B2, and FIG. 24A2, respectively.

A semiconductor device of this embodiment in a manufacturing process is illustrated in FIGS. 23A1, 23A2, 23B1, and 23B2. The first insulator 112 and the second insulator 102 sandwich a plurality of semiconductor integrated circuits 100 and a plurality of antennas 101, and form a stack 144. The stack 144 includes a plurality of semiconductor integrated circuits before separation into individual chips, and through-holes 189 are provided on outer sides of the semiconductor integrated circuits in chip areas (see FIGS. 23A1 and 23A2). Note that the shape and number of the through-holes are not limited and can be selected as appropriate in accordance with a chip size and a shape. For example, a plurality of circular through-holes in a plan view (cylindrical through-hole in three dimensional view) may be provided.

The through-holes 189 penetrate the stack 144 and reach from the first insulator 112 to the second insulator 102. The through-holes 189 may be processed by physical treatment such as using a needle or a drill or may be processed by chemical treatment such as etching. A laser beam is used for processing in this embodiment.

Next, the stack 144 having the through-holes 189 is subjected to a plating process. The stack 144 having the through-holes 189 is immersed in a plating solution including a metal material, and the conductive shields 140a and 104b are formed on the surfaces of the stack 144 (see FIGS. 23B1 and 23B2). Since the liquid plating solution attaches to the exposed surface of the stack 144, the conductive shields 140a and 140b are formed on the first insulator 112 side and the second insulator 102 side, and the electrode layers 141a and 141b which function as through electrodes are also formed in the through-holes 189. The conductive shields 140a and 140b are electrically connected to each other by the electrode layers 141a and 141b. Note that the electrode layers 141a and 141b may be formed to fill the through-holes 189 or may be formed to cover side surfaces of the through-holes 189.

In this embodiment, the conductive shields 140a and 140b and the electrode layers 141a and 141b are formed in the same plating process; therefore, the conductive shields 140a and 140b and the electrode layers 141a and 141b are continuous films. The conductive shields 140a and 140b and the electrode layers 141a and 141b may be formed in separate processes or using different materials.

By a plating method, a region that can be treated at a time can be large, productivity can be improved, and cost for a process can be reduced to achieve low cost.

The stack 144 in which the conductive shield 140a and 140b, and the electrode layers 141a and 141b are formed is divided into individual semiconductor integrated circuit chips 145a, 145b, 145c, 145d, 145e, and 145f (see FIGS. 24A1 and 24A2). There is no particular limitation on a separation means as long as physical separation is possible, and separation is performed by laser beam irradiation in this embodiment. Each of the semiconductor integrated circuit chips 145a, 145b, and 145c has the stack 143 which is formed by the separation of the stack 144. The semiconductor integrated circuit chip 145b corresponds to FIG. 22C. Note that a structure, like the semiconductor integrated circuit chips 145a and 145c, may be used in which the electrode layers 141a and 141b functioning as through electrodes are provided, and side surfaces of the stack except a cut surface are covered with the conductive shield. Through the above steps, a semiconductor device in which the conductive shield electrically connected to each other covers the periphery of the semiconductor integrated circuit can be formed.

With the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield. In addition, a semiconductor device can be formed with high productivity at low cost because a plating method is used for the formation of the conductive shield.

Embodiment 4

In this embodiment, an example of a plating method that is used for the formation of the conductive shield in a manufacturing process of a semiconductor device of an embodiment of the present invention will be described. In the structure of this embodiment described below, a common reference numeral refers to the same part or a part having a similar function throughout drawings, in Embodiment 1 and this embodiment, and the description thereof is omitted.

In this embodiment, an example in which a conductive shield is formed by an electroless plating method will be described with reference to FIGS. 26A to 26D.

Figure 26A:
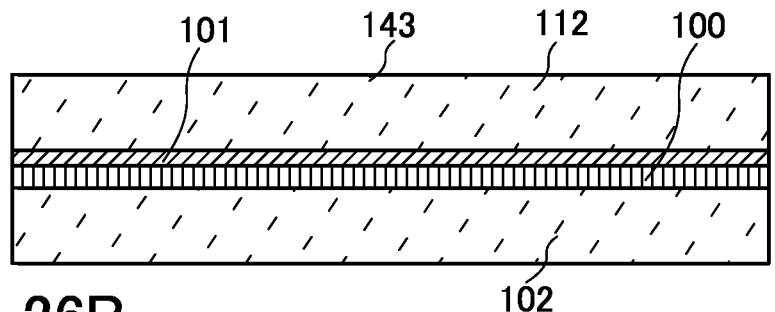
FIGS. 26A to 26D are diagrams illustrating a method for manufacturing a semiconductor device.

The stack 143 in which the semiconductor integrated circuit 100 and the antenna 101 are sandwiched between the first insulator 112 and the second insulator 102 is formed in a manner similar to Embodiment 1 (see FIG. 26A).

The electroless plating method is a wet plating method in which electrons are provided to metal ions in an aqueous solution that is a plating solution (there is the case of using an organic solvent) to perform reduction and deposit a metal thin film. The electroless plating method is a method in which metal is deposited by reduction action of a metal ion reducing agent.

Therefore, it is necessary that a body to be plated be catalyzed so that deposition reaction is performed. When the body to be plated itself serves as a catalyst, catalyzation is not needed; however, a catalyst material is adsorbed by the surface of the body to be plated.

Figure 26B:
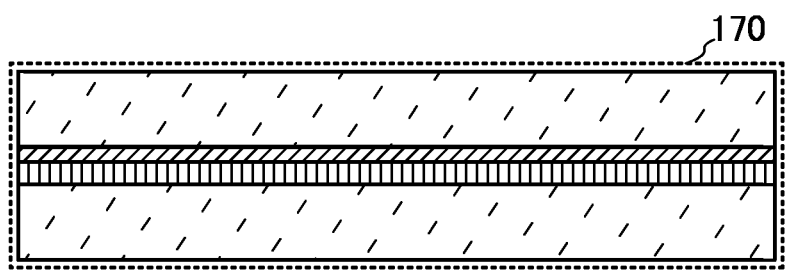

A catalyst material 170 is adsorbed by a region where the conductive shield 140 is formed by a plating method in the stack 143 (see FIG. 26B).

The catalyst material is appropriately selected depending on the plating metal material. As the catalyst material, palladium (Pd), rhodium (Rh), ruthenium (Ru), osmium (Os), iridium (Ir), gold (Au), platinum (Pt), silver (Ag), or the like may be used. The catalyst material is dissolved into a solution, and is treated as a solution containing the catalyst material. In this embodiment, palladium is used for the catalyst material 170.

Figure 26C:
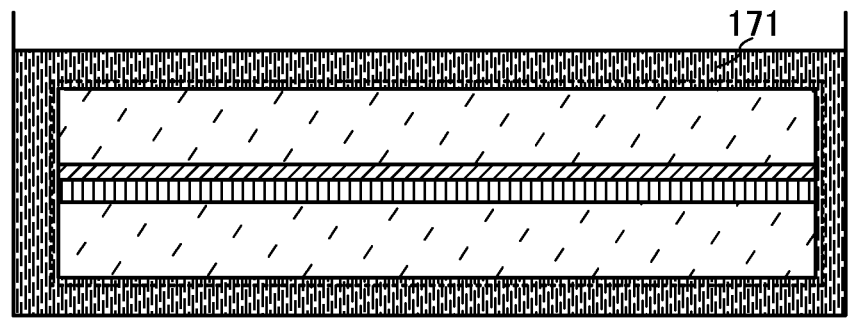
Figure 26D:
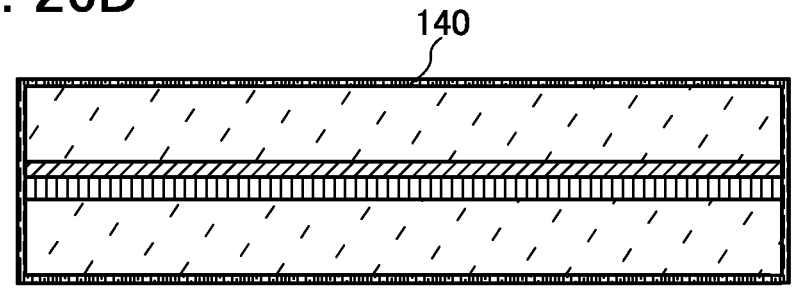

The stack 143 adsorbing the catalyst material 170 is immersed in a plating solution 171 including a plating metal material, and a film including metal is grown on the catalyst material 170 (see FIG. 26C). The immersion time, temperature, or concentration of the plating solution is controlled so as to obtain a desired film thickness and the conductive shield 140 is formed (see FIG. 26D).

The plating solution contains, as its main components, a metal salt (a salt containing a metal material to be deposited, typically, chloride or sulfate) and a reducing agent (which provides electrons to deposit metal ions as metal). In addition, a pH adjuster, a buffer, a complexing agent, an accelerator, a stabilizer, an improver, or the like may be added as an auxiliary component. With only the main components, metal ions are deposited as metal under the right conditions such as pH and bath temperature. In contrast to the main components, the auxiliary component functions to extend the life of a plating bath (plating solution), to improve the efficiency of a reducing agent, and the like, and a highly economical electroless plating method can be performed depending on selection of the auxiliary component. The pH adjuster influences a plating rate, reduction efficiency, and the state of a coating film by plating. The buffer (various organic acids or weak inorganic acids) suppresses pH fluctuation caused by a substance generated when metal deposition is caused by the reduction of metal ions in an electroless plating method. The complexing agent contributes to prevention of hydroxide deposition in an alkaline solution and plating solution decomposition, adjustment of free metal ion concentration and plating rate, and the like (typically, ammonia, ethylenediamine, pyrophosphate, a citric acid, an acetic acid, various organic salts, or the like is used). The accelerator improves metal deposition efficiency by suppressing generation of a hydrogen gas as well as accelerating the plating rate, which is added in minute amounts (typically, sulfide or fluoride is used). The stabilizer functions to suppress generation of a reductive reaction in portions other than the surface of an object to be plated. The stabilizer suppresses natural decomposition of a plating bath or the like and prevents a deposition or the like generated with aging of a plating bath from reacting with the reducing agent, so as not to intensely generate a hydrogen gas (typically, chloride, sulfide, nitrate of lead or the like is used). The improver improves the state of a coating film by plating and improves luster and the like (typically, a surfactant is used).

The conductive shield 140 which can be formed by an electroless plating method may be formed using an element selected from nickel, copper, tin, silver, gold, platinum, palladium, iron, cobalt, and tungsten; or an alloy material including the element as its main component, for example.

As the alloy material, there are a nickel alloy (a nickel phosphorus (NiP) alloy, a nickel cobalt (NiCo) alloy, a nickel cobalt phosphorus (NiCoP) alloy, a nickel iron phosphorus (NiFeP) alloy, a nickel tungsten phosphorus (NiWP) alloy, and the like), and the like.

In this embodiment, a nickel phosphorus alloy film is formed by an electroless plating method as the conductive shield 140. Although nickel is a magnetic substance, when phosphorus content is controlled to be greater than or equal to 11% as a nickel phosphorus alloy film, its magnetism can be decreased (disappear). Accordingly, the nickel phosphorus alloy film can be applied as the conductive shield 140 without shortening the communication distance of the semiconductor device.

By a plating method, a region that can be treated at a time can be large, productivity can be improved, and cost for a process can be reduced to achieve low cost.

With the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield. In addition, a semiconductor device can be formed with high productivity at low cost because a plating method is used for the formation of the conductive shield.

Note that this embodiment can be implemented in combination with any of Embodiments 1 to 4, as appropriate.

Embodiment 5

In this embodiment, an example of a plating method that is used for the formation of the conductive shield in a manufacturing process of a semiconductor device of an embodiment of the present invention will be described. In the structure of this embodiment described below, a common reference numeral refers to the same part or a part having a similar function throughout drawings, in Embodiment 1 and this embodiment, and the description thereof is omitted.

In this embodiment, an example in which a conductive shield is formed by an electrolytic plating method will be described with reference to FIGS. 25A to 25D.

Figure 25A:
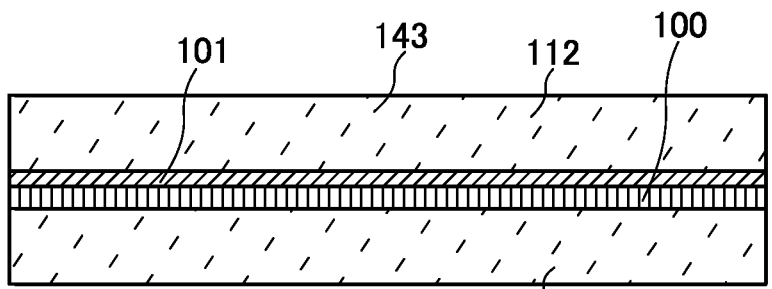
FIGS. 25A to 25D are diagrams illustrating a method for manufacturing a semiconductor device.

The stack 143 in which the semiconductor integrated circuit 100 and the antenna 101 are sandwiched between the first insulator 112 and the second insulator 102 is formed in a manner similar to Embodiment 1 (see FIG. 25A).

The electrolytic plating method is a wet plating method in which electrons are provided to metal ions in an aqueous solution that is a plating solution (there is the case of using an organic solvent) to perform reduction and deposit a metal thin film. The electrolytic plating method is a method in which metal ions are reduced with electricity by flowing current and metal is deposited.

When an electrolytic plating method is utilized, a conductive film (also referred to as a seed layer) through which current flows in a region where a plating film is formed (a body to be plated) is necessary; therefore, a conductive film is formed on the insulator so that the conductive shield is formed on the insulator.

Figure 25B:
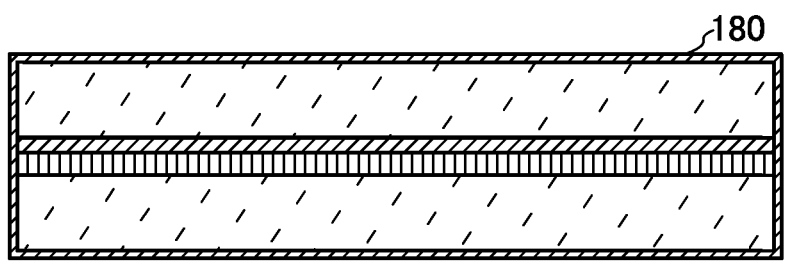

A conductive film 180 is formed in a region of the stack 143 where the conductive shield 140 is formed by a plating method (see FIG. 25B).

The conductive film 180 is appropriately selected depending on the plating metal material. It is preferable that the conductive film 180 have conductivity and high adhesiveness with a plating film to be plated.

As the conductive film 180, a film of silver, copper, a nickel material, or a film of an alloy material thereof can be used. In this embodiment, as the conductive film 180, a copper film is formed by a sputtering method (with a thickness of 100 nm).

Figure 25C:
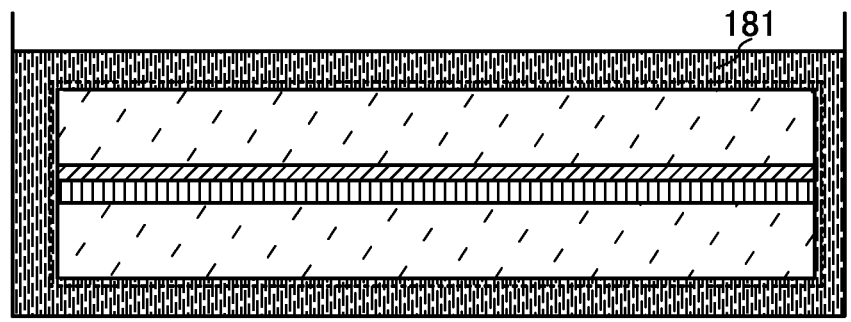
Figure 25D:
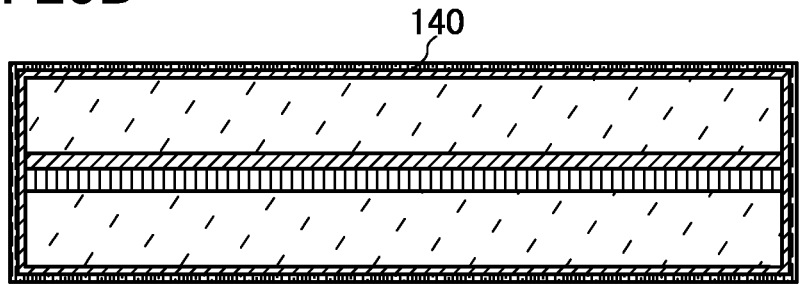

After pretreatment such as washing is performed, the stack 143 provided with the conductive film 180 is immersed in a plating solution 181 including a plating metal material and current flow to the conductive film 180, whereby a film including metal is grown on the conductive film 180 (see FIG. 25C). The immersion time is controlled so as to obtain a desired film thickness and the conductive shield 140 is formed (see FIG. 25D).

The plating solution contains, as its main components, a metal salt (a salt containing a metal material to be deposited, typically, chloride or sulfate) and a reducing agent (which provides electrons to deposit metal ions as metal) in a manner similar to the electroless plating method described in Embodiment 4. In addition, a pH adjuster, a buffer, a complexing agent, an accelerator, a stabilizer, an improver, or the like may be added as an auxiliary component. In contrast to the main component, the auxiliary component functions to extend the life of a plating bath (plating solution), to improve the efficiency of a reducing agent, and the like, and a highly economical electroless plating method can be performed depending on selection of the auxiliary component.

The conductive shield 140 formed by an electrolytic plating method may be formed using an element selected from nickel, copper, tin, silver, gold, platinum, zinc, cadmium, chromium, iron, cobalt, and tungsten; or an alloy material containing the element as its main component, for example.

As an alloy material, zinc alloys (a zinc iron alloy, a zinc nickel alloy, and a tin zinc alloy), tin alloys (a tin silver alloy and a tin cobalt alloy), copper zinc alloys (brass), and the like can be given.

In this embodiment, a copper thin film is formed by an electrolytic plating method as the conductive shield 140. When the conductive shield is formed on the insulator by an electrolytic plating method, there is a stacked structure of the conductive shield 140 and the conductive film 180. When the conductive shield is formed by an electrolytic plating method, the conductive film that is a seed layer also functions as a conductive shield; therefore, it may be said that conductive shield is formed by stacking the conductive film 180 and the conductive shield 140.

By a plating method, a region that can be treated at a time can be large, productivity can be improved, and cost for a process can be reduced to achieve low cost.

With the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield. In addition, a semiconductor device can be formed with high productivity at low cost because a plating method is used for the formation of the conductive shield.

Note that this embodiment can be implemented in combination with any of Embodiments 1 to 4, as appropriate.

Embodiment 6

In this embodiment, a highly reliable semiconductor device and a method for manufacturing a semiconductor device with high yield will be described in detail with reference to FIGS. 4A to 4C and FIGS. 5A and 5B. In this embodiment, a complementary metal oxide semiconductor (CMOS) is described as an example of the semiconductor device.

Figure 4A:
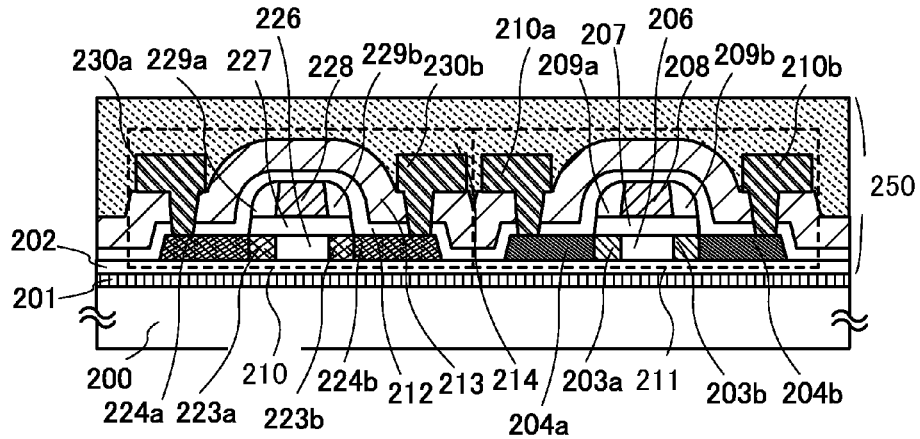
FIGS. 4A to 4C are diagrams illustrating a method for manufacturing a semiconductor device.
Figure 4B:
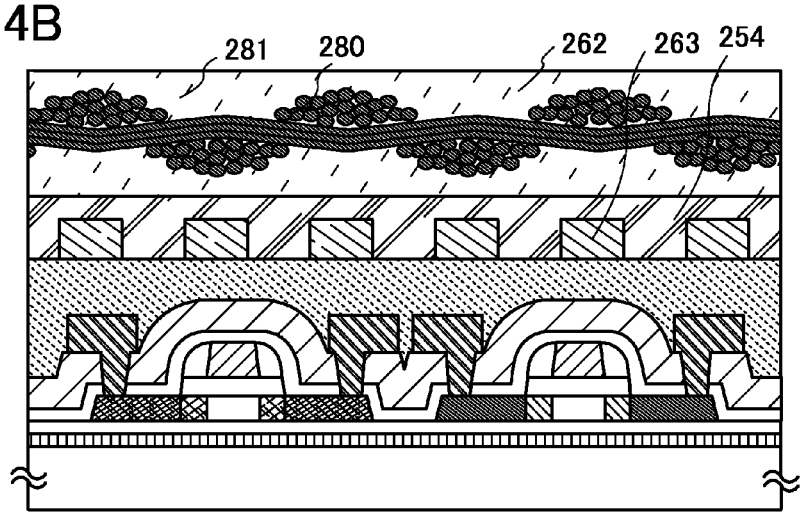
Figure 4C:
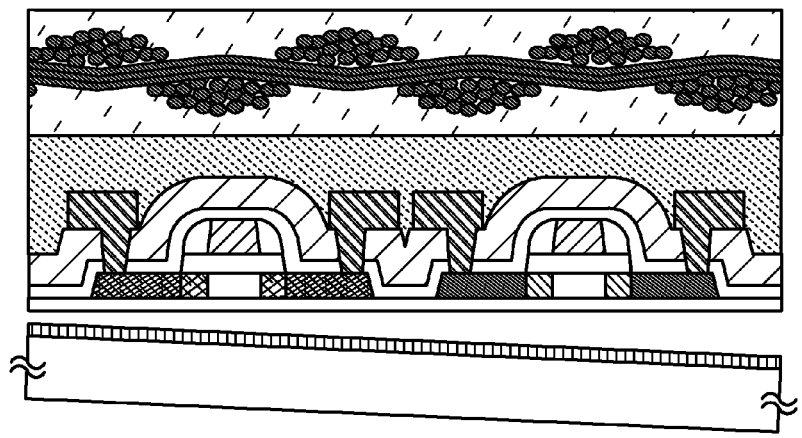

Transistors 210 and 211 and insulating films 212 and 213, and an insulating layer 214 are provided over a substrate 200 having an insulating surface which is a formation substrate with a separation layer 201 and an insulating film 202 functioning as a base film interposed therebetween, so that the semiconductor integrated circuit 250 is formed (see FIG. 4A).

The transistor 210 is a thin film transistor and includes source and drain regions 224a and 224b, impurity regions 223a and 223b whose concentrations are lower than those of the source and drain regions 224a and 224b, a channel formation region 226, a gate insulating layer 227, a gate electrode layer 228, and insulating layers 229a and 229b for forming a sidewall structure. The source and drain regions 224a and 224b are in contact with and electrically connected to wiring layers 230a and 230b respectively which function as source and drain electrode layers. In this embodiment, the transistor 210 is a p-channel thin film transistor and the source and drain regions 224a and 224b and the impurity regions 223a and 223b which are lightly doped drain (LDD) regions include impurity elements imparting p-type conductivity (e.g., boron (B), aluminum (Al), gallium (Ga), or the like).

The transistor 211 is a thin film transistor and includes source and drain regions 204a and 204b, impurity regions 203a and 203b whose concentrations are lower than those of the source and drain regions 204a and 204b, a channel formation region 206, a gate insulating layer 207, a gate electrode layer 208, and insulating layers 209a and 209b for forming a sidewall structure. The source and drain regions 204a and 204b are in contact with and electrically connected to wiring layers 210a and 210b respectively which function as source and drain electrode layers. In this embodiment, the transistor 211 is an n-channel thin film transistor and the source and drain regions 204a and 204b, and the impurity regions 203a and 203b which are LDD regions include impurity elements imparting n-type conductivity (e.g., phosphorus (P), arsenic (As), or the like).

Next a conductive layer 263 functioning as an antenna is formed over the insulating layer 214, and an inorganic insulating layer 254 is formed as a protective layer over the conductive layer 263. In this embodiment, a silicon nitride film is formed as the inorganic insulating layer 254. The conductive layer 263 is electrically connected to a semiconductor integrated circuit 250.

As a first insulator 262, a structure body in which a fibrous body 280 is impregnated with an organic resin 281 is used. The inorganic insulating layer 254, the conductive layer 263, the semiconductor integrated circuit 250, and the first insulator 262 are bonded, and the inorganic insulating layer 254, the conductive layer 263, and the semiconductor integrated circuit 250 are separated from the substrate 200 by using the separation layer 201. Therefore, the semiconductor integrated circuit 250 is provided on the first insulator 262 side (see FIGS. 4B and 4C).

Similarly to the first insulator 262, a structure body in which a fibrous body 270 is impregnated with an organic resin 271 is used for a second insulator 252.

Figure 5A:
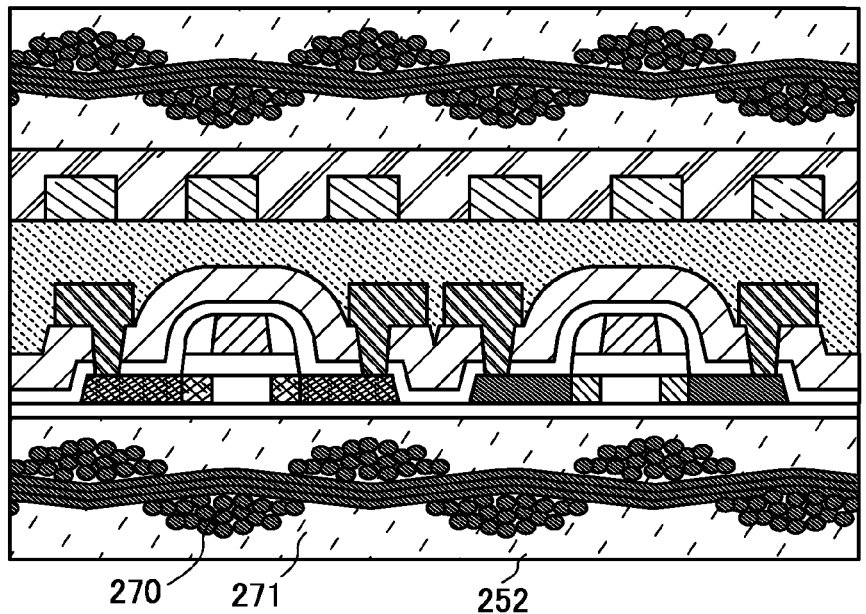
FIGS. 5A and 5B are diagrams illustrating the method for manufacturing the semiconductor device.

The structure body is heated and subjected to pressure bonding, whereby the second insulator 252 is bonded to the separation surface where the semiconductor integrated circuit 250 is exposed, and the inorganic insulating layer 254, the conductive layer 263, and the semiconductor integrated circuit 250 are sandwiched between the first insulator 262 and the second insulator 252 (see FIG. 5A).

Although not illustrated, a plurality of semiconductor integrated circuits is sandwiched between the first insulator 262 and the second insulator 252, and then the semiconductor integrated circuits 250 are individually divided, whereby semiconductor integrated circuit chips are formed. There is no particular limitation on a separation means as long as physical separation is possible, and separation is performed by laser beam irradiation in this embodiment.

By separation, the conductive layer 263 and the semiconductor integrated circuit 250 are sealed by the first insulator 262 and the second insulator 252, and divided surfaces (side surfaces generated by separation) are formed on the chips.

Figure 5B:
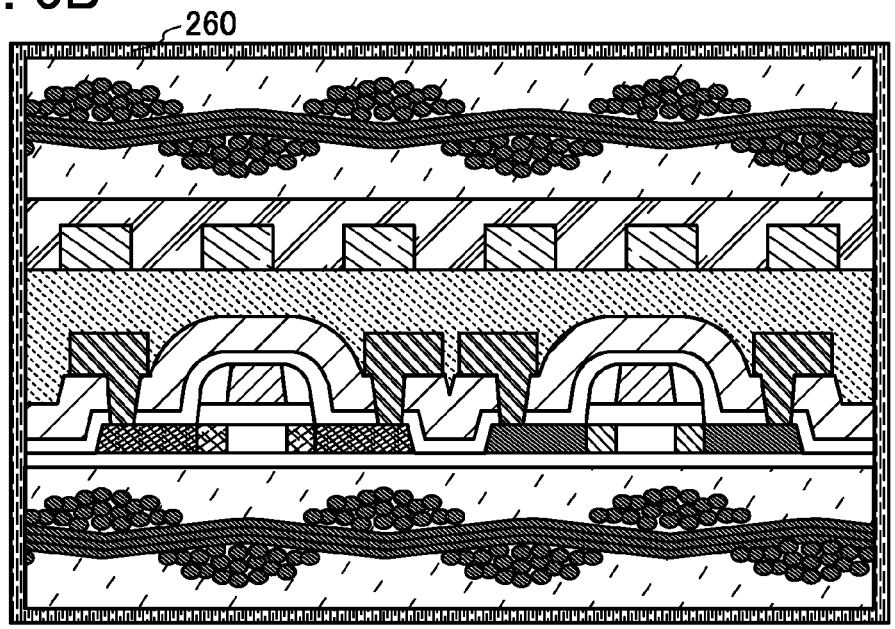

A conductive shield 260 is formed by a wet plating method so as to cover a stack in which the first insulator 262, the conductive layer 263, the semiconductor integrated circuit 250, and the second insulator 252 are stacked (see FIG. 5B).

The conductive shield 260 may be formed on all the side surfaces to surround (wrap) the periphery of the semiconductor device or may be formed to cover part of the side surfaces (divided surfaces). The conductive shield 260 formed on an outer side of the first insulator 262 is electrically connected to the conductive shield 260 formed on an outer side of the second insulator 252 in an embodiment of the present invention. In this embodiment, the conductive shield 260 is formed in the same plating process on the outer sides of the first insulator 262 and the second insulator 252, and is a continuous film.

By a plating method, a region that can be treated at a time can be large, productivity can be improved, and cost for a process can be reduced to achieve low cost. Therefore, when the conductive shield is formed by using a plating method, a semiconductor device of an embodiment of the present invention can be formed with high productivity at low cost. Lower cost of a process allows a semiconductor device to be provided at lower cost.

Accordingly, the conductive layer 263 and the semiconductor integrated circuit 250 are sealed by the first insulator 262 and the second insulator 252, and are protected against electrostatic discharge by using the conductive shield 260 provided on the outer sides of the first insulator 262 and the second insulator 252 which correspond to the surface and back surface of the semiconductor device and on the cut surface.

The conductive shield 260 transmits an electromagnetic wave that the conductive layer 263 which is an antenna included in the semiconductor device should send and receive, and external static electricity is prevented from being applied to the semiconductor integrated circuit 250 in the semiconductor device. The conductive shield 260 diffuses and dissipates static electricity applied by electrostatic discharge or prevents local existence (localization) of charge (not to generate local potential difference); therefore, electrostatic breakdown of the semiconductor integrated circuit 250 can be prevented.

Since the insulator and the conductive shield between which the semiconductor integrated circuit is sandwiched are provided, an adverse effect such as damage or deterioration of characteristics of the semiconductor integrated circuit due to the external stress or an electrostatic discharge can be prevented even in a manufacturing process. Accordingly, a semiconductor device can be formed with high yield.

The semiconductor device which is formed in this embodiment can be used as a flexible semiconductor device by using a flexible insulator.

As a material for forming the semiconductor layer of the transistors 210 and 211, an amorphous semiconductor (hereinafter also referred to as AS) manufactured using a semiconductor material gas typified by silane or germane by a vapor deposition method or a sputtering method, a polycrystalline semiconductor formed by crystallizing the amorphous semiconductor by utilizing light energy or thermal energy, a microcrystalline (also referred to as semiamorphous or microcrystal) semiconductor (hereinafter also referred to as SAS), or the like can be used. The semiconductor layer can be formed by a sputtering method, an LPCVD method, a plasma CVD method, or the like.

The microcrystalline semiconductor film has a metastable state of an intermediate between an amorphous structure and a single crystal structure when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. The semiconductor includes hydrogen or halogen of at least 1 at. % to terminate dangling bonds. Moreover, a noble gas element such as helium, argon, krypton, or neon may be included to further promote lattice distortion, so that stability is enhanced and a favorable microcrystalline semiconductor film can be obtained.

The microcrystalline semiconductor film can be formed by a high-frequency plasma CVD method with a frequency of several tens to several hundreds of megahertz or a microwave plasma CVD apparatus with a frequency of greater than or equal to 1 GHz. The microcrystalline semiconductor film can be typically formed using a dilution of silicon hydride or the like such as $SiH_4$, $Si_2H_6$, $SiH_2Cl_2$, $SiHCl_3$, $SiCl_4$, or $SiF_4$ with hydrogen. With a dilution with one or plural kinds of noble gas elements of helium, argon, krypton, and neon in addition to silicon hydride or the like and hydrogen, the microcrystalline semiconductor film can be formed. In that case, the flow rate ratio of hydrogen to silicon hydride or the like is set to be 5:1 to 200:1, preferably 50:1 to 150:1, more preferably 100:1.

Hydrogenated amorphous silicon can be typically given as the amorphous semiconductor, while a polysilicon and the like can be typically given as a crystalline semiconductor. Examples of polysilicon (polycrystalline silicon) include so-called high-temperature polysilicon that contains polysilicon formed at a process temperature greater than or equal to 800° C. as its main component, so-called low-temperature polysilicon formed at a process temperature less than or equal to 600° C. that contains polysilicon as its main component, polysilicon obtained by crystallizing amorphous silicon by using an element that promotes crystallization, and the like. Naturally, as described above, a microcrystalline semiconductor, or a semiconductor which includes a crystalline phase in a portion of a semiconductor layer can be used.

As a material of the semiconductor, as well as elementary substance of silicon (Si), germanium (Ge), or the like, a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor formed of any of the above oxide semiconductors, or the like may be used. For example, an oxide semiconductor formed of ZnO, indium oxide, and gallium oxide may be used. In the case of using ZnO for the semiconductor layer, a gate insulating layer is preferably formed using $Y_2O_3$, $Al_2O_3$, $TiO_2$, or a stack of any of the above. For the gate electrode layer, the source electrode layer, and the drain electrode layer, ITO, Au, Ti, or the like is preferably used. Alternatively, ZnO to which In, Ga, or the like is added may be used.

In the case of using a crystalline semiconductor layer for the semiconductor layer, the crystalline semiconductor layer may be formed by various methods (such as a laser crystallization method, a thermal crystallization method, or a thermal crystallization method using an element which promotes crystallization, such as nickel). Also, a microcrystalline semiconductor, which is an SAS, can be crystallized by laser irradiation to increase its crystallinity. In the case where the element which promotes crystallization is not used, before the amorphous silicon film is irradiated with a laser beam, the amorphous silicon film is heated at 500° C. for one hour in a nitrogen atmosphere to discharge hydrogen so that the hydrogen concentration in the amorphous silicon film becomes less than or equal to $1 \times 10^{20}$ atoms/cm$^3$. This is because the amorphous silicon film is destroyed when the amorphous silicon film containing a high amount of hydrogen is irradiated with a laser beam.

The crystallization may be performed by adding an element which promotes crystallization (also referred to as a catalyst element or a metal element) to an amorphous semiconductor layer and performing a heat treatment (at 550° C. to 750° C. for 3 minutes to 24 hours) in a crystallization step in which the amorphous semiconductor layer is crystallized to form a crystalline semiconductor layer. The element which promotes the crystallization can be one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au).

A technique for introducing a metal element into an amorphous semiconductor layer is not particularly limited as long as it is a technique capable of providing the metal element on a surface or inside of the amorphous semiconductor layer. For example, a sputtering method, a CVD method, a plasma processing method (including a plasma CVD method), an adsorption method, or a method for coating a solution of metal salt, can be used. In the above processes, the method using a solution is convenient and has an advantage of easily adjusting the concentration of a metal element. In addition, in order to improve the wettability of the surface of the amorphous semiconductor layer to spread an aqueous solution on the entire surface of the amorphous semiconductor layer, an oxide film is preferably formed by UV light irradiation in an oxygen atmosphere, thermal oxidation, treatment using ozone water containing hydroxy radical or hydrogen peroxide solution, or the like.

In order to remove or reduce the element that promotes crystallization from the crystalline semiconductor layer, a semiconductor layer containing an impurity element is formed in contact with the crystalline semiconductor layer and used as a gettering sink. The impurity element may be an impurity element imparting n-type conductivity, an impurity element imparting p-type conductivity, a noble gas element, or the like. For example, one or plural elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a noble gas element is formed over the crystalline semiconductor layer containing an element which promotes crystallization, and heat treatment (at 550° C. to 750° C. for 3 minutes to 24 hours) is performed. The element which promotes crystallization in the crystalline semiconductor layer moves into the semiconductor layer containing a noble gas element, and the element which promotes crystallization in the crystalline semiconductor layer is removed or reduced. Then, the semiconductor layer containing a noble gas element, which serves as a gettering sink, is removed.

The amorphous semiconductor layer may be crystallized by using a combination of heat treatment and laser irradiation treatment. The heat treatment or the laser irradiation treatment may be carried out several times, separately.

Also, a crystalline semiconductor layer may be formed over a substrate directly by a plasma method. Alternatively, the crystalline semiconductor layer may be selectively formed over a substrate by using a plasma method.

The gate insulating layers 207 and 227 may be formed using silicon oxide, or may be formed with a stacked structure of silicon oxide and silicon nitride. The gate insulating layers 207 and 227 may be formed by depositing an insulating film by a plasma CVD method or a low pressure CVD method or may be formed by solid-phase oxidation or solid-phase nitridation by plasma treatment. This is because a gate insulating layer formed by oxidizing or nitriding a single crystal semiconductor layer by plasma treatment is dense, has high withstand voltage, and is highly reliable. For example, the surface of the semiconductor layer is oxidized or nitrided using nitrous oxide ($N_2O$) diluted with Ar by 1 to 3 times (flow ratio) by application of a microwave (2.45 GHz) power of 3 kW to 5 kW at a pressure of 10 Pa to 30 Pa. By this process, an insulating film of 1 nm to 10 nm (preferably, 2 nm to 6 nm) thick is formed. Further, nitrous oxide ($N_2O$) and silane ($SiH_4$) are introduced, and a silicon oxynitride film is formed by a vapor deposition method by application of a microwave (2.45 GHz) power of 3 kW to 5 kW at a pressure of 10 Pa to 30 Pa; accordingly, the gate insulating layer is formed. The combination of the solid-phase reaction and the reaction by the vapor deposition method can form a gate insulating layer with a low interface state density and an excellent withstand voltage.

As the gate insulating layers 207 and 227, a high dielectric constant material such as zirconium dioxide, hafnium oxide, titanium dioxide, or tantalum pentoxide may be used. When a high dielectric constant material is used for the gate insulating layers 207 and 227, gate leakage current can be reduced.

The gate electrode layers 208 and 228 can be formed using a CVD method, a sputtering method, a droplet discharging method, and the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, and Ba; or an alloy material or a compound material containing any of the elements as its main component. Alternatively, a semiconductor film typified by a polycrystalline silicon film doped with an impurity element such as phosphorus, or an AgPdCu alloy may be used. Further, either a single-layer structure or a multi-layer structure may be used; for example, a two-layer structure of a tungsten nitride film and a molybdenum film may be used or a three-layer structure in which a tungsten film with a thickness of 50 nm, a film of an aluminum-silicon (Al—Si) alloy film with a thickness of 500 nm, and a titanium nitride film with a thickness of 30 nm are stacked in this order may be used. In the case of the three-layer structure, a tungsten nitride film may be used instead of the tungsten film as the first conductive film, an aluminum-titanium (Al—Ti) alloy film may be used instead of the aluminum-silicon (Al—Si) alloy film as the second conductive film, and a titanium film may be used instead of the titanium nitride film as the third conductive film.

A light-transmitting material which transmits visible light can also be used for the gate electrode layers 208 and 228. As the light-transmitting conductive material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

If etching processing is required to form the gate electrode layers 208 and 228, a mask may be formed and dry etching or wet etching may be performed. The electrode layers can be etched into tapered shapes by an inductively coupled plasma (ICP) etching method with the etching condition (the amount of electric power applied to a coiled electrode, the amount of electric power applied to an electrode on a substrate side, the temperature of the electrode on the substrate side, or the like) appropriately adjusted. Note that a gas including chlorine typified by $Cl_2$, $BCl_3$, $SiCl_4$, and $CCl_4$; a gas including fluorine typified by $CF_4$, $SF_6$, and $NF_3$; or $O_2$ can be appropriately used for the etching gas.

The insulating layers 209a, 209b, 229a, and 229b for forming a sidewall structure may be formed in a self-aligning manner by forming an insulating layer, which covers the gate electrode layers and the semiconductor layers, and processing the insulating layer by anisotropic etching using a reactive ion etching (RIE) method. Here, the insulating layer is not particularly limited, but is preferably formed using silicon oxide which is formed by reacting tetraethyl orthosilicate (TEOS), silane, or the like and oxygen, nitrous oxide, or the like and has favorable step coverage. The insulating layer can be formed by a thermal CVD method, a plasma CVD method, an atmospheric pressure CVD method, a bias ECRCVD method, a sputtering method, or the like.

Although a single gate structure is described in this embodiment, a multi-gate structure such as a double-gate structure may also be used. In this case, gate electrode layers may be provided above and below the semiconductor layer or a plurality of gate electrode layers may be provided only on one side (above or below) of the semiconductor layer.

Alternatively, silicides may be provided in the source and drain regions of the transistor. The silicides are formed by forming conductive films on the source and drain regions of the semiconductor layer and making silicon in the semiconductor layer in the source and drain regions of the semiconductor layer which used to be exposed and the conductive film react by heat treatment, a GRTA method, an LRTA method, or the like. Alternatively, a silicide may be formed by light irradiation using laser irradiation or a lamp. As a material of the conductive film used for forming a silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like.

The wiring layers 210a, 210b, 230a, and 230b which function as source electrode layers and drain electrode layers can be formed by depositing a conductive film by a PVD method, a CVD method, an evaporation method, or the like, and then etching the conductive film into desired shapes. Alternatively, the wiring layers can be formed selectively at a predetermined place by a printing method, an electroplating method, or the like. Further, a reflow method or a damascene method may be used as well. As a material of the wiring layers 210a, 210b, 230a, and 230b, metal such as Ag, Au, Cu, Ni, Pt, Pd, Ir, Rh, W, Al, Ta, Mo, Cd, Zn, Fe, Ti, Zr, or Ba; or a semiconductor such as Si or Ge or an alloy thereof, or nitride thereof may be used. Further, a light-transmitting material can also be used.

As the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like can be used.

For each of the insulating films 212 and 213 and the insulating layer 214, an inorganic insulating material such as silicon oxide, silicon nitride, silicon oxynitride, aluminum oxide, aluminum nitride, or aluminum oxynitride can be used.

With the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield.

The semiconductor device according to an embodiment of the present invention can be applied to a storage element or the like using a semiconductor layer as well as a field effect transistor, as a semiconductor element, so that semiconductor devices having functions necessary for a variety of uses can be manufactured and provided.

Note that this embodiment can be implemented in combination with any of Embodiments 1 to 5, as appropriate.

Embodiment 7

In this embodiment, an example of a semiconductor device having a memory will be described as a semiconductor device with high reliability and a manufacturing method thereof, with reference to FIGS. 6A to 6E, FIGS. 7A to 7C, and FIGS. 8A and 8B.

A semiconductor device of this embodiment includes a memory including a memory cell array and a driver circuit portion which drives the memory cell array.

A separation layer 301 is formed over a substrate 300 which is a formation substrate having an insulating surface, and an insulating film 302 functioning as a base film is formed over the separation layer 301.

Then, a semiconductor film is formed over the insulating film 302. The semiconductor film may be formed by a sputtering method, an LPCVD method, a plasma CVD method or the like to be 25 nm to 200 nm thick (preferably, 30 nm to 150 nm thick).

In this embodiment, an amorphous semiconductor film is formed over the insulating film 302, and the amorphous semiconductor film is crystallized by laser irradiation; accordingly, a semiconductor film that is a crystalline semiconductor film is formed.

The semiconductor film obtained as described above may be selectively doped with the slight amount of impurity elements (boron or phosphorus) for controlling threshold voltage of a thin film transistor. This doping of impurity elements may be performed against the amorphous semiconductor film before crystallization. When the amorphous semiconductor film is doped with impurity elements, the impurities can be activated by heat treatment for crystallization later. Further, a defect and the like generated at the doping can be improved as well.

Next, the semiconductor film is shaped into a desired shape using a mask. In this embodiment, after an oxide film formed on the semiconductor film is removed, another oxide film is formed. Then, a photomask is formed, and semiconductor layers 303, 304, 305, and 306 are formed by processing using a photolithography method. For end portions of the semiconductor layers, inclination angles (taper angles) may be provided.

The etching may be carried out by either plasma etching (dry etching) or wet etching. For treating a large-sized substrate, plasma etching is suitable. As an etching gas, a gas containing fluorine or chlorine such as $CF_4$, $NF_3$, $Cl_2$, or $BCl_3$ is used, and an inert gas such as He or Ar may be added thereto, as appropriate. If the etching is carried out utilizing atmospheric pressure discharge, electric discharge processing can be carried out locally, and a mask does not need to be formed over the entire surface of the substrate.

An insulating film 310 is formed over the semiconductor layer 305. The insulating film 310 may be formed using silicon oxide or a stacked structure of silicon oxide and silicon nitride. The insulating film 310 may be formed by depositing the insulating layer by a plasma CVD method or a low pressure CVD method; however, the insulating film 310 is preferably formed by being subjected to solid-phase oxidation or solid-phase nitridation by plasma treatment. This is because an insulating layer which is formed through oxidation or nitridation of the semiconductor layer (typically, a silicon layer) by plasma treatment has a dense film quality, high withstand voltage, and high reliability. The insulating film 310 is used as a tunnel insulating layer for injecting charges into a charge accumulating layer 311; therefore, a strong insulating layer is preferable. The insulating film 310 is preferably formed with a thickness of 1 nm to 20 nm, and preferably 3 nm to 6 nm.

The insulating film 310 is preferably formed by plasma treatment in such a way that, for example, a silicon oxide layer is formed with a thickness of 3 nm to 6 nm on the semiconductor layer by plasma treatment under an oxygen atmosphere, and a nitrogen-plasma-treated layer is formed by treating the surface of the silicon oxide layer with nitrogen plasma under a nitrogen atmosphere. Specifically, first, a silicon oxide layer with a thickness of 3 nm to 6 nm is formed on the semiconductor layer by plasma treatment under an oxygen atmosphere. Subsequently, a nitrogen plasma treated layer with a high concentration of nitrogen is formed over the surface or near the surface of the silicon oxide layer by performance of plasma treatment under a nitrogen atmosphere successively. Note that "near the surface" refers to a depth of approximately 0.5 nm to 1.5 nm from a surface of a silicon oxide layer. For example, by conducting plasma treatment under a nitrogen atmosphere, a structure is obtained in which the silicon oxide layer contains 20 atomic % to 50 atomic % nitrogen in a region from the surface to a depth of about 1 nm.

A surface of a silicon layer as a typical example of the semiconductor layer is oxidized by plasma treatment, whereby a dense oxide layer that has no distortion in an interface can be formed. In addition, through nitridation by plasma treatment of the oxide layer, oxygen on a portion of a surface is replaced with nitrogen and a nitride layer is formed, whereby the layer can be made even denser. Consequently, an insulating layer which has high withstand voltage can be formed.

In any event, through use of the aforementioned solid-phase oxidation or solid-phase nitridation by plasma treatment, even if a glass substrate with a heat resistance temperature of less than or equal to 700° C. is used, an insulating layer equal to a thermal oxidation film that is formed at a temperature of from 950° C. to 1050° C. can be obtained. That is, a tunnel insulating layer having high reliability can be formed as the tunnel insulating layer of a nonvolatile memory element.

The charge accumulation layer 311 is formed over the insulating film 310. The charge accumulation layer 311 may be provided as either a single layer or stacked layers.

The charge accumulation layer 311 can be a floating gate formed of a layer or particles of a semiconductor material or a conductive material. As the semiconductor material, silicon, silicon germanium, and the like can be given. When silicon is used, amorphous silicon or polysilicon can be used. Further, polysilicon doped with phosphorus can also be used. As the conductive material, an element selected from tantalum (Ta), titanium (Ti), molybdenum (Mo), or tungsten (W); an alloy containing the above element as its main component; an alloy film in which the above elements are combined (typically, an Mo—W alloy film or an Mo—Ta alloy film); or a silicon film provided with conductivity may be used. Under the conductive layer formed of such a material, nitride such as tantalum nitride, tungsten nitride, titanium nitride, or molybdenum nitride; or silicide such as tungsten silicide, titanium silicide, or molybdenum silicide may be formed. Furthermore, a stacked structure of the above semiconductor materials, conductive materials, or the semiconductor material and the conductive material may be employed. For example, a stacked structure of a silicon layer and a germanium layer may be employed.

Alternatively, the charge accumulation layer 311 can be formed as an insulating layer having a trap that holds charges. As a typical example of such a material, a silicon compound and a germanium compound are given. As the silicon compound, silicon nitride, silicon oxynitride, silicon oxynitride to which hydrogen is added, and the like can be given. As examples of the germanium compound, germanium nitride, germanium nitride to which oxygen is added, germanium oxide to which nitrogen is added, germanium nitride to which oxygen and hydrogen are added, germanium oxide to which nitrogen and hydrogen are added, and the like can be given.

Next, masks which cover the semiconductor layers 303, 304, and 306 are formed. Using the masks and the charge accumulation layer 311 as masks, an impurity element imparting n-type conductivity is added to form n-type impurity regions 362a and 362b. In this embodiment, phosphorus (P), which is an impurity element imparting n-type conductivity, is used as the impurity element. Here, doping is performed so that the n-type impurity regions 362a and 362b each contain the impurity element imparting n-type conductivity at a concentration of about $1\times10^{17}$ atoms/cm$^3$ to $5\times10^{18}$ atoms/cm$^3$. The masks which cover the semiconductor layers 303, 304, and 306 are removed.

An oxide film over the semiconductor layer 306 is removed, and a gate insulating layer 309 which covers the semiconductor layers 305 and 306, the insulating film 310, and the charge accumulation layer 311 is formed. When the gate insulating layer 309 is thick in the memory cell array, the thin film transistor and the memory element can have high tolerance to high voltage; accordingly reliability can be enhanced.

Note that although the gate insulating layer 309 formed over the semiconductor layer 305 functions as a control insulating layer of a memory element which is completed later, the gate insulating layer 309 formed over the semiconductor layer 306 functions as a gate insulating layer of the thin film transistor. Therefore, the layer is called the gate insulating layer 309 in this specification.

The oxide film over the semiconductor layers 303 and 304 is removed, and then a gate insulating layer 308, which covers the semiconductor layers 303 and 304, is formed (see FIG. 6A). The gate insulating layer 308 can be formed using a plasma CVD method, a sputtering method, or the like. The thickness of the gate insulating layer 308 included in the thin film transistor, which is provided in the driver circuit portion, is preferably greater than or equal to 1 nm and less than or equal to 10 nm, and more preferably, about 5 nm. Thinning of the gate insulating layer 308 has an effect of driving the transistor in the driver circuit portion at high speed and low voltage.

The gate insulating layer 308 may be formed using silicon oxide or a stacked structure of silicon oxide and silicon nitride. The gate insulating layer 308 may be formed by depositing an insulating film by a plasma CVD method or a low pressure CVD method or may be formed by solid-phase oxidation or solid-phase nitridation by plasma treatment. This is because a gate insulating layer formed by oxidizing or nitriding a semiconductor layer by plasma treatment is dense, and has high withstand voltage and excellent reliability.

As the gate insulating layer 308, a high dielectric constant material may be used. When a high dielectric constant material is used for the gate insulating layer 308, gate leakage current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

Further, a thin silicon oxide film can also be formed by oxidizing the surface of the semiconductor region by a GRTA method, an LRTA method, or the like, thereby forming a thermal oxide film. Accordingly, a thin silicon oxide film may be formed. Note that a noble gas element such as argon is preferably included in a reactive gas and is preferably mixed in the insulating film to be formed in order to form a dense insulating film with few gate leakage current at a low film-formation temperature.

Then, a first conductive film having a thickness of 20 nm to 100 nm and a second conductive film having a thickness of 100 nm to 400 nm, each of which serves as a gate electrode layer, are stacked over the gate insulating layers 308 and 309. The first and second conductive films can be formed by a sputtering method, an evaporation method, a CVD method, or the like. The first and second conductive films may be formed using an element selected from tantalum (Ta), tungsten (W), titanium (Ti), molybdenum (Mo), aluminum (Al), copper (Cu), chromium (Cr), and neodymium (Nd), or an alloy or compound material containing the above material as its main component. Alternatively, the first and second conductive films may be formed using a semiconductor film typified by a polycrystalline silicon film doped with an impurity element such as phosphorus, or an AgPdCu alloy film. The conductive film is not limited to the two-layer structure, and, for example, may have a three-layer structure in which a tungsten film with a thickness of 50 nm, an aluminum and silicon (Al—Si) alloy film with a thickness of 500 nm, and a titanium nitride film with a thickness of 30 nm are sequentially stacked. In the case of the three-layer structure, a tungsten nitride film may be used instead of the tungsten film as the first conductive film, an aluminum-titanium (Al—Ti) alloy film may be used instead of the aluminum-silicon (Al—Si) alloy film as the second conductive film, and a titanium film may be used instead of the titanium nitride film as the third conductive film. Alternatively, a single-layer structure may be adopted as well. In this embodiment, tantalum nitride is formed to have a thickness of 30 nm for the first conductive film, and tungsten (W) is formed to have a thickness of 370 nm for the second conductive film.

The first and second conductive films are etched to form first gate electrode layers 312, 313, and 314, second gate electrode layers 316, 317, and 318, a first control gate electrode layer 315, and a second control gate electrode layer 319 (see FIG. 6B).

In this embodiment, an example is illustrated in which the first gate electrode layer and the second gate electrode layer (the first control gate electrode layer and the second control gate electrode layer) are formed to have perpendicular side surfaces; however, an embodiment of the present invention is not limited to this. Both the first gate electrode layer and the second gate electrode layer (the first control gate electrode layer and the second control gate electrode layer) may have tapered shapes, or one of the first gate electrode layer or the second gate electrode layer (the first control gate electrode layer or the second control gate electrode layer) may have a tapered shape while the other may have a perpendicular side surface by anisotropic etching. The taper angles may be different or equal among the stacked gate electrode layers. With a tapered shape, coverage of a film to be stacked thereover is improved and a defect is reduced, which leads to improving reliability.

The gate insulating layers 308 and 309 may be etched to some extent and thinned (so-called film reduction) by the etching step in forming the gate electrode layers (and the control gate electrode layers).

Next, masks 321 and 363 which cover the semiconductor layers 304, 305 and 306 are formed. An impurity element 320 imparting p-type conductivity is added using the masks 321 and 363, the first gate electrode layer 312, and the second gate electrode layer 316 as masks to form p-type impurity regions 322a and 322b. In this embodiment, boron (B) is used as the impurity element. Here, doping is performed so that the p-type impurity regions 322a and 322b contain the impurity element imparting p-type conductivity at a concentration of about $1\times10^{20}$ atoms/cm$^3$ to about $5\times10^{21}$ atoms/cm$^3$. In addition, a channel formation region 323 is formed in the semiconductor layer 303 (see FIG. 6C).

The p-type impurity regions 322a and 322b are high-concentration p-type impurity regions and serve as a source region and a drain region.

Next, a mask 325, which covers the semiconductor layer 303, is formed. An n-type impurity element 324 is added using the mask 325, the first gate electrode layer 313, the second gate electrode layer 317, the first gate electrode layer 314, the second gate electrode layer 318, the first control gate electrode layer 315, and the second control gate electrode layer 319 as masks, so that n-type impurity regions 326a, 326b, 327a, 327b, 328a, and 328b are formed. In this embodiment, phosphorus (P) is used as the impurity element. Here, doping is performed so that each of the n-type impurity regions 326a, 326b, 327a, 327b, 328a and 328b contains the impurity element imparting n-type conductivity at a concentration of about $5×10^{19}$ atoms/cm$^3$ to about $5×10^{20}$ atoms/cm$^3$. A channel formation region 329, a channel formation region 330 and n-type impurity regions 364a, 364b, and a channel formation region 331 are formed in the semiconductor layer 304, the semiconductor layer 305, and the semiconductor layer 306, respectively (see FIG. 6D).

The n-type impurity regions 326a, 326b, 327a, 327b, 328a, and 328b are n-type high-concentration impurity regions and function as source regions and drain regions. On the other hand, the n-type impurity regions 364a and 364b are low-concentration impurity regions and function as LDD regions.

The mask 325 is removed by $O_2$ ashing or with a resist stripper, and an oxide film is also removed. After that, an insulating film, namely a sidewall may be formed so as to cover side surfaces of the gate electrode layers. The sidewall may be formed of an insulating film containing silicon by a plasma CVD method or a low pressure CVD (LPCVD) method.

In order to activate the impurity element, heat treatment, strong light irradiation, or laser beam irradiation may be performed. At the same time as the activation, a plasma damage to the gate insulating layer and to an interface between the gate insulating layer and the semiconductor layer can be repaired.

Subsequently, an interlayer insulating layer which covers the gate insulating layers and the gate electrode layers is formed. In this embodiment, a stacked structure of insulating films 367 and 368 is used. The insulating films 367 and 368 each may be a silicon nitride film, a silicon nitride oxide film, a silicon oxynitride film, or a silicon oxide film formed by a sputtering method or plasma CVD. Alternatively, another insulating film containing silicon may be employed to form a single-layer structure or a stacked structure including three or more layers.

Further, heat treatment is performed in a nitrogen atmosphere at 300° C. to 550° C. for 1 hour to 12 hours, whereby the semiconductor layer is hydrogenated. Preferably, this step is performed at 400° C. to 500° C. Through this step, dangling bonds in the semiconductor layer can be terminated by hydrogen contained in the insulating film 367 that is an interlayer insulating layer. In this embodiment, heat treatment is performed at 410° C. for one hour.

Each of the insulating film 367 and the insulating film 368 can be formed using a material selected from aluminum nitride (AlN), aluminum oxynitride (AlON), aluminum nitride oxide (AlNO) containing more nitrogen than oxygen, aluminum oxide, diamond-like carbon (DLC), nitrogen-containing carbon (CN), and other substance including an inorganic insulating material. In addition, a siloxane resin may also be used. The siloxane resin corresponds to a resin including Si—O—Si bonding.

Next, using a resist mask, contact holes (openings) that reach the semiconductor layers are formed in the insulating films 367 and 368, and the gate insulating layers 308 and 309. Etching may be performed once or a plurality of times according to a selection ratio of the materials which are used. Etching is performed to remove the insulating film 368, the insulating film 367, the gate insulating layers 308 and 309, so that the openings that reach the p-type impurity regions 322a and 322b, the n-type impurity region 326a, 326b, 327a, 327b, 328a, and 328b, which are source regions and drain regions, are formed. For the etching, wet etching, dry etching, or the both may be employed. A hydrofluoric acid-based solution such as a mixed solution of ammonium hydrogen fluoride and ammonium fluoride may be used as an etchant of wet etching. As an etching gas for dry etching, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used as appropriate. Further, an inert gas may be added to an etching gas. As an inert element to be added, one or plural elements selected from He, Ne, Ar, Kr, and Xe can be used.

A conductive film is formed so as to cover the openings, and the conductive film is etched to form wiring layers 369a, 369b, 370a, 370b, 371a, 371b, 372a, and 372b, which are source and drain electrode layers electrically connected to portions of respective source and drain regions. The wiring layers can be formed by forming the conductive film by a PVD method, a CVD method, an evaporation method, or the like, and then etching the conductive film into a desired shape. In addition, a conductive layer can be selectively formed in a predetermined position by a droplet discharge method, a printing method, an electrolytic plating method, or the like. Further, a reflow method or a damascene method may be used as well. As a material for the source electrode layer or the drain electrode layer, metal such as Ag, Au, Cu, Ni, Pt, Pd, Ir, Rh, W, Al, Ta, Mo, Cd, Zn, Fe, Ti, Zr, or Ba; or Si or Ge; an alloy or nitride thereof can be used. Further, a stacked structure of these may be used. In this embodiment, titanium (Ti) is formed to be 60 nm thick, a titanium nitride film is formed to be 40 nm thick, aluminum is formed to be 700 nm thick, and titanium (Ti) is formed to be 200 nm thick, and then the stacked film is processed into a desired shape.

Through the above steps, a semiconductor integrated circuit 350 can be manufactured, in which a p-channel thin film transistor 373 having a p-type impurity region and an n-channel thin film transistor 374 having an n-type impurity region are provided in the driver circuit portion; and a memory element 375 having an n-type impurity region and an n-channel thin film transistor 376 having an n-type impurity region are provided in the memory cell array (see FIG. 6E).

Figures 7A, 7B, 7C:
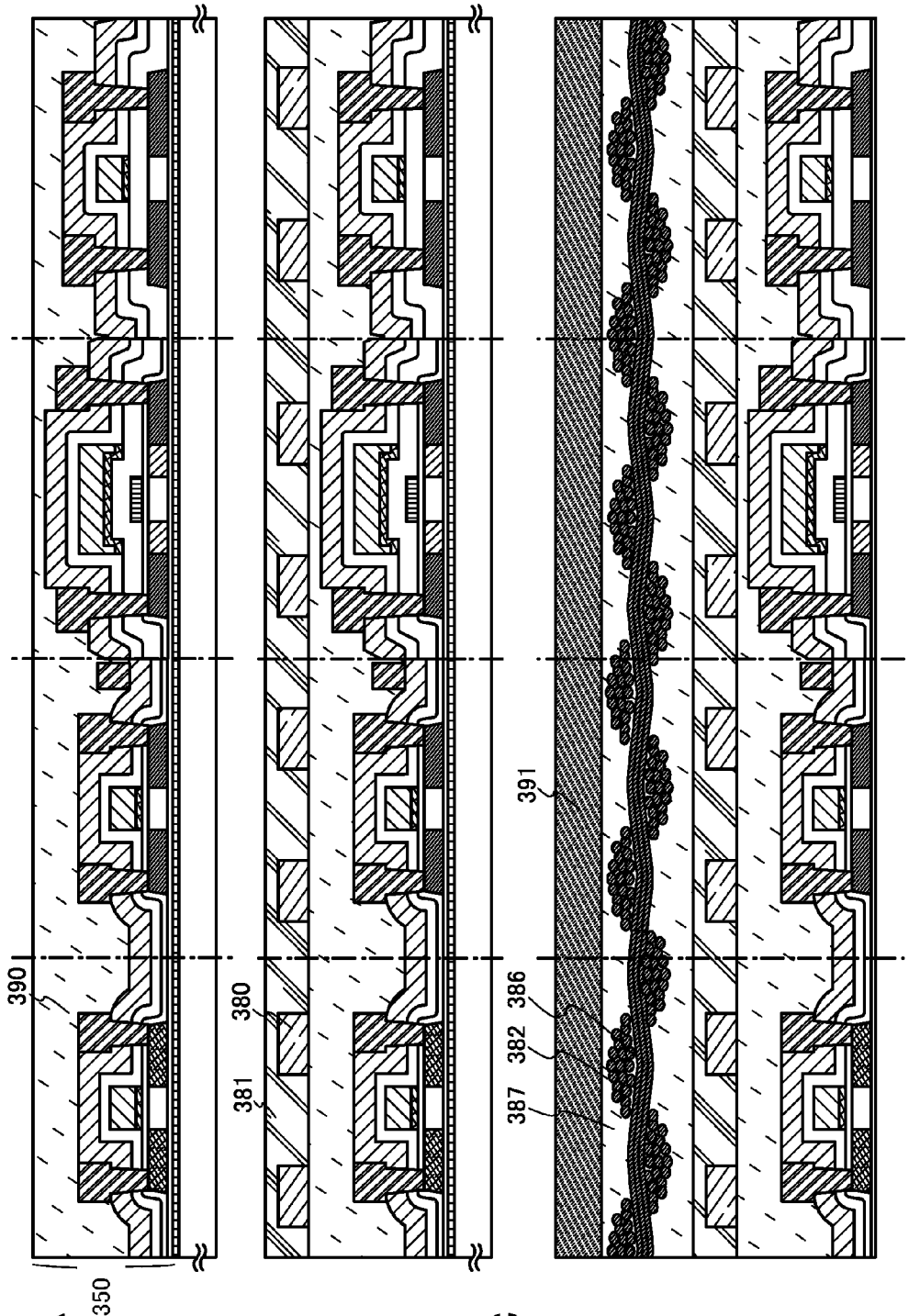
FIGS. 7A to 7C are diagrams illustrating the method for manufacturing the semiconductor device.
Figure 9A:
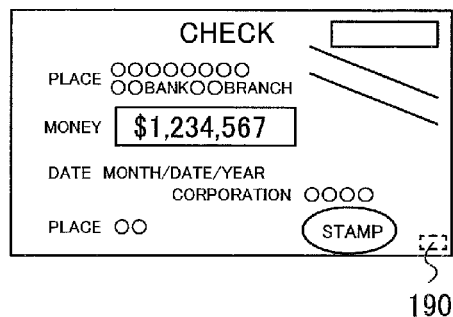
FIGS. 9A to 9G are diagrams illustrating application examples of a semiconductor device.
Figure 9B:
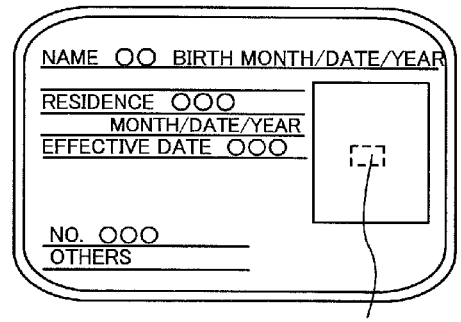
Figure 9C:
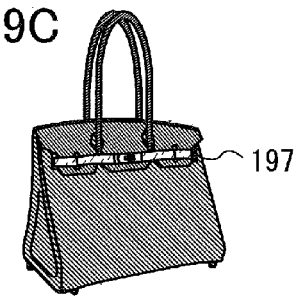
Figure 9D:
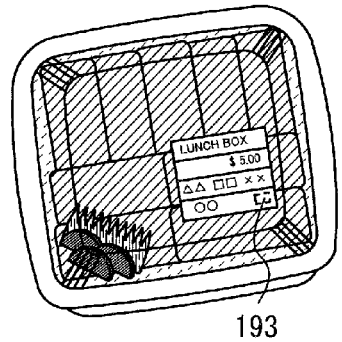
Figure 9E:
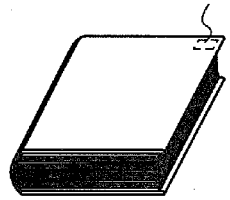
Figure 9F:
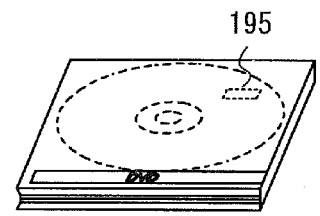
Figure 9G:
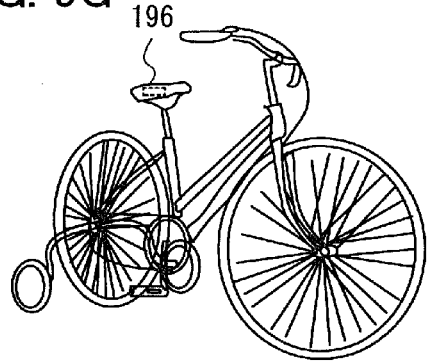

In this embodiment, the semiconductor integrated circuit 350 is provided with an insulating layer 390 (see FIG. 7A). Next, a conductive layer 380 functioning as an antenna is formed over the insulating layer 390, and an inorganic insulating layer 381 is formed as a protective layer over the conductive layer 380 (see FIG. 7B).

A structure body in which a fibrous body 386 is impregnated with an organic resin 387 is used as a first insulator 382. The structure body is heated and subjected to pressure bonding, and the semiconductor integrated circuit 350, the first insulator 382, and a fourth insulator 391 are bonded. The separation layer 301 is used, and the semiconductor integrated circuit 350 is separated from the substrate 300. Accordingly, the semiconductor integrated circuit 350 is provided on the first insulator 382 side (see FIG. 7C).

Similarly to the first insulator 382, a structure body in which the fibrous body 386 is impregnated with the organic resin 387 is used for a second insulator 385. The structure body is heated and subjected to pressure bonding, so that a third insulator 388 and the second insulator 385 are bonded to each other. A bonding layer 389 is provided on one surface of the third insulator 388 that is bonded to the semiconductor integrated circuit 350, on which the second insulator 385 is not provided.

The bonding layer 389 is bonded to the separation surface where the semiconductor integrated circuit 350 is exposed, and the semiconductor integrated circuit 350 is sandwiched by the fourth insulator 391, the first insulator 382, and the third insulator 388 and the second insulator 385 (see FIG. 8A).

Although not illustrated, a plurality of semiconductor integrated circuits is sandwiched between the first insulator 382 and the second insulator 385, and then the semiconductor integrated circuits 350 are individually divided, whereby semiconductor integrated circuit chips are formed. There is no particular limitation on a separation means as long as physical separation is possible, and separation is performed by laser beam irradiation in this embodiment. By separation, the conductive layer 380 and the semiconductor integrated circuit 350 are sealed by the first insulator 382 and the second insulator 385 and divided surfaces (side surfaces to be generated by separation) are generated for the chips.

A conductive shield 395 is formed by a wet plating method so as to cover a stack in which the first insulator 382, the conductive layer 380, the semiconductor integrated circuit 350, and the second insulator 385 are stacked (see FIG. 8B).

The conductive shield 395 may be formed on all the side surfaces to surround (wrap) the periphery of the semiconductor device or may be formed to cover part of the side surfaces (divided surfaces). The conductive shield 395 formed on an outer side of the first insulator 382 is electrically connected to the conductive shield 395 formed on an outer side of the second insulator 385 in an embodiment of the present invention. In this embodiment, the conductive shield 395 is formed in the same plating process on the outer sides of the first insulator 382 and the second insulator 385, and is a continuous film.

By a plating method, a region that can be treated at a time can be large, productivity can be improved, and cost for a process can be reduced to achieve low cost. Therefore, when the conductive shield is formed by using a plating method, a semiconductor device of an embodiment of the present invention can be formed with high productivity at low cost. Lower cost of a process allows a semiconductor device to be provided at lower cost.

Accordingly, the conductive layer 380 and the semiconductor integrated circuit 350 are sealed by the first insulator 382 and the second insulator 385, and are protected against electrostatic discharge by using the conductive shield 395 provided on the outer sides of the first insulator 382 and the second insulator 385 which correspond to the surface and back surface of the semiconductor device and on the side surfaces.

The semiconductor device which is formed in this embodiment can be used as a flexible semiconductor device by using flexible insulators.

The conductive shield 395 transmits an electromagnetic wave that the conductive layer 380 which is an antenna included in the semiconductor device should send and receive, and external static electricity is prevented from being applied to the semiconductor integrated circuit 350 in the semiconductor device. The conductive shield 395 diffuses and dissipates static electricity applied by electrostatic discharge or prevents local existence (localization) of charge (not to generate local potential difference); therefore, electrostatic breakdown of the semiconductor integrated circuit 350 can be prevented.

Since the insulator and the conductive shield between which the semiconductor integrated circuit is sandwiched are provided, an adverse effect such as damage or deterioration of characteristics of the semiconductor integrated circuit due to the external stress or an electrostatic discharge can be prevented even in a manufacturing process. Accordingly, a semiconductor device can be formed with high yield.

With the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield. In addition, a semiconductor device can be formed with high productivity at low cost because a plating method is used for the formation of the conductive shield.

Note that this embodiment can be implemented in combination with any of Embodiments 1 to 6, as appropriate.

Embodiment 8

In this embodiment, an example of a semiconductor device having higher reliability will be described. Specifically, as examples of the semiconductor device, examples of a microprocessor and a semiconductor device which has an arithmetic function and can send and receive data without contact are described.

Figure 12:
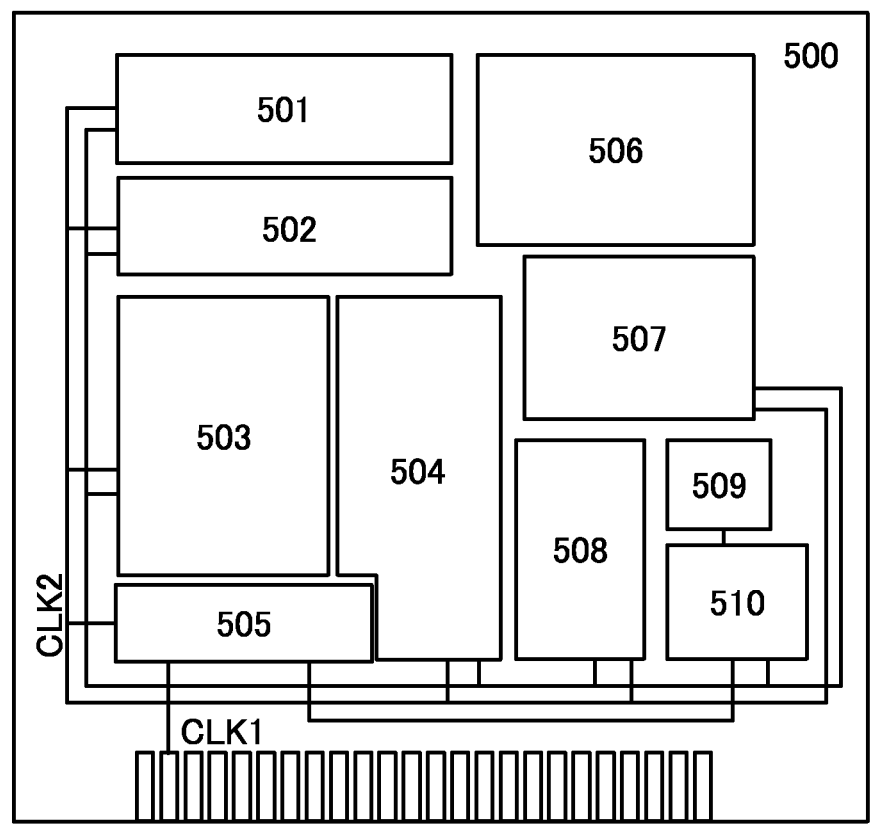
FIG. 12 is a block diagram illustrating a structure of a microprocessor which can be obtained using a semiconductor device.

FIG. 12 illustrates a structure of a microprocessor 500 as an example of a semiconductor device. The microprocessor 500 is manufactured using the semiconductor device of the above embodiment. This microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 in accordance with the state of the microprocessor. The timing controller 505 generates signals for controlling timing of driving the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above circuits. Note that the microprocessor 500 illustrated in FIG. 12 is just an example of the simplified structure, and practical microprocessors have various structures depending on usage.

Figure 13:
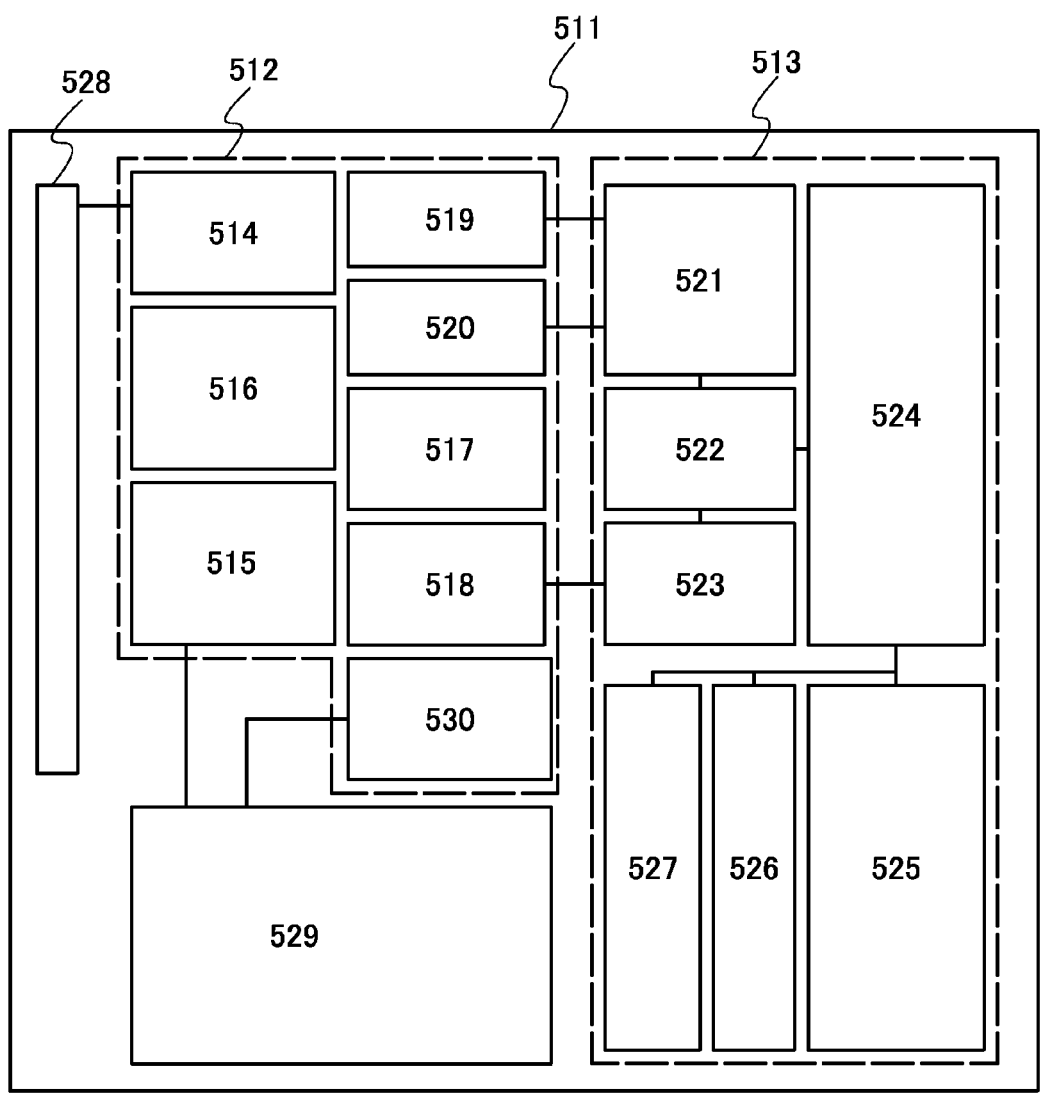
FIG. 13 is a block diagram illustrating a structure of an RFCPU which can be obtained using a semiconductor device.

Next, an example of a semiconductor device which has an arithmetic function and can send and receive data without contact is described with reference to FIG. 13. FIG. 13 illustrates an example of a computer (hereinafter also referred to as an RFCPU) which sends and receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, an interface 524, a central processing unit 525, a random access memory 526, and a read only memory 527.

The operation of the RFCPU 511 having such a structure is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface over which the RFCPU 511 is formed.

The reset circuit 517 generates a signal that resets the digital circuit portion 513 to be initialized. For example, a signal which rises with a delay to a rise of the power source voltage is generated as a reset signal. The oscillator circuit 518 changes the frequency and the duty ratio of a clock signal in accordance with a control signal generated by the constant voltage circuit 516. The demodulation circuit 519 having a low pass filter, for example, binarizes changes in amplitude of reception signals of an amplitude shift keying (ASK) system. The modulation circuit 520 changes the amplitude of transmission signals of an amplitude shift keying (ASK) system to be sent. The modulation circuit 520 changes the resonance point of the resonance circuit 514, thereby changing the amplitude of communication signals. The clock controller 523 generates a control signal for changing the frequency and the duty ratio of the clock signal in accordance with the power supply voltage or current consumption in the central processing unit 525. The power supply voltage is monitored by a power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the interface 524. The interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method in which a circuit dedicated to arithmetic is formed and an arithmetic process is conducted using hardware may be employed. In a method in which both hardware and software are used, a method can be employed in which part of process is conducted in the circuit dedicated to arithmetic and the other part of the arithmetic process is conducted by the central processing unit 525 using a program.

Also in the microprocessor in this embodiment, with the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield. In addition, a semiconductor device can be formed with high productivity at low cost because a plating method is used for the formation of the conductive shield.

Embodiment 9

In this embodiment, examples of usage modes of the semiconductor device described in the above embodiment will be described. Specifically, an application example of a semiconductor device to/from which data can be input/output without contact is described with reference to drawings. The semiconductor device which can input and output data without contact is also referred to as an RFID tag, an ID tag, an IC tag, an RF tag, a wireless tag, an electronic tag, or a wireless chip depending on application modes.

One example of a top structure of a semiconductor device described in this embodiment is described with reference to FIG. 21A. A semiconductor device illustrated in FIG. 21A includes a semiconductor integrated circuit chip 400 having an antenna (also referred to as an on-chip antenna) and a supporting substrate 406 provided with an antenna 405 (also referred to as a booster antenna). The semiconductor integrated circuit chip 400 is provided over an insulating layer 410 formed over the supporting substrate 406 and the antenna 405. The semiconductor integrated circuit chip 400 can be fixed to the supporting substrate 406 and the antenna 405 by using the insulating layer 410. Note that when the conductive shield provided on a surface of the semiconductor integrated circuit chip 400 has high resistance and the starting point and the ending point of the pattern of the antenna 405 under the semiconductor integrated circuit chip 400 are not electrically connected to each other, the antenna 405 and the conductive shield provided on the surface of the semiconductor integrated circuit chip 400 may be provided in contact with each other.

A plurality of elements, such as transistors, which forms a memory portion or a logic portion in a semiconductor integrated circuit provided in the semiconductor integrated circuit chip 400, is provided. As a semiconductor element in a semiconductor device according to this embodiment, not only a field-effect transistor, but also a memory element which uses a semiconductor layer can be employed; accordingly, a semiconductor device which can meet functions required for various applications can be manufactured and provided.

Figure 20A:
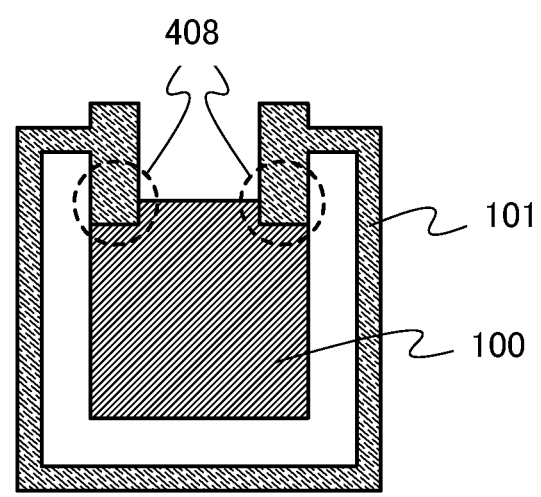
FIGS. 20A and 20B are diagrams each illustrating a semiconductor device.
Figure 21A:
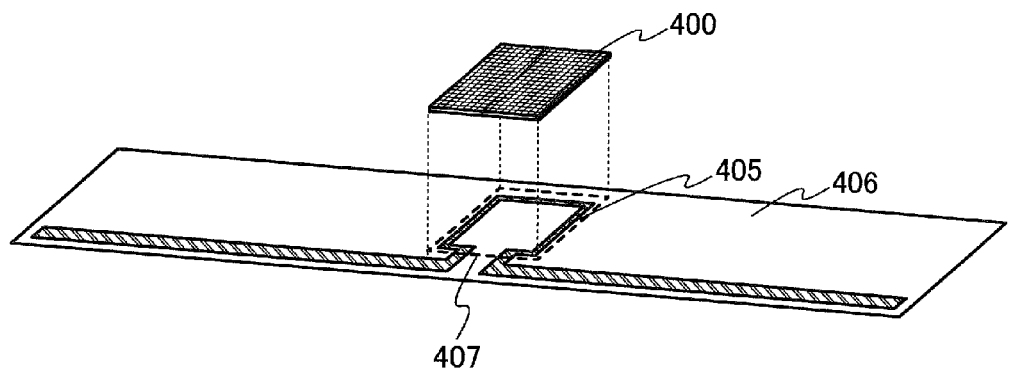
FIGS. 21A to 21C are diagrams illustrating a semiconductor device.

In FIG. 20A, an expansion diagram of the antenna and the semiconductor integrated circuit included in the semiconductor integrated circuit chip 400 illustrated in FIG. 21A is illustrated. In FIG. 20A, the antenna 101 is a rectangular loop antenna in which the number of windings is 1; however, an embodiment of the present invention is not limited to this structure. The shape of the loop antenna is not limited to a rectangle and may be a shape with curve, for example, a circle. In addition, the number of windings is not limited to 1 and may be plural. However, when the number of windings of the antenna 101 is 1, parasitic capacitance generated between the semiconductor integrated circuit 100 and the antenna 101 can be reduced.

Figure 20B:
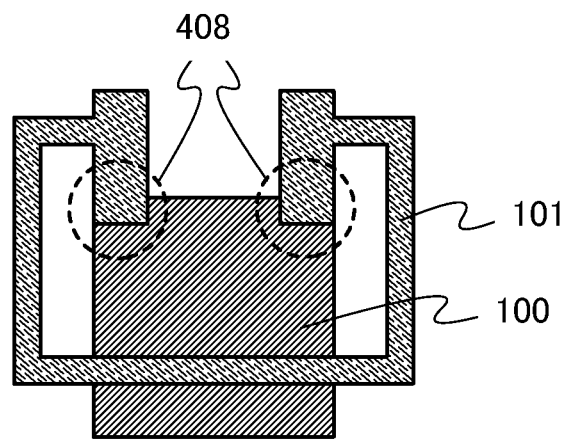

In FIG. 21A and FIG. 20A, the antenna 101 is placed to surround the periphery of the semiconductor integrated circuit 100, and except for a portion corresponding to a feeding point 408 illustrated by dashed lines, the antenna 101 is arranged in a region not overlapped with the semiconductor integrated circuit 100. However, an embodiment of the present invention is not limited to this structure. As illustrated in FIG. 20B, in the portion other than a portion corresponding to the feeding point 408 illustrated by the dashed lines, at least part of the antenna 101 may be arranged to overlap the semiconductor integrated circuit 100. However, as illustrated in FIG. 21A and FIG. 20A, since the antenna 101 is arranged in region that is different from the region where the semiconductor integrated circuit 100 is provided, the parasitic capacitance generated between the semiconductor integrated circuit 100 and the antenna 101 can be reduced.

In FIG. 21A, the antenna 405 can send and receive a signal or supply power by using the antenna 101 and electromagnetic induction mainly in a loop-shaped portion surrounded by a dashed line 407. In addition, the antenna 405 can send and receive a signal to/from an interrogator or supply power by using a radio wave mainly in a region other than a portion surrounded by the dashed line 407. Between the interrogator and the semiconductor device, a frequency of a radio wave used as a carrier (a carrier wave) is preferably greater than or equal to about 30 MHz and less than or equal to about 5 GHz, for example, a frequency band such as 950 MHz or 2.45 GHz may be used.

The antenna 405 is a rectangular loop antenna in which the number of windings is 1 in the portion surrounded by the dashed line 407; however, an embodiment of the present invention is not limited to this structure. The shape of the loop antenna is not limited to a rectangle and may be a shape with curve, for example, a circle. In addition, the number of windings is not limited to 1 and may be plural.

For the semiconductor device of an embodiment of the present invention, an electromagnetic induction method, an electromagnetic coupling method, or a microwave method can be employed. In the case of a microwave method, the shapes of the antenna 101 and the antenna 405 may be determined as appropriate depending on the wavelength of an electromagnetic wave.

For example, in the case of employing a microwave method (for example, a UHF band (from 860 MHz band to 960 MHz band), a 2.45 GHz band, or the like) as the signal transmission method in the semiconductor device, the length, shape, and the like of the antenna may be set as appropriate in consideration of a wavelength of an electromagnetic wave used for signal transmission. For example, each of the antennas can be formed into a linear shape (e.g., a dipole antenna) or a flat shape (e.g., a patch antenna or an antenna having a ribbon shape). Further, each of the antennas is not limited to a linear shape and may have a curved shape, a serpentine curved shape, or in a shape combining them in consideration of the wavelength of the electromagnetic wave.

Figure 10:
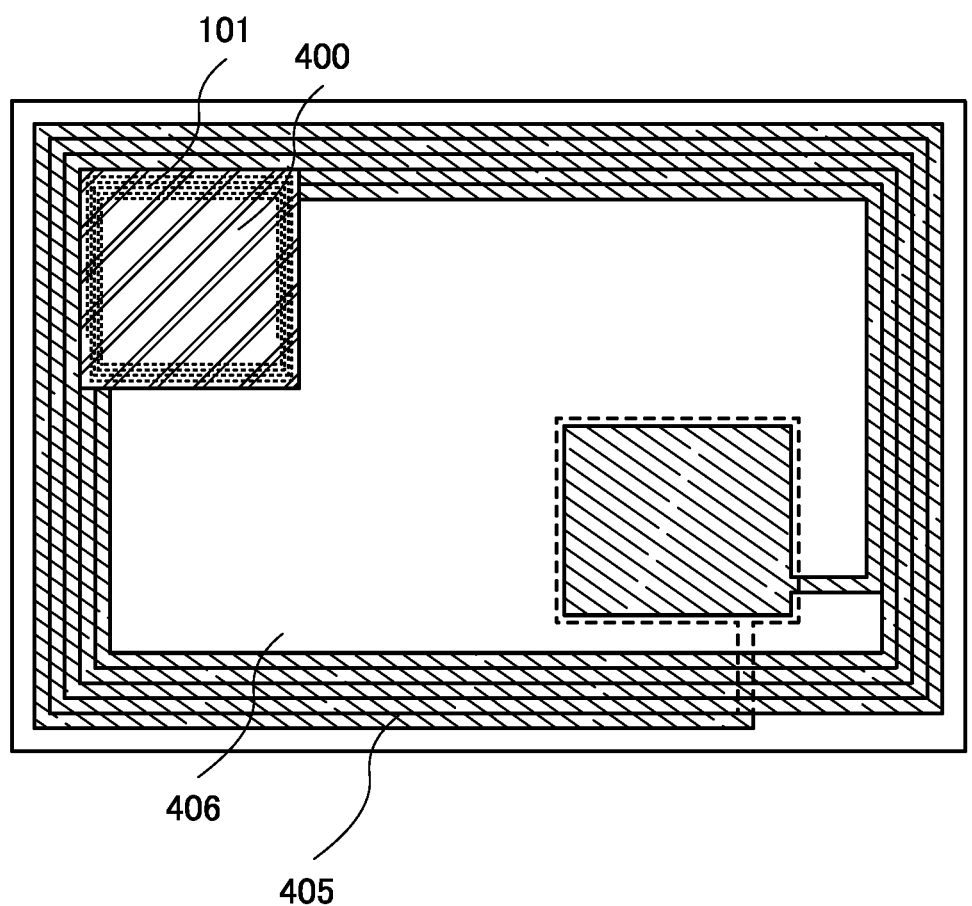
FIG. 10 is a diagram illustrating a semiconductor device.

An example in which the antenna 101 and the antenna 405 have coil shapes and an electromagnetic induction method or an electromagnetic coupling method is used is illustrated in FIG. 10.

In FIG. 10, the semiconductor integrated circuit chip 400 having the coiled antenna 101 is formed over the supporting substrate 406 provided with the coiled antenna 405 as a booster antenna. Note that the supporting substrate 406 is sandwiched between the antenna 405 which is a booster antenna, and a capacitor is formed.

Figure 21B:
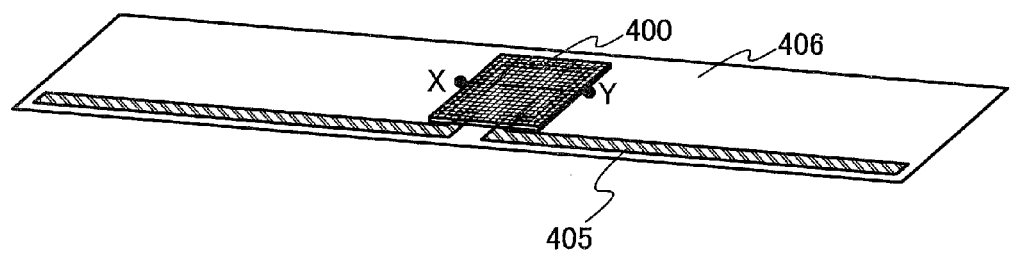
Figure 21C:
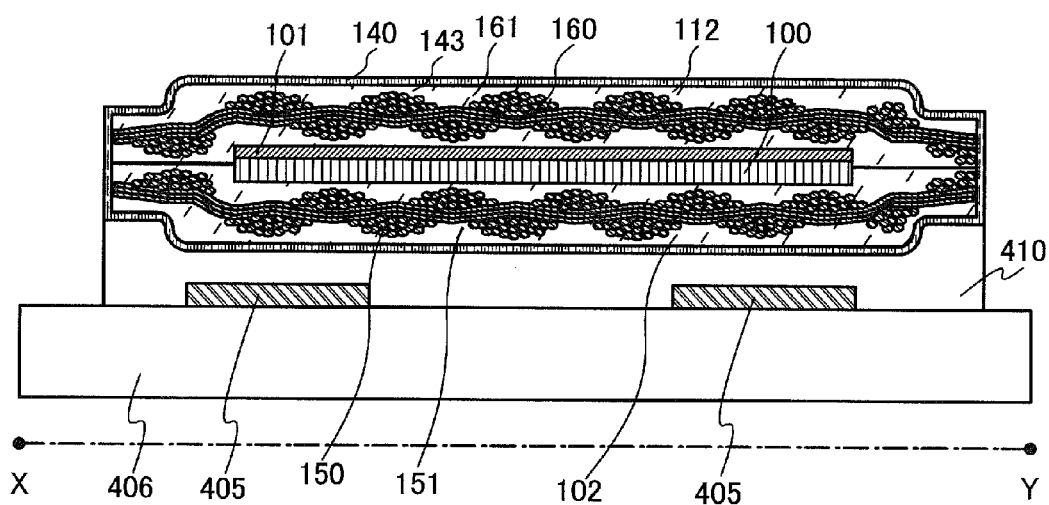

Next, a structure of the semiconductor integrated circuit chip 400 and the booster antenna, and arrangement thereof are described. FIG. 21B corresponds to a perspective view of the semiconductor device illustrated in FIG. 21A in which the semiconductor integrated circuit chip 400 and the antenna 405 formed over the supporting substrate 406 are stacked. FIG. 21C corresponds to a cross-sectional view taken along a dashed line X-Y of FIG. 21B.

The semiconductor device described in any of Embodiments 1 to 6 can be used for the semiconductor integrated circuit chip 400 illustrated in FIG. 21C, and here, semiconductor devices which are individually divided into chip shapes are referred to as semiconductor integrated circuit chips. Note that the semiconductor integrated circuit chip illustrated in FIG. 21C is an example using Embodiment 1; however, this embodiment can be applied to another embodiment, and an embodiment of the present invention is not limited to this structure.

The semiconductor integrated circuit 100 illustrated in FIG. 21C is sandwiched between the first insulator 112 and the second insulator 102, and the side surface is also sealed. In this embodiment, a first insulator and a second insulator between which a plurality of semiconductor integrated circuits is sandwiched are attached, and then the semiconductor integrated circuits are individually divided into stacks. A conductive shield is formed by a plating method each for the divided stacks, and the semiconductor integrated circuit chips 400 are formed. There is no particular limitation on a separation means as long as physical separation is possible, and separation is performed by laser beam irradiation in this embodiment.

The semiconductor device of an embodiment of the present invention includes the conductive shield 140 which is provided on outer sides of a pair of insulators between which an antenna and a semiconductor integrated circuit that is electrically connected to the antenna are sandwiched (on the sides where the semiconductor integrated circuit is not provided), and side surfaces of the stack. The conductive shield 140 transmits an electromagnetic wave that the antenna included in the semiconductor device should send and receive and prevents external static electricity from being applied to the semiconductor integrated circuit in the semiconductor device.

In FIG. 21C, the semiconductor integrated circuit 100 is closer to the antenna 405 than the antenna 101; however an embodiment of the present invention is not limited to this structure. The antenna 101 may be closer to the antenna 405 than the semiconductor integrated circuit 100. The semiconductor integrated circuit 100 and the antenna 101 may be directly attached to the first insulator 112 and the second insulator 102, or may be attached by a bonding layer functioning as an adhesive.

Figure 19:
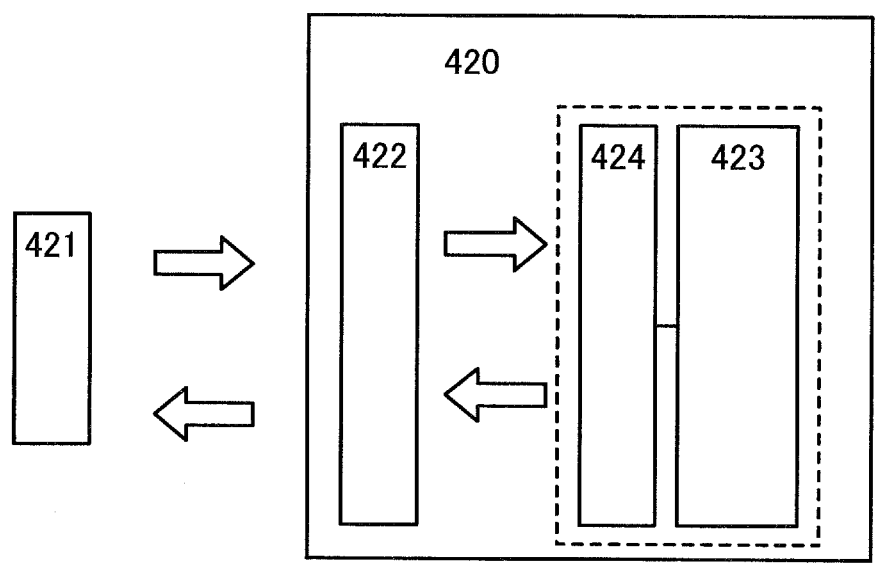
FIG. 19 is a diagram illustrating a semiconductor device.

Next, an operation example of the semiconductor device of this embodiment is described. FIG. 19 is a block diagram illustrating an example of a structure of a semiconductor device of this embodiment. A semiconductor device 420 illustrated in FIG. 19 has an antenna 422 which is a booster antenna, a semiconductor integrated circuit 423, and an antenna 424 which is an on-chip antenna. When an electromagnetic wave is sent from an interrogator 421, the antenna 422 receives the electromagnetic wave, whereby alternating current is generated in the antenna 422 and a magnetic field is generated around the antenna 422. Then, a loop-shaped portion included in the antenna 422 and the antenna 424 having a loop shape are electromagnetically coupled, and induced electromotive force is generated in the antenna 424. The semiconductor integrated circuit 423 receives a signal or power from the interrogator 421 by using the induced electromotive force. On the other hand, current flows into the antenna 424 and induced electromotive force is generated in the antenna 422 in accordance with a signal generated in the semiconductor integrated circuit 423, whereby a signal can be sent to the interrogator 421 using a reflected wave of the radio wave that is sent from the interrogator 421.

Note that the antenna 422 is divided into a loop-shaped portion in which electromagnetic coupling is mainly performed between the antenna 422 and the antenna 424, and a portion in which a radio wave from the interrogator 421 is mainly received. The shape of the antenna 422 in the portion in which an electric wave from the interrogator 421 is mainly received may be a shape in which an electric wave can be received. For example, shapes such as a dipole antenna, a folded-dipole antenna, a slot antenna, a meander line antenna, or a microstrip antenna may be used.

In FIGS. 21A to 21C, structures of the semiconductor integrated circuit each including only one antenna are illustrated; however, an embodiment of the present invention is not limited to this structure. Two antennas, that is, an antenna for receiving power and an antenna for receiving a signal may be included. If two antennas are provided, frequency of a radio wave for supplying power and frequency of a radio wave for sending a signal can be separately used.

In a semiconductor device of this embodiment, the on-chip antenna is used and a signal or power can be sent and received between the booster antenna and the on-chip antenna without contact; therefore, unlike the case where a semiconductor integrated circuit is connected to an external antenna, the semiconductor integrated circuit and the antenna are less likely to be disconnected due to external force, and generation of initial failure in the connection can also be suppressed. Unlike the case where only an on-chip antenna is used, the booster antenna is also used in this embodiment. Therefore, the advantage of the external antenna can be enjoyed, for example, a dimension or shape of the on-chip antenna is less likely to be affected by restriction of the area of the semiconductor integrated circuit, a frequency band of radio wave which can be received is not limited, and communication distance can be extended.

In the semiconductor device to which an embodiment of the present invention is applied, with the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield. In addition, a semiconductor device can be formed with high productivity at low cost because a plating method is used for the formation of the conductive shield. Therefore, an embodiment of the present invention is effective in the case of a small semiconductor device to/from which data can be input/output without contact as described in this embodiment. Since the semiconductor device of this embodiment has high reliability with respect to external force, environmental conditions under which the semiconductor device can be used can be varied; thus, greater versatility of the semiconductor device can be achieved.

Embodiment 10

In this embodiment, an example of application of the above semiconductor device which can input and output data without contact, which is formed using an embodiment of the present invention, will be described. The semiconductor device which can input and output data without contact is also referred to as an RFID tag, an ID tag, an IC tag, an IC chip, an RF tag, a wireless tag, an electronic tag, or a wireless chip depending on application modes.

Figure 11A:
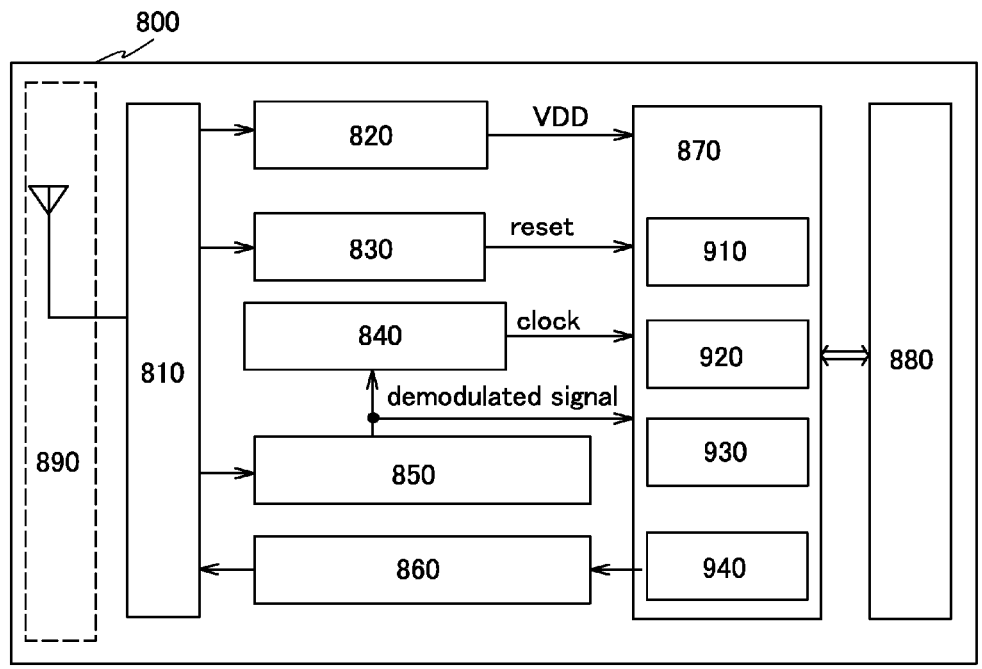
FIGS. 11A to 11C are diagrams each illustrating a semiconductor device.

A semiconductor device 800, which has a function in which data can be exchanged without contact, includes a high frequency circuit 810, a power supply circuit 820, a reset circuit 830, a clock generator circuit 840, a data demodulation circuit 850, a data modulation circuit 860, a control circuit 870 used for controlling other circuits, a memory circuit 880, and an antenna 890 (see FIG. 11A). The high-frequency circuit 810 receives a signal from the antenna 890 and outputs a signal, which is received from the data modulation circuit 860, with the antenna 890. The power supply circuit 820 generates power source potential from a received signal. The reset circuit 830 generates a reset signal. The clock generator circuit 840 generates various clock signals based on a received signal input from the antenna 890. The data demodulation circuit 850 demodulates a received signal and outputs the demodulated signal to the control circuit 870. The data modulation circuit 860 modulates a signal received from the control circuit 870. As the control circuit 870, for example, a code extracting circuit 910, a code judging circuit 920, a CRC judging circuit 930, and an output unit circuit 940 are provided. Note that the code extracting circuit 910 extracts each of a plurality of codes included in an instruction sent to the control circuit 870. The code judging circuit 920 judges the content of the instruction by comparing the extracted code with a code corresponding to a reference. The CRC judging circuit 930 detects whether or not there is a transmission error or the like based on the judged code.

Next, an example of operation of the above semiconductor device will be described. First, a radio signal is received by the antenna 890. The radio signal is sent to the power supply circuit 820 via the high-frequency circuit 810, and a high power source potential (hereinafter referred to as VDD) is generated. The VDD is supplied to each circuit in the semiconductor device 800. A signal sent to the data demodulation circuit 850 through the high-frequency circuit 810 is demodulated (hereinafter, this signal is referred to as a demodulated signal). Moreover, signals and demodulated signals passed through the reset circuit 830 and the clock generator circuit 840 through the high-frequency circuit 810, and the demodulated signal are sent to the control circuit 870. The signals sent to the control circuit 870 are analyzed by the code extracting circuit 910, the code judging circuit 920, the CRC judging circuit 930, and the like. Then, based on the analyzed signals, information of the semiconductor device stored in the memory circuit 880 is output. The output information of the semiconductor device is encoded through the output unit circuit 940. Further, the encoded information of the semiconductor device 800 passes through the data modulation circuit 860 and then is sent by the antenna 890 as a wireless signal. Note that low power source potential (hereinafter referred to as VSS) is common in the plurality of circuits included in the semiconductor device 800, and VSS can be GND.

In this manner, data of the semiconductor device can be read by sending a signal to the semiconductor device 800 from a communication device and by receiving a signal which is sent from the semiconductor device 800 by the communication device.

Moreover, in the semiconductor device 800, power source voltage may be supplied to each circuit by electromagnetic waves without mounting a power source (battery), or a power source (battery) may be mounted so that power source voltage is supplied to each circuit by both electromagnetic waves and the power source (battery).

Figure 11B:
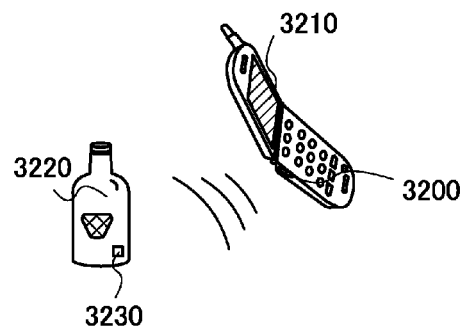
Figure 11C:
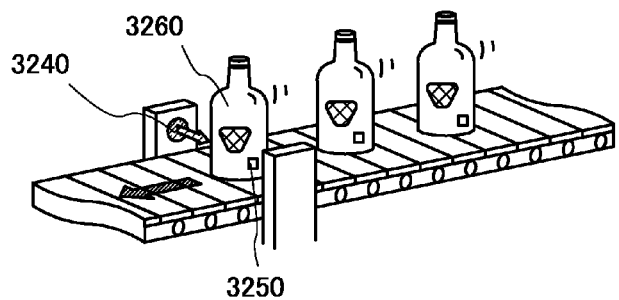

Next, an example of usage of a semiconductor device in which data can be input/output without contact is described. A side surface of a mobile terminal which includes a display portion 3210 is provided with a communication device 3200. A side surface of a product 3220 is provided with a semiconductor device 3230 (FIG. 11B). When the communication device 3200 is held up to the semiconductor device 3230 included in the product 3220, the display portion 3210 displays information about the product, such as its materials, its place of production, inspection results for each production step, a history of the distribution process, and a description of the product. Further, when a product 3260 is conveyed by a conveyer belt, the product 3260 can be inspected by using a communication device 3240 and a semiconductor device 3250 with which the product 3260 is provided (FIG. 11C). In this manner, information can be easily obtained, and high functions and high added values are realized by utilizing a semiconductor device for a system.

Thus, a highly reliable semiconductor device according to an embodiment of the present invention, which has a very wide range of application, can be used in electronic devices in a variety of fields.

Embodiment 11

According to an embodiment of the present invention, a semiconductor device functioning as a chip having a processor circuit (hereinafter also called a processor chip, a wireless chip, a wireless processor, a wireless memory, or a wireless tag) or an RFID tag can be formed. The application range of the semiconductor device of an embodiment of the present invention is so wide that it may be applied to any object in order that the history thereof is revealed wirelessly and utilized in production, management, and the like. For example, the semiconductor device of an embodiment of the present invention may be incorporated in bills, coins, securities, certificates, bearer bonds, packaging containers, books, recording media, personal belongings, vehicles, groceries, garments, health products, daily commodities, medicines, and electronic devices. These examples are described with reference to FIGS. 9A to 9G.

The bills and coins are money that circulates in the market, and includes one that can be used in the same way as money in a specific area (cash voucher), a commemorative coin, and the like. The securities include checks, certificates, promissory notes, and the like, and can be provided with a chip 190 including an RFID tag (see FIG. 9A). The certificates refer to driver's licenses, certificates of residence, and the like, and can be provided with a chip 191 including an RFID tag (see FIG. 9B). The personal belongings include bags, a pair of glasses, and the like, and can be provided with a chip 197 including an RFID tag (see FIG. 9C). Bearer bonds refer to stamps, rice coupons, various merchandise coupons, and the like. Packing containers refer to wrapping paper for food containers, plastic bottles, and the like and can be provided with a chip 193 including an RFID tag (see FIG. 9D). The books refer to hardbacks, paperbacks, and the like, and can be provided with a chip 194 including an RFID tag (see FIG. 9E). The recording media refer to DVD software, video tapes, and the like, and can be provided with a chip 195 including an RFID tag (see FIG. 9F). Vehicles refer to wheeled vehicles such as bicycles, ships, and the like, and can be provided with a chip 196 including an RFID tag (see FIG. 9G). The groceries indicate foods, beverages, and the like. The garments indicate clothes, shoes, and the like. The health products indicate a medical apparatus, a health appliance, and the like. The daily commodities indicate furniture, lighting apparatus, and the like. The medicines indicate a medical product, an agricultural chemical, and the like. The electronic devices indicate a liquid crystal display device, an EL display device, television sets (a television receiver and a thin television receiver), a cellular phone, and the like.

The semiconductor device can be provided by being attached to the surface of an article or being embedded in an article. For example, in the case of a book, the semiconductor device may be embedded in the paper; and in the case of a package made of an organic resin, the semiconductor device may be embedded in the organic resin.

As described above, the efficiency of an inspection system, a system used in a rental shop, or the like can be improved by providing the packing containers, the recording media, the personal belonging, the groceries, the garments, the daily commodities, the electronic devices, or the like with the semiconductor device. In addition, by providing the vehicles with the semiconductor device, forgery or theft can be prevented. In addition, when the semiconductor device is implanted into creatures such as animals, each creature can be identified easily. For example, by attaching the semiconductor device with a sensor to a creature such as livestock, its health condition such as a current body temperature as well as its birth year, sex, breed, or the like can be easily managed.

Note that this embodiment can be implemented in combination with any of Embodiments 1 to 9, as appropriate.

Embodiment 12

In this embodiment, an example of mounting a semiconductor device of an embodiment of the present invention will be described with reference to FIGS. 18A to 18D.

The semiconductor device of an embodiment of the present invention can be mounted on an article as described in Embodiment 9. In this embodiment, an example in which a flexible semiconductor device mounted on a flexible substrate is formed is described.

Figure 18A:
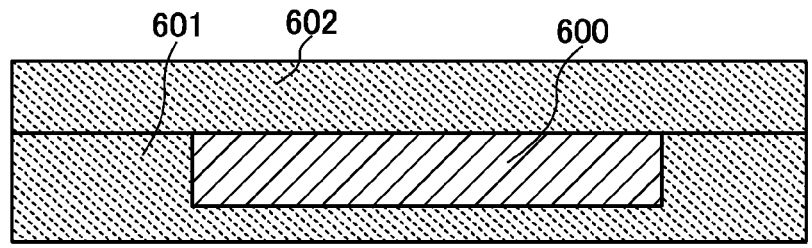
FIGS. 18A to 18D are diagrams illustrating semiconductor devices.
Figure 18B:
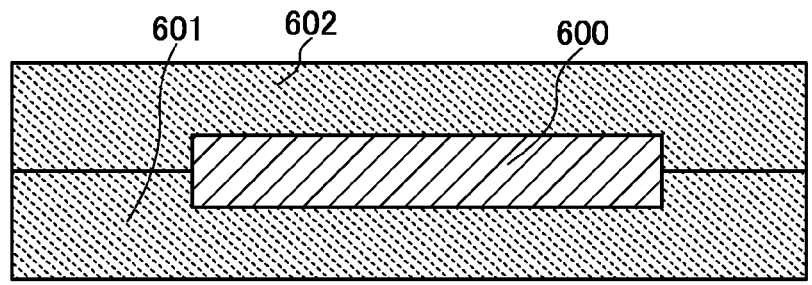
Figure 18C:
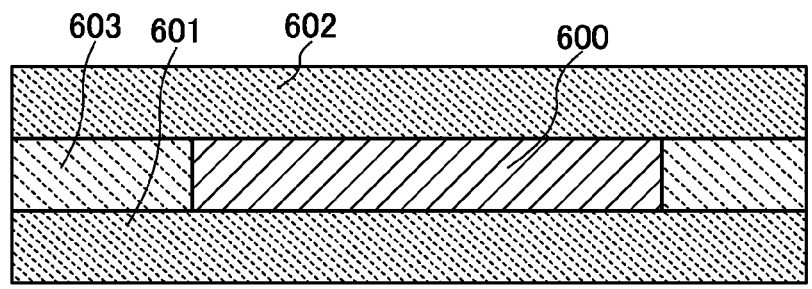

FIGS. 18A to 18C are each an example in which a semiconductor integrated circuit chip is embedded in flexible substrates. The semiconductor device described in Embodiments 1 to 6 can be used for the semiconductor integrated circuit chip, and here, semiconductor devices which are individually divided into chip shapes are referred to as semiconductor integrated circuit chips. A semiconductor integrated circuit chip 600 is illustrated in detail in FIG. 18D. The semiconductor integrated circuit chip of FIG. 18D is an example using Embodiment 1; however, this embodiment can be applied to another embodiment, and an embodiment is not limited to this structure.

Figure 18D:
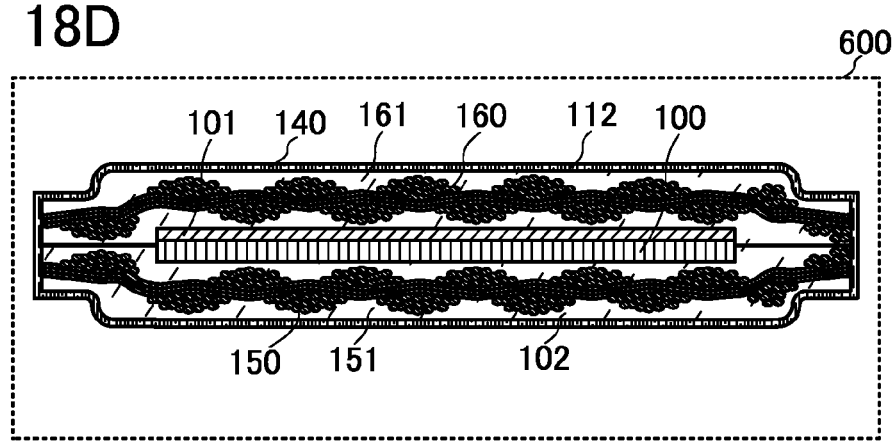

In FIG. 18D, the antenna 101 and the semiconductor integrated circuit 100 are sandwiched between the first insulator 112 and the second insulator 102, and the side surfaces of a stack are also sealed. In this embodiment, a plurality of semiconductor integrated circuits is sandwiched between the first insulator 112 and the second insulator 102, and then the semiconductor integrated circuit is individually divided into semiconductor integrated circuit chips each including the antenna 101 and the semiconductor integrated circuit 100, whereby the semiconductor integrated circuit chips are formed. There is no particular limitation on a separation means as long as physical separation is possible, and separation is performed by laser beam irradiation in this embodiment.

The antenna 101 and the semiconductor integrated circuit 100 are sealed by the first insulator 112 and the second insulator 102 by separation, and divided surfaces are generated as side surfaces of a chip. The conductive shield 140 is formed by a plating method to surround the periphery of a divided semiconductor integrated circuit chip.

Accordingly, the antenna 101 and the semiconductor integrated circuit 100 are sealed by the first insulator 112 and the second insulator 102, and are protected against electrostatic discharge by using the conductive shield 140 provided on the outer sides of the first insulator 112 and the second insulator 102 which correspond to the surface and back surface of the semiconductor device and on the side surfaces of the stack.

With the use of the conductive shield covering a semiconductor integrated circuit, electrostatic breakdown (malfunctions of the circuit or damages of a semiconductor element) due to electrostatic discharge of the semiconductor integrated circuit is prevented. Further, by using a pair of insulators between which the semiconductor integrated circuit is sandwiched, a highly reliable semiconductor device that is reduced in thickness and size and has tolerance can be provided. In addition, defective shapes and defective characteristics due to the external stress or an electrostatic discharge are prevented in the manufacturing process, so that a semiconductor device can be manufactured with high yield.

In FIG. 18A, the semiconductor integrated circuit chip 600 is sandwiched between a flexible substrate 601 and a flexible substrate 602, and the semiconductor integrated circuit chip 600 is provided in a depressed portion formed in the flexible substrate 601.

The depressed portion in which the semiconductor integrated circuit chip 600 is provided may be formed in one flexible substrate or may be formed in both flexible substrates. In FIG. 18B, an example is illustrated in which the semiconductor integrated circuit chip 600 is provided in the depressed portions provided in both the flexible substrate 601 and the flexible substrate 602.

Further, three flexible substrates may be used and a central flexible substrate may be provided with an opening in which the semiconductor integrated circuit chip 600 is provided. In FIG. 18C, an example is illustrated in which an opening is formed in a flexible substrate 603, the semiconductor integrated circuit chip 600 is provided in the opening, and the flexible substrate 603 and the semiconductor integrated circuit chip 600 are sandwiched between the flexible substrate 601 and the flexible substrate 602.

In FIGS. 18A to 18C, a flexible substrate may be stacked on an outer side (outer sides) of the flexible substrate 601 and/or the flexible substrate 602.

For each of the flexible substrates 601, 602, and 603, a woven fabric which is woven using bundles of fibers (single yarns) (hereinafter, the bundles of fibers are referred to as yarn bundles) for warp yarns and weft yarns, a nonwoven fabric obtained by stacking yarn bundles of plural kinds of fibers randomly or in one direction, paper, or the like can be used. Specifically, the following can be used: a substrate formed from polyethylene terephthalate (PET), polyethylene naphthalate (PEN), polyethersulfone (PES), polypropylene, polypropylene sulfide, polycarbonate, polyetherimide, polyphenylene sulfide, polyphenylene oxide, polysulfone, polyphthalamide, or the like; a substrate formed from polypropylene, polyester, vinyl, polyvinyl fluoride, vinyl chloride, polyester, polyamide, or the like; a film; paper formed from a fibrous material; and the like. A layered film of an adhesive synthetic resin film (such as an acrylic synthetic resin or an epoxy synthetic resin), or the like can be used. When a substrate or a film is bonded to a subject to be processed, a bonding layer may be used. A condition can be selected in accordance with the kind of the substrate or the film, and bonding can be performed by heat treatment or application of pressure. A bonding layer corresponds to a layer containing an adhesive such as a thermosetting resin, a UV curing resin, an epoxy resin adhesive, or a resin additive.

As in this embodiment, when a depressed portion or an opening is formed in a flexible substrate on which a semiconductor integrated circuit chip is mounted and the semiconductor integrated circuit chip 600 is provided so as to be embedded in the depressed portion or the opening, a projected portion is not formed due to the provision of the semiconductor integrated circuit chip 600; therefore, the surface of the flexible substrate is flat, and film thickness can be uniform. Accordingly, even if pressure treatment is performed with a roller or the like for attachment when a semiconductor integrated circuit chip is mounted on a flexible substrate, pressure can be prevented from being locally applied on the semiconductor integrated circuit chip (pressure concentration). Therefore, damages of the semiconductor integrated circuit chip can be reduced in a mounting step, whereby the yield of a semiconductor device is improved. In addition, even after a semiconductor integrated circuit chip is mounted, a highly reliable semiconductor device which has high tolerance to external stress can be formed.

In addition, since a surface can be flat and smooth, stacking over machine, storage, transferring, and the like are easily performed. Further, a semiconductor integrated circuit chip is not visually identified from the outside (a projected portion that reflects a shape of the semiconductor integrated circuit chip is not generated on the surface); therefore, a semiconductor device with high security can be formed.

This application is based on Japanese Patent Application serial No. 2008-149603 filed with Japan Patent Office on Jun. 6, 2008, the entire contents of which are hereby incorporated by reference.

What is claimed is:

1. A method for manufacturing a semiconductor device comprising the steps of:
   forming a semiconductor integrated circuit and an antenna electrically connected to the semiconductor integrated circuit;
   sandwiching the semiconductor integrated circuit and the antenna between a first insulator and a second insulator which are provided to face each other; and
   immersing a stack of the semiconductor integrated circuit, the antenna, the first insulator, and the second insulator in a plating solution including a conductive material to form a conductive shield covering surfaces of the stack.

2. The method for manufacturing the semiconductor device according to claim 1, wherein a nickel alloy film or a copper film is formed as the conductive shield.

3. The method for manufacturing the semiconductor device according to claim 1, wherein a structure body in which a fibrous body is impregnated with an organic resin is used for at least one of the first insulator and the second insulator.

4. The method for manufacturing the semiconductor device according to claim 1, wherein the conductive shield transmits an electromagnetic wave sufficiently for the antenna to send and receive data, and prevents external static electricity from being applied to the semiconductor integrated circuit in the semiconductor device.

5. The method for manufacturing the semiconductor device according to claim 1, wherein the conductive shield is not electrically connected to the antenna.

6. The method for manufacturing the semiconductor device according to claim 1, further comprising the step of forming a protective layer over the conductive shield.

7. The semiconductor device manufactured by the method according to claim 1 is incorporated in one selected from the group consisting of a recording media, a liquid crystal display device, an EL display device, a television receiver, a thin television receiver and a cellular phone.

8. A method for manufacturing a semiconductor device comprising the steps of:
    forming a first semiconductor integrated circuit and a second semiconductor integrated circuit;
    forming a first antenna electrically connected to the first semiconductor integrated circuit and a second antenna electrically connected to the second semiconductor integrated circuit;
    sandwiching the first semiconductor integrated circuit, the second semiconductor integrated circuit, the first antenna and the second antenna between a first insulator and a second insulator which are provided to face each other;
    dividing the first semiconductor integrated circuit from the second semiconductor integrated circuit, by cutting the first insulator and the second insulator whereby a first semiconductor integrated circuit chip and a second semiconductor integrated circuit chip are formed;
    immersing the first semiconductor integrated circuit chip and the second semiconductor integrated circuit chip in a plating solution including a conductive material to form a conductive shield covering surfaces of the first semiconductor integrated circuit chip and the second semiconductor integrated circuit chip.

9. The method for manufacturing the semiconductor device according to claim 8, wherein a nickel alloy film or a copper film is formed as the conductive shield.

10. The method for manufacturing the semiconductor device according to claim 8, wherein a structure body in which a fibrous body is impregnated with an organic resin is used for at least one of the first insulator and the second insulator.

11. The method for manufacturing the semiconductor device according to claim 8, wherein the conductive shield transmits an electromagnetic wave sufficiently for the first antenna and the second antenna to send and receive data, and prevents external static electricity from being applied to the first semiconductor integrated circuit and the second semiconductor integrated circuit in the semiconductor device.

12. The method for manufacturing the semiconductor device according to claim 8, wherein the conductive shield is not electrically connected to the first antenna or the second antenna.

13. The method for manufacturing the semiconductor device according to claim 8, further comprising the step of forming a protective layer over the conductive shield.

14. The semiconductor device manufactured by the method according to claim 8 is incorporated in one selected from the group consisting of a recording media, a liquid crystal display device, an EL display device, a television receiver, a thin television receiver and a cellular phone.

15. A method for manufacturing a semiconductor device comprising the steps of:
    forming a semiconductor integrated circuit comprising a transistor comprising an oxide semiconductor and an antenna electrically connected to the semiconductor integrated circuit;
    sandwiching the semiconductor integrated circuit and the antenna between a first insulator and a second insulator which are provided to face each other; and
    immersing a stack of the semiconductor integrated circuit, the antenna, the first insulator, and the second insulator in a plating solution including a conductive material to form a conductive shield covering surfaces of the stack.

16. The method for manufacturing the semiconductor device according to claim 15, wherein the oxide semiconductor comprises at least one material selected from the group consisting of zinc oxide, tin oxide, magnesium zinc oxide, gallium oxide and indium oxide.

17. The method for manufacturing the semiconductor device according to claim 15, wherein a nickel alloy film or a copper film is formed as the conductive shield.

18. The method for manufacturing the semiconductor device according to claim 15, wherein a structure body in which a fibrous body is impregnated with an organic resin is used for at least one of the first insulator and the second insulator.

19. The method for manufacturing the semiconductor device according to claim 15, wherein the conductive shield transmits an electromagnetic wave sufficiently for the antenna to send and receive data, and prevents external static electricity from being applied to the semiconductor integrated circuit in the semiconductor device.

20. The method for manufacturing the semiconductor device according to claim 15, wherein the conductive shield is not electrically connected to the antenna.

21. The method for manufacturing the semiconductor device according to claim 15, further comprising the step of forming a protective layer over the conductive shield.

22. The semiconductor device manufactured by the method according to claim 15 is incorporated in one selected from the group consisting of a recording media, a liquid crystal display device, an EL display device, a television receiver, a thin television receiver and a cellular phone.

23. The semiconductor device manufactured by the method according to claim 15 is incorporated in one selected from the group consisting of a recording media, a liquid crystal display device, an EL display device, a television receiver, a thin television receiver and a cellular phone.

* * * * *